(12) United States Patent
Hosotani et al.

(10) Patent No.: US 12,376,308 B2
(45) Date of Patent: Jul. 29, 2025

(54) SEMICONDUCTOR MEMORY DEVICE

(71) Applicant: Kioxia Corporation, Tokyo (JP)

(72) Inventors: Keiji Hosotani, Yokkaichi Mie (JP);
Fumitaka Arai, Yokkaichi Mie (JP);
Hiroaki Kosako, Yokkaichi Mie (JP);
Takayuki Kakegawa, Yokkaichi Mie (JP); Shinya Naito, Toyota Aichi (JP); Ryo Fukuoka, Yokkaichi Mie (JP); Kouji Matsuo, Ama Aichi (JP)

(73) Assignee: Kioxia Corporation, Tokyo (JP)

( * ) Notice: Subject to any disclaimer, the term of this patent is extended or adjusted under 35 U.S.C. 154(b) by 505 days.

(21) Appl. No.: 17/939,344

(22) Filed: Sep. 7, 2022

(65) Prior Publication Data
US 2023/0309311 A1    Sep. 28, 2023

(30) Foreign Application Priority Data

Mar. 23, 2022 (JP) ................. 2022-046520

(51) Int. Cl.
*H10B 43/40* (2023.01)
*G11C 16/04* (2006.01)
*G11C 16/08* (2006.01)
*G11C 16/14* (2006.01)

(52) U.S. Cl.
CPC ......... *H10B 43/40* (2023.02); *G11C 16/0466* (2013.01); *G11C 16/08* (2013.01); *G11C 16/14* (2013.01)

(58) Field of Classification Search
CPC ...... H10B 12/50; H10B 12/488; H10B 43/27; H10B 41/27; H10B 43/35; H10B 41/35; H10B 43/20; H10B 43/10; H10B 41/10; G11C 16/08; G11C 2213/75; G11C 11/2257

See application file for complete search history.

(56) References Cited

U.S. PATENT DOCUMENTS 7,382,018 B2   6/2008   Kim et al.
8,008,732 B2   8/2011   Kiyotoshi et al.
8,987,088 B2   3/2015   Sakuma
(Continued)

FOREIGN PATENT DOCUMENTS

JP    H-0376017 B2   12/1991
JP    2008-066577    3/2008
(Continued)

*Primary Examiner* — Xiaoming Liu
(74) *Attorney, Agent, or Firm* — Foley & Lardner LLP

(57) ABSTRACT

A semiconductor memory device includes a memory cell array and a peripheral circuit. The peripheral circuit includes a plurality of first nodes disposed corresponding to a plurality of first via electrodes, a charging circuit that charges the plurality of first nodes, a discharging circuit that discharges the plurality of first nodes, an address select circuit that electrically conducts one of the plurality of first nodes with the charging circuit or the discharging circuit in response to an input address signal, a plurality of first transistors each disposed in a current path between two of the plurality of first nodes, and a plurality of amplifier circuits that are disposed corresponding to the plurality of first via electrodes and include input terminals connected to any of the plurality of first nodes and output terminals connected to any of the plurality of first via electrodes.

18 Claims, 31 Drawing Sheets

(56) References Cited

U.S. PATENT DOCUMENTS

| | | | |
|---|---|---|---|
| 9,001,590 B2 | 4/2015 | Lue | |
| 9,019,739 B2 | 4/2015 | Park et al. | |
| 9,287,406 B2 | 3/2016 | Lue et al. | |
| 9,330,764 B2 | 5/2016 | Lin et al. | |
| 9,953,995 B2 | 4/2018 | Walker | |
| 10,304,846 B2 | 5/2019 | Lupino et al. | |
| 10,607,995 B2 | 3/2020 | Roberts et al. | |
| 10,608,009 B2 | 3/2020 | Ikeda et al. | |
| 10,784,312 B1 | 9/2020 | Kabuyanagi et al. | |
| 11,302,381 B1* | 4/2022 | Kim | G11C 11/4087 |
| 2004/0053452 A1 | 3/2004 | Hasegawa et al. | |
| 2020/0176033 A1 | 6/2020 | Hosotani et al. | |
| 2020/0227123 A1 | 7/2020 | Salahuddin et al. | |
| 2020/0303418 A1* | 9/2020 | Sakuma | G11C 11/2275 |
| 2020/0395341 A1 | 12/2020 | Maejima et al. | |
| 2021/0090655 A1 | 3/2021 | Abiko | |
| 2022/0059617 A1* | 2/2022 | Niki | G11C 8/10 |
| 2022/0246633 A1 | 8/2022 | Arai | |

FOREIGN PATENT DOCUMENTS

| | | | |
|---|---|---|---|
| JP | 2008-078404 A | 4/2008 |
| JP | 2016-171243 A | 9/2016 |

\* cited by examiner

SEMICONDUCTOR MEMORY DEVICE

CROSS-REFERENCE TO RELATED APPLICATIONS

This application is based upon and claims the benefit of Japanese Patent Application No. 2022-046520, filed on Mar. 23, 2022, the entire contents of which are incorporated herein by reference.

BACKGROUND

Field

Embodiments described herein relate generally to a semiconductor memory device.

Description of the Related Art

There has been known a semiconductor memory device in which a plurality of memory cells are stacked in a direction intersecting with a surface of a substrate.

BRIEF DESCRIPTION OF THE DRAWINGS

FIG. 4 is a schematic perspective view illustrating a part of a configuration of an array structure AS;

FIG. 5 is a schematic circuit diagram illustrating a part of the configuration of the array structure AS;

FIG. 6 is a schematic plan view illustrating a part of the configuration of the array structure AS;

FIG. 7 is a schematic cross-sectional view illustrating a part of the configuration of the array structure AS;

FIG. 8 is a schematic cross-sectional view illustrating a part of the configuration of the array structure AS;

DETAILED DESCRIPTION

Figure 1:
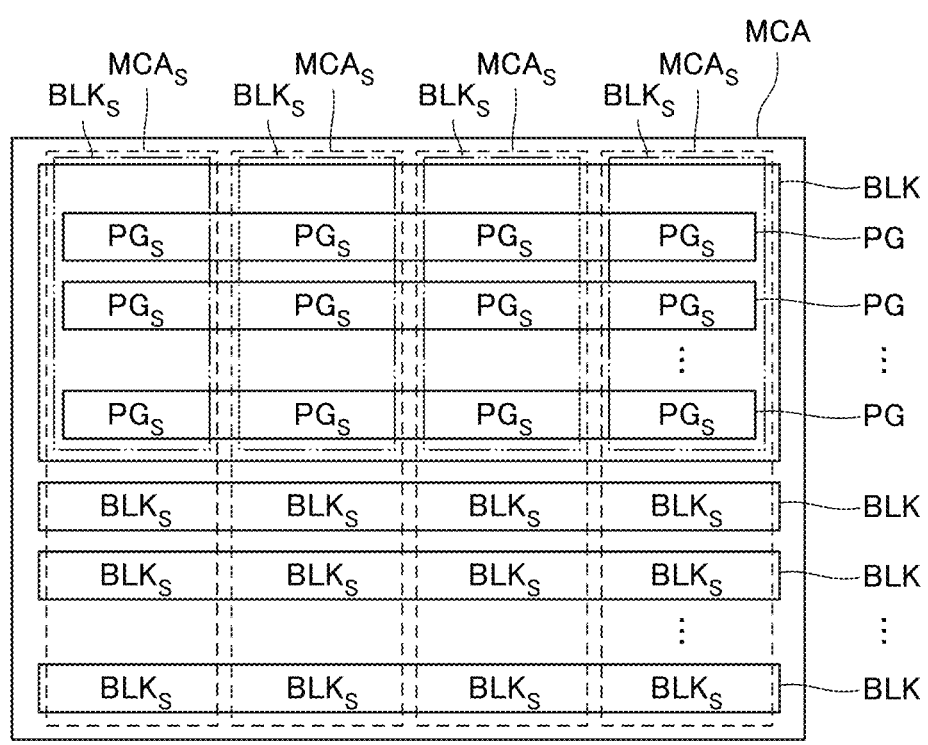
FIG. 1 is a schematic block diagram illustrating a part of a configuration of a semiconductor memory device according to a first embodiment.

A semiconductor memory device according to one embodiment comprises a memory cell array and a peripheral circuit. The memory cell array includes a plurality of first semiconductor layers and a plurality of first via electrodes. The plurality of first semiconductor layers extend in a first direction and are arranged in a second direction intersecting with the first direction. The plurality of first via electrodes are each disposed between two adjacent ones of the first semiconductor layers in the second direction. The peripheral circuit includes a plurality of first nodes, a charging circuit, a discharging circuit, an address select circuit, a plurality of first transistors, and a plurality of amplifier circuits. The plurality of first nodes are disposed corresponding to the plurality of first via electrodes. The charging circuit charges the plurality of first nodes. The discharging circuit discharges the plurality of first nodes. The address select circuit is disposed in a current path between the plurality of first nodes and the charging circuit or in a current path between the plurality of first nodes and the discharging circuit and electrically conducts one of the plurality of first nodes with the charging circuit or the discharging circuit in response to an input address signal. The plurality of first transistors are each disposed in a current path between two of the plurality of first nodes. The plurality of amplifier circuits are disposed corresponding to the plurality of first via electrodes and include input terminals connected to any of the plurality of first nodes and output terminals connected to any of the plurality of first via electrodes.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in an OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

First Embodiment

[Configuration]

FIG. 1 is a schematic block diagram illustrating a part of a configuration of a semiconductor memory device according to a first embodiment.

The semiconductor memory device according to the embodiment includes a memory cell array MCA. The memory cell array MCA includes a plurality of memory blocks BLK. The plurality of memory blocks BLK each include a plurality of pages PG.

In the semiconductor memory device according to the embodiment, the memory cell array MCA is divided into a plurality of (four in the illustrated example) sub-arrays $MCA_S$. The plurality of memory blocks BLK are each divided into a plurality of (four in the illustrated example) sub-blocks $BLK_S$ corresponding to the plurality of sub-arrays $MCA_S$. The plurality of pages PG are each divided into a plurality of (four in the illustrated example) sub-pages $PG_S$ corresponding to the plurality of sub-arrays $MCA_S$.

In the semiconductor memory device according to the embodiment, the page PG or the sub-page $PG_S$ can be an execution unit of a read operation and a write operation.

In the semiconductor memory device according to the embodiment, the memory block BLK or the sub-block $BLK_S$ can be an execution unit of an erase operation.

Figure 2:
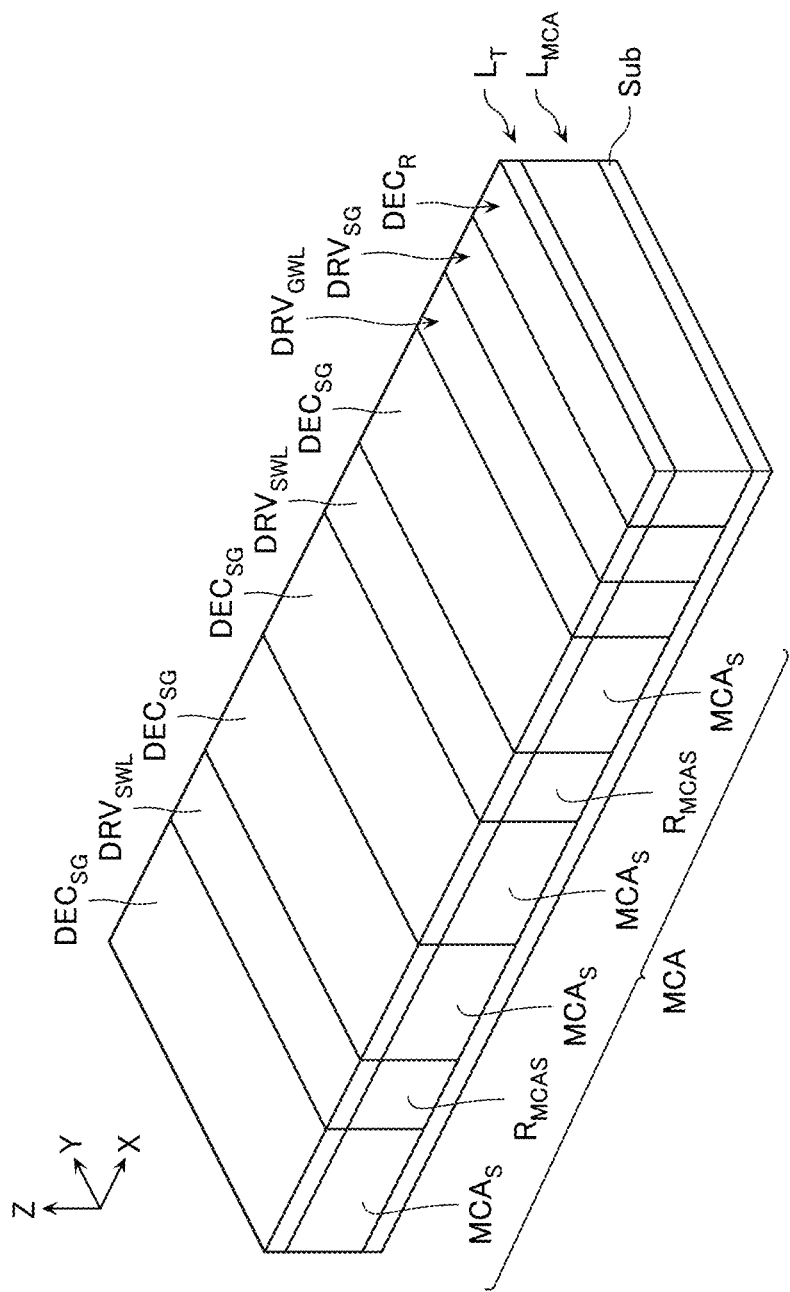
FIG. 2 is a schematic perspective view illustrating a part of the configuration of the semiconductor memory device.

FIG. 2 is a schematic perspective view illustrating a part of the configuration of the semiconductor memory device according to the first embodiment. The semiconductor memory device according to the embodiment includes a semiconductor substrate Sub, a memory cell array layer $L_{MCA}$ disposed above the semiconductor substrate Sub, and a transistor layer $L_T$ disposed above the memory cell array layer $L_{MCA}$.

For example, the semiconductor substrate Sub includes silicon (Si) containing P-type impurities, such as boron (B), or the like. On the upper surface of the semiconductor substrate Sub, a part of the peripheral circuit that controls the memory cell array MCA may be disposed.

The memory cell array MCA is disposed in the memory cell array layer $L_{MCA}$. The memory cell array layer $L_{MCA}$ includes four sub-arrays $MCA_S$ arranged in the X-direction. An inter-sub-array region $R_{MCAS}$ is disposed between the first and second sub-arrays $MCA_S$ counting from one side in the X-direction (for example, X-direction negative side). Further, an inter-sub-array region $R_{MCAS}$ is disposed between the third and fourth sub-arrays $MCA_S$ counting from the one side in the X-direction (for example, X-direction negative side).

The transistor layer $L_T$ includes four decode circuits $DEC_{SG}$ disposed at positions corresponding to the four sub-arrays $MCA_S$. The transistor layer $L_T$ includes two driver circuits $DRV_{SWL}$ disposed at positions corresponding to the two inter-sub-array regions $R_{MCAS}$.

Additionally, the transistor layer $L_T$ includes a driver circuit $DRV_{GWL}$, a driver circuit $DRV_{SG}$, and a decode circuit $DEC_R$ that are arranged in the X-direction with respect to these configurations.

[Configuration of Memory Cell Array Layer $L_{MCA}$]

[Configuration of Sub-Array $MCA_S$]

Figure 3:
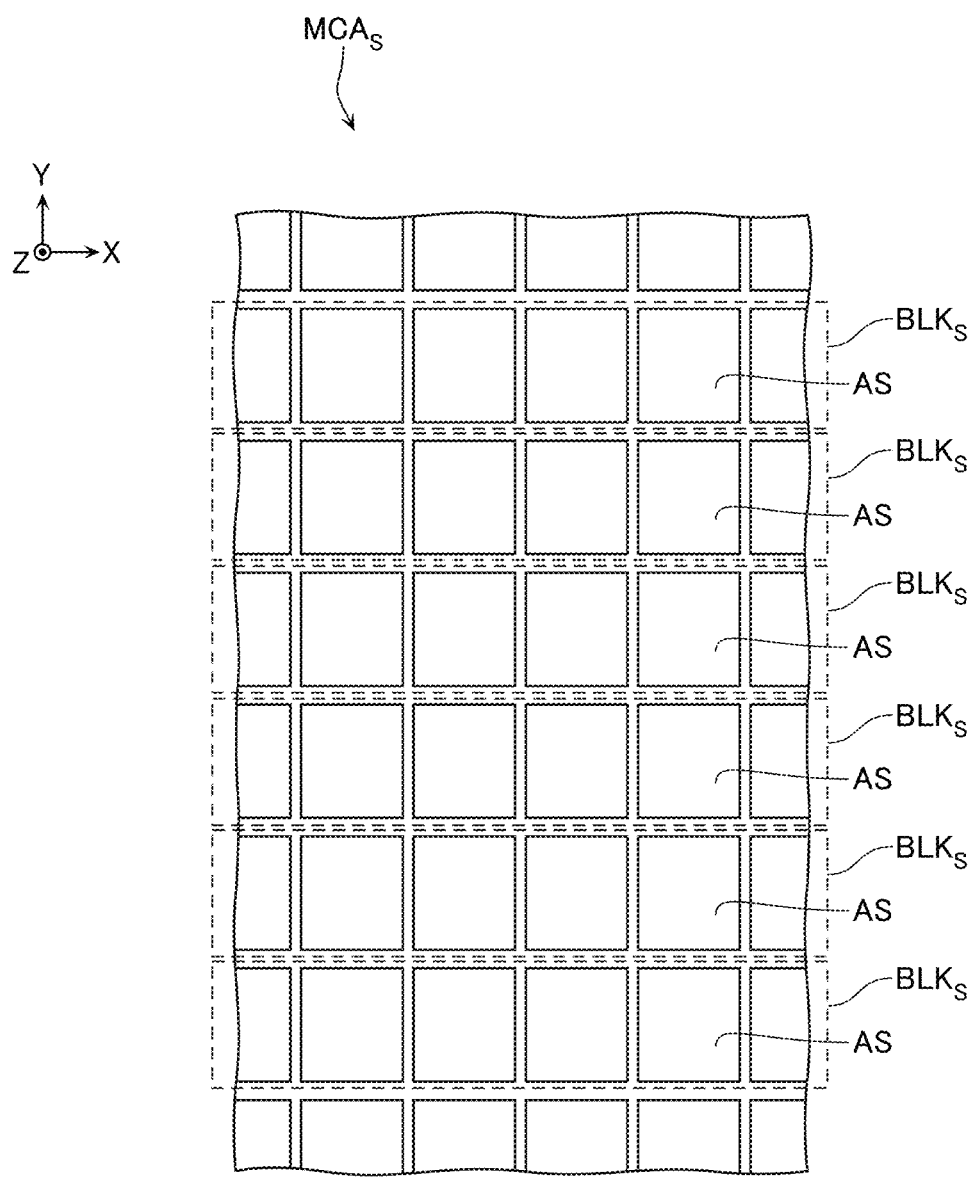
FIG. 3 is a schematic plan view illustrating a part of a configuration of a sub-array $MCA_S$.

FIG. 3 is a schematic plan view illustrating a part of the configuration of the sub-array $MCA_S$. The sub-array $MCA_S$ includes a plurality of sub-blocks $BLK_S$ arranged in the Y-direction. The plurality of sub-blocks $BLK_S$ each include a plurality of array structures AS arranged in the X-direction.

Figure 4:
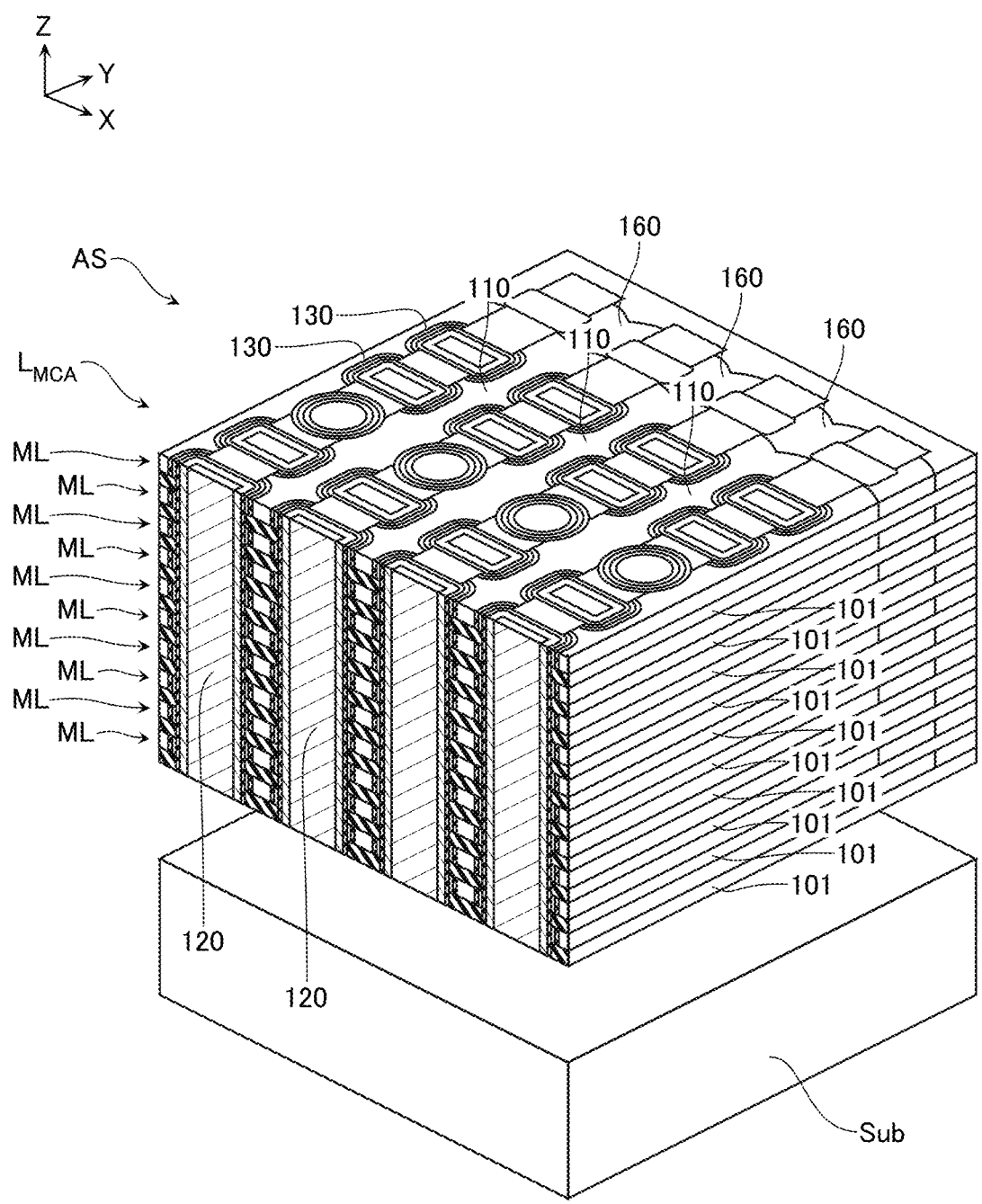
Figure 5:
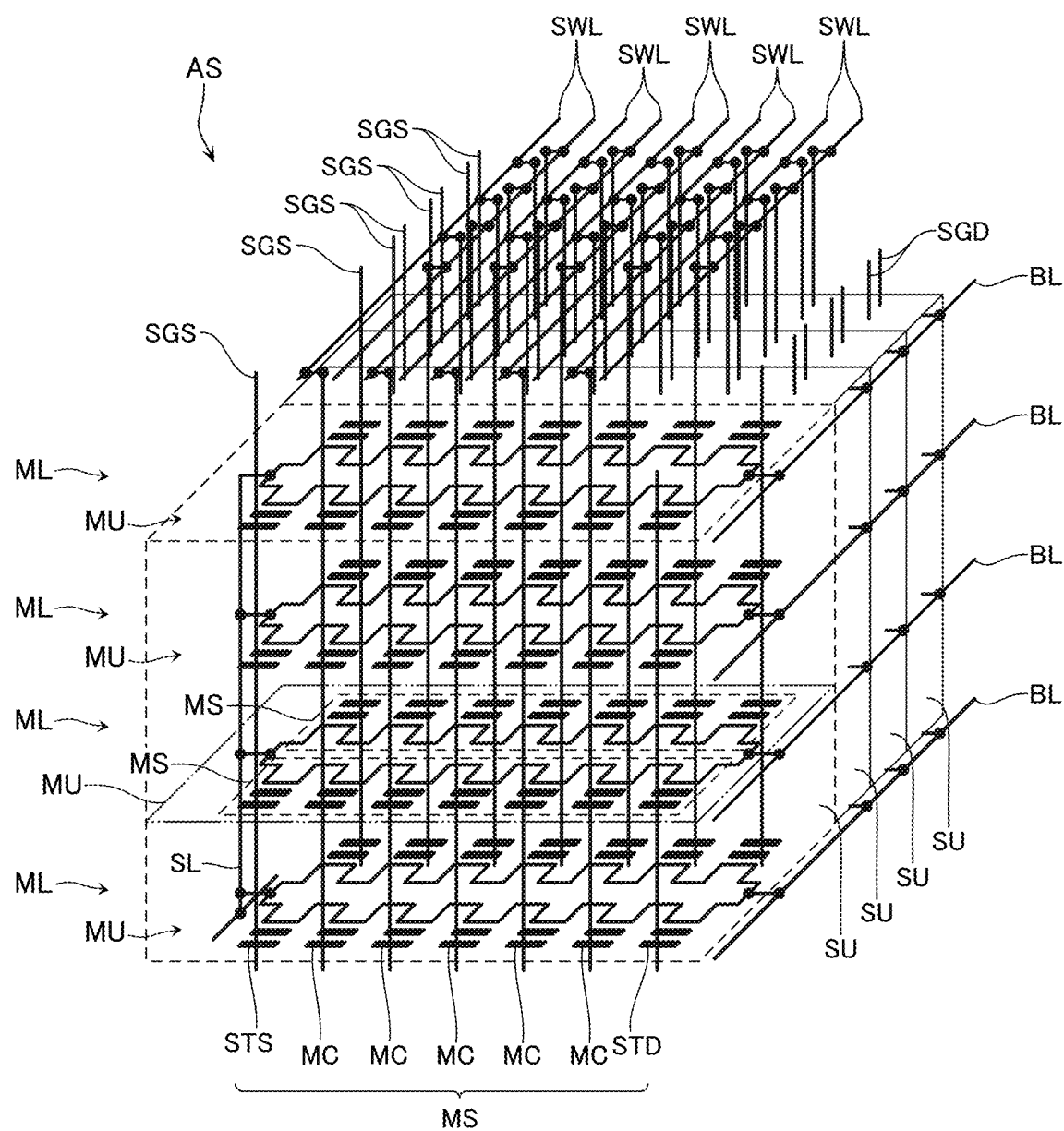
Figure 6:
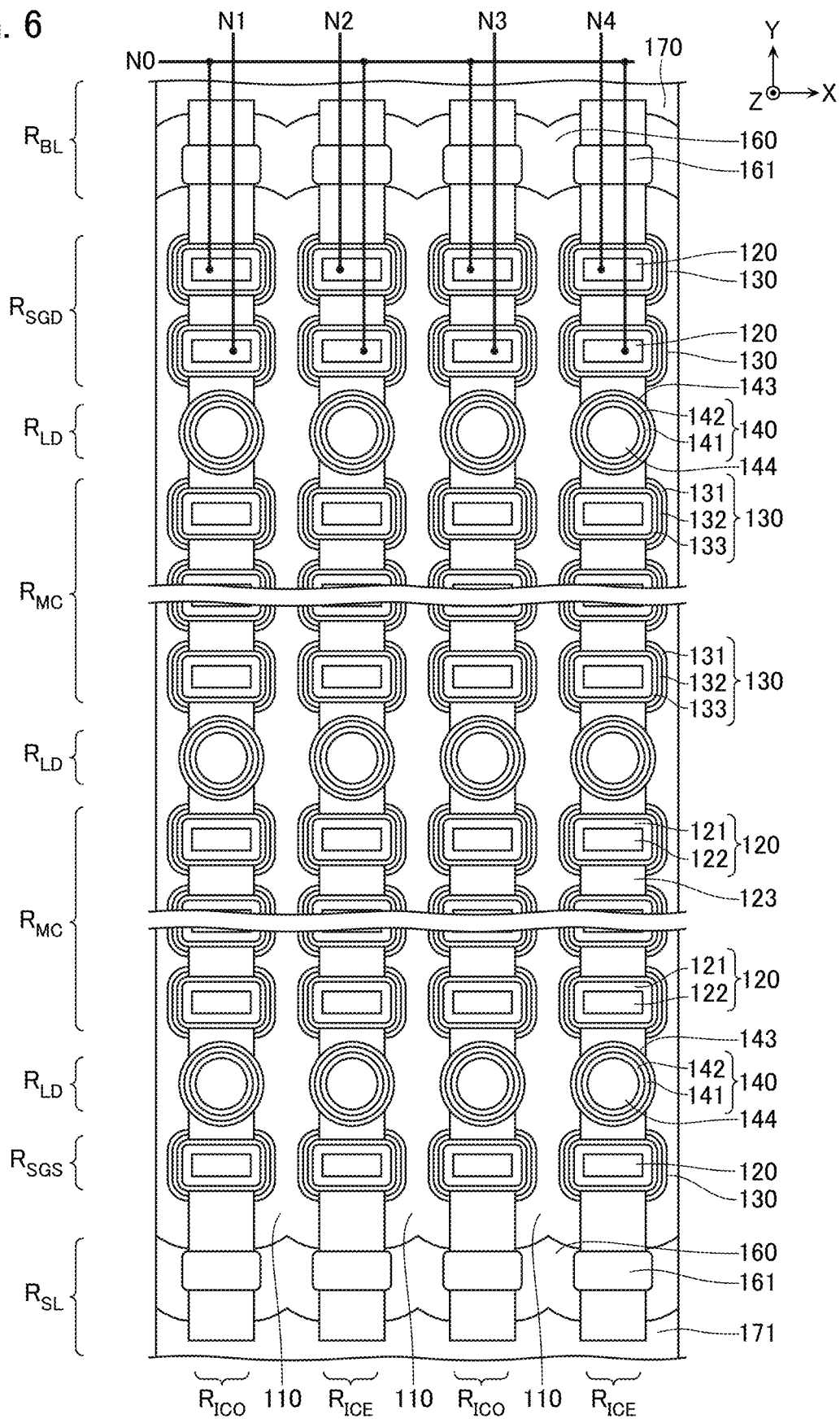
Figure 7:
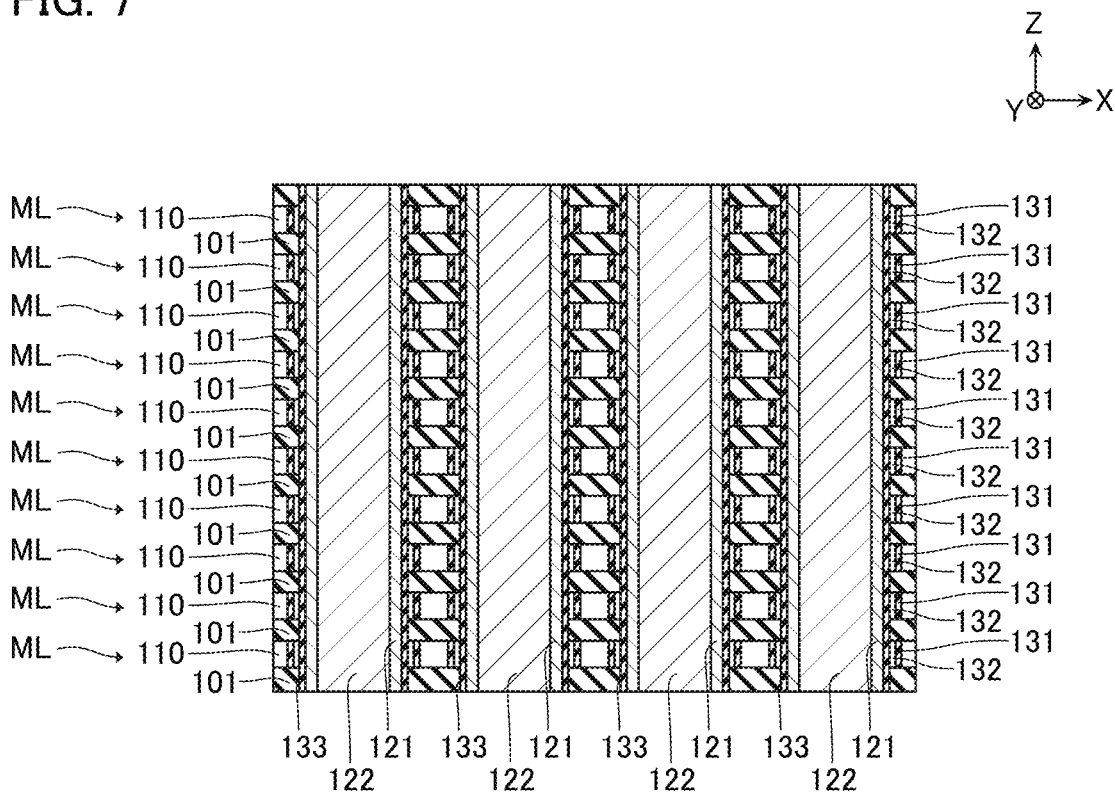
Figure 8:
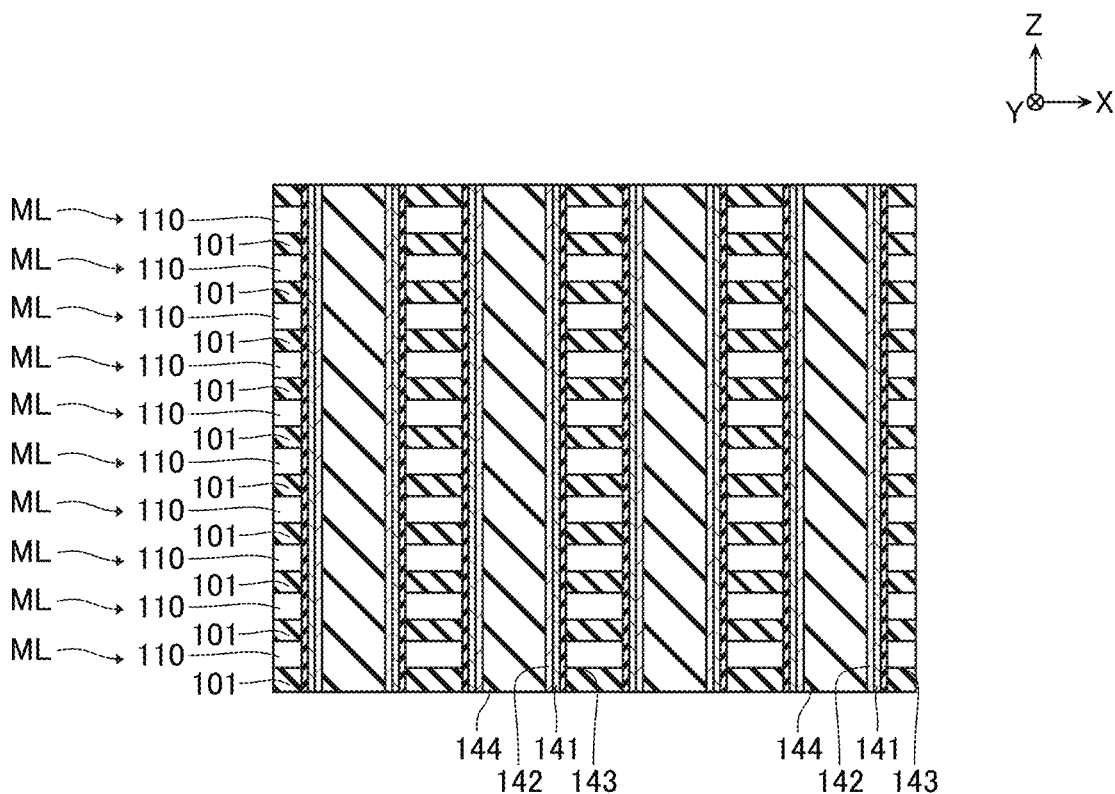

FIG. 4 is a schematic perspective view illustrating a part of a configuration of the array structure AS. FIG. 5 is a schematic circuit diagram illustrating a part of the configuration of the array structure AS. FIG. 6 is a schematic plan view illustrating a part of the configuration of the array structure AS. FIG. 7 and FIG. 8 are schematic cross-sectional views illustrating a part of the configuration of the array structure AS.

As illustrated in FIG. 4, the memory cell array layer $L_{MCA}$ includes a plurality of memory layers ML and a plurality of insulating layers 101 alternately arranged in the Z-direction. The insulating layer 101 contains silicon oxide ($SiO_2$) or the like.

As illustrated in FIG. 5, the array structure AS includes a plurality of string units SU. The string unit SU includes a plurality of memory units MU disposed corresponding to the plurality of memory layers ML. The plurality of memory units MU each include two memory strings MS. These two memory strings MS have one ends each connected to the peripheral circuit via a bit line BL. These two memory strings MS have the other ends each connected to the peripheral circuit via a common source line SL.

The memory string MS includes a drain-side select transistor STD, a plurality of memory cells MC (memory transistors), and a source-side select transistor STS. The drain-side select transistor STD, the plurality of memory cells MC, and the source-side select transistor STS are connected in series between the bit line BL and the source line SL. Hereinafter, the drain-side select transistor STD and the source-side select transistor STS may be simply referred to as select transistors (STD, STS).

The memory cell MC is a field-effect type transistor. The memory cell MC includes a semiconductor layer, a gate insulating film, and a gate electrode. The semiconductor layer functions as a channel region. The gate insulating film includes an electric charge accumulating layer. The memory cell MC has a threshold voltage that changes according to an electric charge amount in the electric charge accumulating layer. The memory cell MC stores one bit or a plurality of bits of data. Sub-word lines SWL are connected to the respective gate electrodes of the plurality of memory cells MC included in one memory unit MU. These respective sub-word lines SWL are connected to all of the memory units MU in one array structure AS in common.

The select transistors (STD, STS) are field-effect type transistors. The select transistors (STD, STS) each include a semiconductor layer, a gate insulating film, and a gate electrode. The semiconductor layer functions as a channel region. Select gate lines (SGD, SGS) are connected to the respective gate electrodes of the select transistors (STD, STS). Two drain-side select gate lines SGD corresponding to the two memory strings MS are each connected to all of the memory units MU in one string unit SU in common. Two source-side select gate lines SGS corresponding to the two memory strings MS are each connected to all of the memory units MU in one string unit SU in common.

In the read operation and the write operation, in a plurality of array structures AS constituting the memory block BLK or the sub-block $BLK_S$, a drain-side select gate line SGD according to address data is selected. Accordingly, in each array structure AS, one string unit SU is selected. In the read operation and the write operation, in a plurality of array structures AS constituting a memory block BLK or a sub-block $BLK_S$, a sub-word line SWL according to address data is selected. Accordingly, in each string unit SU, one memory cell MC is selected. These plurality of memory cells MC correspond to the pages PG or the sub-pages $PG_S$ described with reference to FIG. 1.

As illustrated in FIG. 6, a plurality of memory cell regions $R_{MC}$ and a plurality of ladder regions $R_{LD}$ alternately arranged in the Y-direction are disposed in the array structure AS. In one end portion in the Y-direction of the array structure AS, a select transistor region $R_{SGD}$ and a bit line region $R_{BL}$ are disposed. In the other end portion in the Y-direction of the array structure AS, a select transistor region $R_{SGS}$ and a source line region $R_{SL}$ are disposed.

The memory layer ML includes a plurality of semiconductor layers 110 arranged in the X-direction. These plurality of semiconductor layers 110 each extend in the Y-direction across the plurality of memory cell regions $R_{MC}$, the plurality of ladder regions $R_{LD}$, and the select transistor regions $R_{SGD}$, $R_{SGS}$ described with reference to FIG. 6. For example, the semiconductor layers 110 function as channel regions of the plurality of memory cells MC (FIG. 5) connected in series and the select transistors (STD, STS) (FIG. 5) connected to the plurality of memory cells MC. For example, the semiconductor layer 110 may contain polycrystalline silicon (Si) or the like or may contain single-crystal silicon (Si) or the like. In these cases, the semiconductor layer 110 may contain N-type impurities, such as phosphorus (P), may contain P-type impurities, such as boron (B), or need not contain impurities.

In the following description, a region between two semiconductor layers 110 adjacent in the X-direction may be referred to as an "inter-channel region $R_{IC}$". Further, an odd-numbered inter-channel region $R_{IC}$ counting from one side in the X-direction (for example, X-direction negative side) may be referred to as an "inter-channel region $R_{ICO}$". Further, an even-numbered inter-channel region $R_{IC}$ counting from the one side in the X-direction may be referred to as an "inter-channel region $R_{ICE}$"

As illustrated in FIG. 6, in the inter-channel regions $R_{IC}$ in the memory cell regions $R_{MC}$ and the select transistor regions $R_{SGD}$, $R_{SGS}$ (FIG. 6), a plurality of via electrodes 120 arranged in the Y-direction are disposed. In the memory cell region $R_{MC}$, the memory layer ML includes a plurality of gate insulating layers 130 disposed between side surfaces in the X-direction of the plurality of via electrodes 120 and the semiconductor layers 110.

Among the via electrodes 120, via electrodes 120 disposed in the memory cell regions $R_{MC}$ function as, for example, gate electrodes of the plurality of memory cells MC and parts of the sub-word lines SWL (FIG. 5) connected to these gate electrodes. Among the via electrodes 120, via electrodes 120 disposed in the select transistor regions $R_{SGD}$, $R_{SGS}$ respectively function as gate electrodes of the select transistors STD, STS and the select gate lines SGD, SGS (FIG. 5) connected to these gate electrodes.

For example, as illustrated in FIG. 6, the via electrode 120 may include a barrier conductive layer 121 of titanium nitride (TiN) or the like and a conductive layer 122 of tungsten (W) or the like. For example, as illustrated in FIG. 7, the via electrode 120 passes through the plurality of memory layers ML and extends in the Z-direction. As illustrated in FIG. 6, between two via electrodes 120 adjacent in the Y-direction, an insulating layer 123 (FIG. 6) of silicon oxide (SiO2) or the like is disposed.

In the embodiment, in the respective inter-channel regions $R_{IC}$ in the select transistor region $R_{SGD}$, two via electrodes 120 arranged in the Y-direction are disposed.

Here, among the two via electrodes 120 disposed in the inter-channel region $R_{ICO}$ in the select transistor region $R_{SGD}$, the via electrode 120 farther from the memory cell regions $R_{MC}$ is used for turning OFF the drain-side select transistor STD. In the illustrated example, these via electrodes 120 are connected to a node NO in common. On the other hand, the via electrode 120 closer to the memory cell regions $R_{MC}$ is used for turning ON or OFF the drain-side select transistor STD. In the illustrated example, these via electrodes 120 are connected to nodes N1, N3. The nodes N0, N1, N3 are electrically independent from one another and can transfer independent voltages.

Among the two via electrodes 120 disposed in the inter-channel region $R_{ICE}$ in the select transistor region $R_{SGD}$, the via electrode 120 farther from the memory cell region $R_{MC}$ is used for turning ON or OFF the drain-side select transistor STD. In the illustrated example, these via electrodes 120 are connected to nodes N2, N4. On the other hand, the via electrode 120 closer to the memory cell region $R_{MC}$ is used for turning OFF the drain-side select transistor STD. In the illustrated example, these via electrodes 120 are connected to the node NO in common. The nodes N0, N2, N4 are electrically independent from one another and can transfer independent voltages.

It is only necessary for arrangement of the via electrodes 120 in the above-described inter-channel regions $R_{ICO}$ and $R_{ICE}$ to be alternate, and connection to the nodes NO to N4 may be inverse between $R_{ICO}$ and $R_{ICE}$. For example, among the two via electrodes 120 disposed in the inter-channel region $R_{ICO}$ in the select transistor region $R_{SGD}$, the via electrode 120 farther from the memory cell region $R_{MC}$ may be connected to the nodes N1, N3, and the via electrode 120 closer to the memory cell region $R_{MC}$ may be connected to the node NO. In this case, among the two via electrodes 120 disposed in the inter-channel region $R_{ICE}$ in the select transistor region RSD, the via electrode 120 farther from the memory cell region $R_{MC}$ may be connected to the node N0, and the via electrode 120 closer to the memory cell region $R_{MC}$ may be connected to the nodes N2, N4.

The gate insulating layer 130 includes, for example, a tunnel insulating layer 131 disposed on a side surface in the X-direction of the semiconductor layer 110, an electric charge accumulating layer 132 disposed on a side surface in the X-direction of the tunnel insulating layer 131, and a block insulating layer 133 disposed on a side surface in the X-direction of the electric charge accumulating layer 132.

The tunnel insulating layer 131 may contain, for example, silicon oxide (SiO$_2$) or the like.

The electric charge accumulating layer 132 may contain, for example, polycrystalline silicon (Si) or the like. In this case, the electric charge accumulating layer 132 may contain N-type impurities, such as phosphorus (P), may contain P-type impurities, such as boron (B), or need not contain impurities.

The block insulating layer 133 may contain, for example, silicon oxide (SiO$_2$) or the like. Further, the block insulating layer 133 may contain an insulating metal oxide film of aluminum oxide (AlO), hafnium oxide (HfO), or others.

In the inter-channel regions $R_{IC}$ in the ladder regions $R_{LD}$ (FIG. 6), via electrodes 140 are disposed.

The via electrode 140 functions as, for example, a gate electrode of a transistor and wiring connected to the gate electrode. For example, as illustrated in FIG. 6, the via electrode 140 may contain a semiconductor layer 141 of polycrystalline silicon (Si) containing N-type impurities, such as phosphorus (P), or the like and a conductive layer 142 of titanium nitride (TiN) or the like. For example, as illustrated in FIG. 8, the via electrode 140 passes through the plurality of memory layers ML and extends in the Z-direction. On an outer peripheral surface of the via electrode 140, an insulating layer 143 of silicon oxide (SiO$_2$) or the like is disposed. In the center part of the via electrode 140, an insulating layer 144 of silicon oxide (SiO$_2$) or the like may be disposed.

In the bit line region $R_{BL}$ (FIG. 6), the memory layer ML includes a plurality of semiconductor layers 160 arranged in the X-direction and a conductive layer 170 connected to these plurality of semiconductor layers 160.

The semiconductor layer 160 may contain, for example, a semiconductor layer of polycrystalline silicon (Si) containing N-type impurities, such as phosphorus (P), or the like. The semiconductor layers 160 are each connected to end portions in the Y-direction of the semiconductor layers 110. Between two semiconductor layers 160 adjacent in the X-direction, an insulating layer 161 is disposed. The insulating layer 161 may contain, for example, silicon oxide (SiO$_2$) or the like. The insulating layer 161 passes through the plurality of memory layers ML and extends in the Z-direction.

The conductive layer 170 functions as, for example, the bit line BL (FIG. 5). The conductive layer 170 may contain, for example, a conductive layer of titanium nitride (TiN) or the like. The conductive layer 170 extends in the X-direction and is electrically connected to the plurality of semiconductor layers 110 via the plurality of semiconductor layers 160.

In the source line region $R_{SL}$ (FIG. 6), the memory layer ML includes a plurality of semiconductor layers 160 arranged in the X-direction and a conductive layer 171 connected to these plurality of semiconductor layers 160.

The conductive layer 171 functions as, for example, the source line SL (FIG. 5). The conductive layer 171 may contain, for example, a conductive layer of titanium nitride (TiN) or the like. The conductive layer 171 extends in the X-direction and is electrically connected to the plurality of semiconductor layers 110 via the plurality of semiconductor layers 160.

[Structure of Transistor Layer $L_T$]

Figure 9:
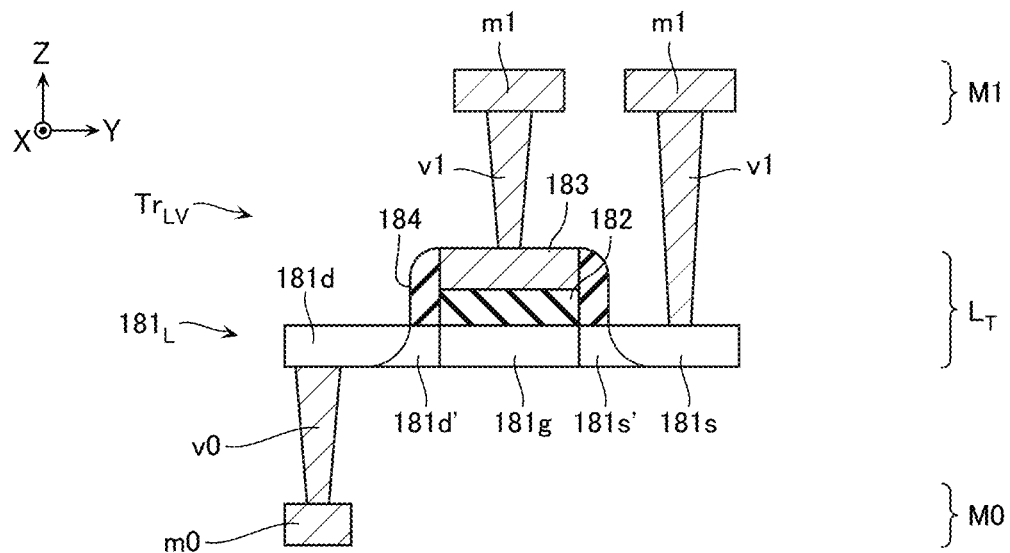
FIG. 9 is a schematic cross-sectional view illustrating a part of a configuration of a transistor layer $L_T$.
Figure 10:
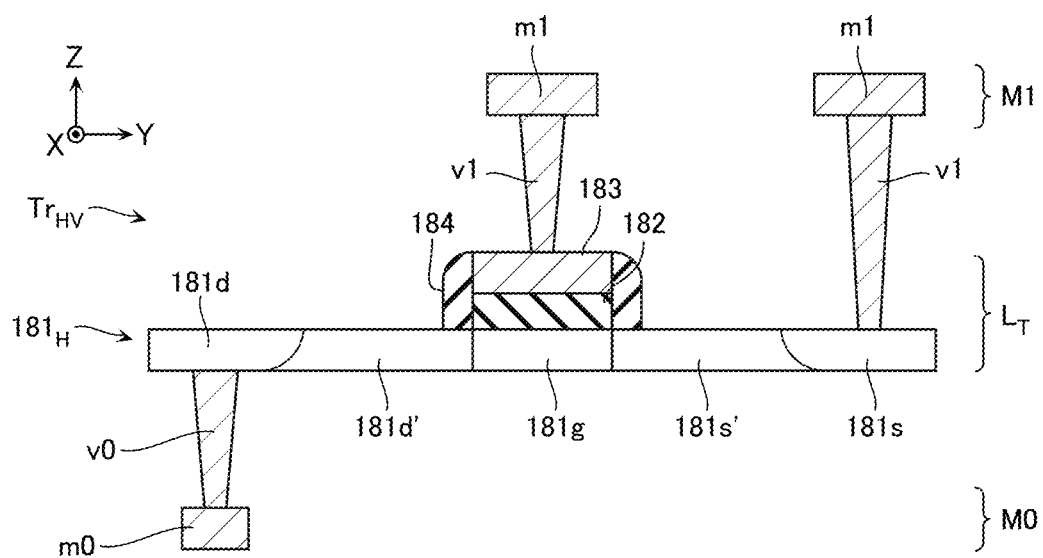
FIG. 10 is a schematic cross-sectional view illustrating a part of the configuration of the transistor layer $L_T$.

FIG. 9 and FIG. 10 are schematic cross-sectional views illustrating a part of a configuration of the transistor layer $L_T$. In FIG. 9 and FIG. 10, in addition to the transistor layer $L_T$, a wiring layer M0 disposed below the transistor layer $L_T$ and a wiring layer M1 disposed above the transistor layer $L_T$ are exemplified.

The transistor layer $L_T$ includes a transistor $Tr_{LV}$ as exemplified in FIG. 9 and a transistor $Tr_{HV}$ as exemplified in FIG. 10. The transistor $Tr_{LV}$ is a low-voltage transistor. The transistor $Tr_{HV}$ is a high-voltage transistor.

As illustrated in FIG. 9, the transistor Trim includes a semiconductor layer $181_L$, a gate insulating layer 182 disposed on the upper surface of the semiconductor layer $181_L$, a gate electrode 183 disposed on the upper surface of the gate insulating layer 182, sidewall insulating layers 184 disposed on both side surfaces in the X-direction or the Y-direction of the gate insulating layer 182 and the gate electrode 183.

The semiconductor layer $181_L$ may contain polycrystalline silicon (Si) or the like. The gate insulating layer 182 may contain, for example, at least one of silicon oxide ($SiO_2$) and silicon nitride (SiN) or may contain an insulating metal oxide film of aluminum oxide (AlO), hafnium oxide (HfO), or others. The gate electrode 183 is opposed to the upper surface of the semiconductor layer $181_L$ via the gate insulating layer 182. The gate electrode 183 may include, for example, a stacked film of a polycrystalline silicon (Si) containing N-type or P-type impurities, a metal such as tungsten (W), silicide, or a combination of two or more of these, or the like. The gate electrode 183 is connected to a wiring m1 in the wiring layer M1 via a via contact electrode v1. The sidewall insulating layer 184 may contain, for example, at least one of silicon oxide ($SiO_2$) and silicon nitride (SiN).

A region of the semiconductor layer $181_L$ that overlaps with the gate electrode 183 when viewed from the Z-direction becomes a gate region 181g. A region of the semiconductor layer $181_L$ that overlaps with the sidewall insulating layer 184 when viewed from the Z-direction becomes a region 181s' or a region 181d'. A region of the semiconductor layer $181_L$ that does not overlap with the gate electrode 183 or the sidewall insulating layers 184 when viewed from the Z-direction becomes a source region 181s or a drain region 181d. The source region 181s and the drain region 181d are connected to a wiring m0 in the wiring layer M0 or a wiring m1 in the wiring layer M1 via a via contact electrode v0 or a via contact electrode v1. The region 181s' is disposed between the source region 181s and the gate region 181g. The region 181d' is disposed between the drain region 181d and the gate region 181g.

When the transistor $Tr_{LV}$ is an N-channel type field effect transistor, the source region 181s, the drain region 181d, the region 181s', and the region 181d' contain N-type impurities, such as phosphorus (P) and arsenic (As), and function as N-type semiconductors. An impurity concentration in the region 181s' and the region 181d' is smaller than an impurity concentration in the source region 181s and the drain region 181d. The gate region 181g contains P-type impurities, such as boron (B) and functions as a P-type semiconductor.

When the transistor $Tr_{LV}$ is a P-channel type field effect transistor, the source region 181s, the drain region 181d, the region 181s', and the region 181d' contain P-type impurities, such as boron (B) and function as P-type semiconductors. The impurity concentration in the region 181s' and the region 181d' is smaller than the impurity concentration in the source region 181s and the drain region 181d. The gate region 181g contains N-type impurities, such as phosphorus (P) and arsenic (As), and functions as an N-type semiconductor.

As illustrated in FIG. 10, the transistor $Tr_{HV}$ is basically configured similarly to the transistor $Tr_{LV}$. However, the transistor $Tr_{HV}$ includes a semiconductor layer $181_H$ in place of the semiconductor layer $181_L$. The semiconductor layer $181_H$ is basically configured similarly to the semiconductor layer $181_L$. However, in a region of the semiconductor layer $181_H$ that do not overlap with the gate electrode 183 or the sidewall insulating layers 184 when viewed from the Z-direction, not only the source region 181s or the drain region 181d but also a part of the region 181s' or the region 181d' is disposed.

In the following description, the semiconductor layer $181_L$ and the semiconductor layer $181_H$ may be collectively referred to as semiconductor layers 181.

In FIG. 9 and FIG. 10, the transistors $Tr_{LV}$, $Tr_{HV}$ whose channel directions (longitudinal direction of the semiconductor layers 181) are the Y-direction are exemplified. However, the transistor layer $L_T$ may include the transistors $Tr_{LV}$, $Tr_{HV}$ whose channel directions are the X-direction.

[Configuration of Driver Circuits $DRV_{SWL}$, $DRV_{GWL}$]

Figure 11:
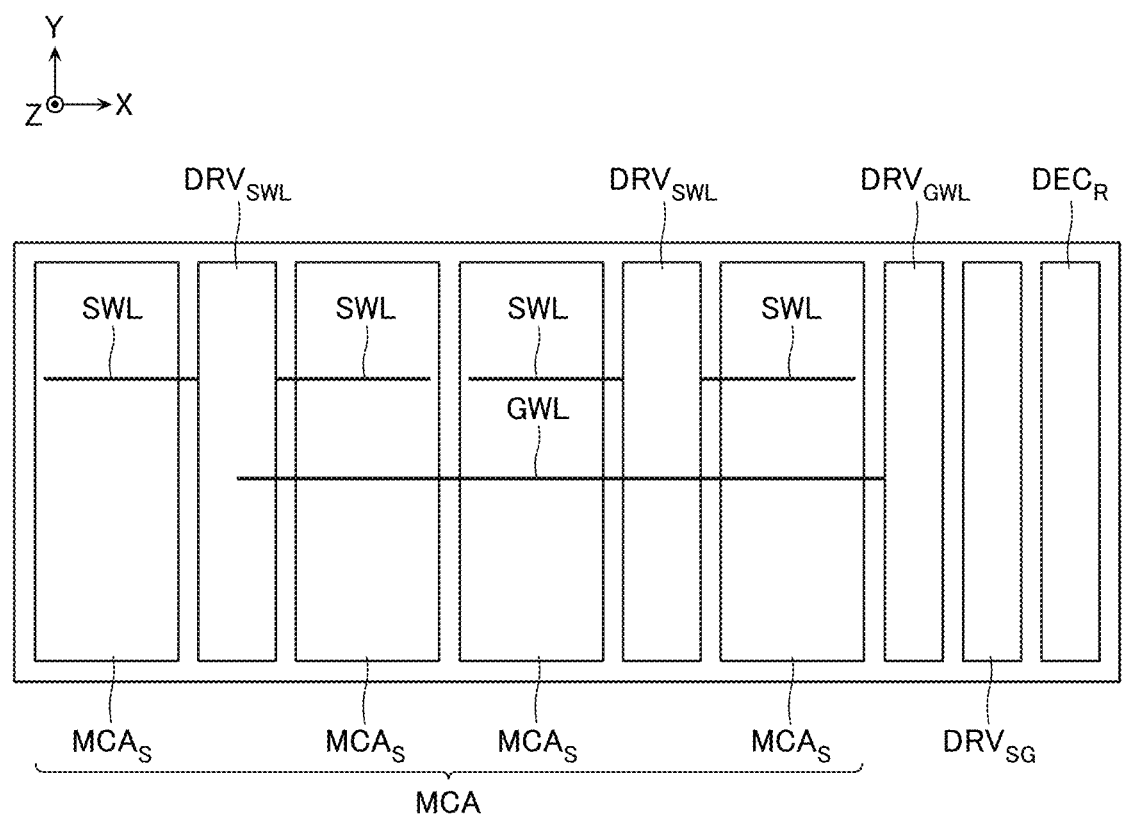
FIG. 11 is a schematic plan view illustrating a part of the configuration of the semiconductor memory device according to the first embodiment.
Figure 12:
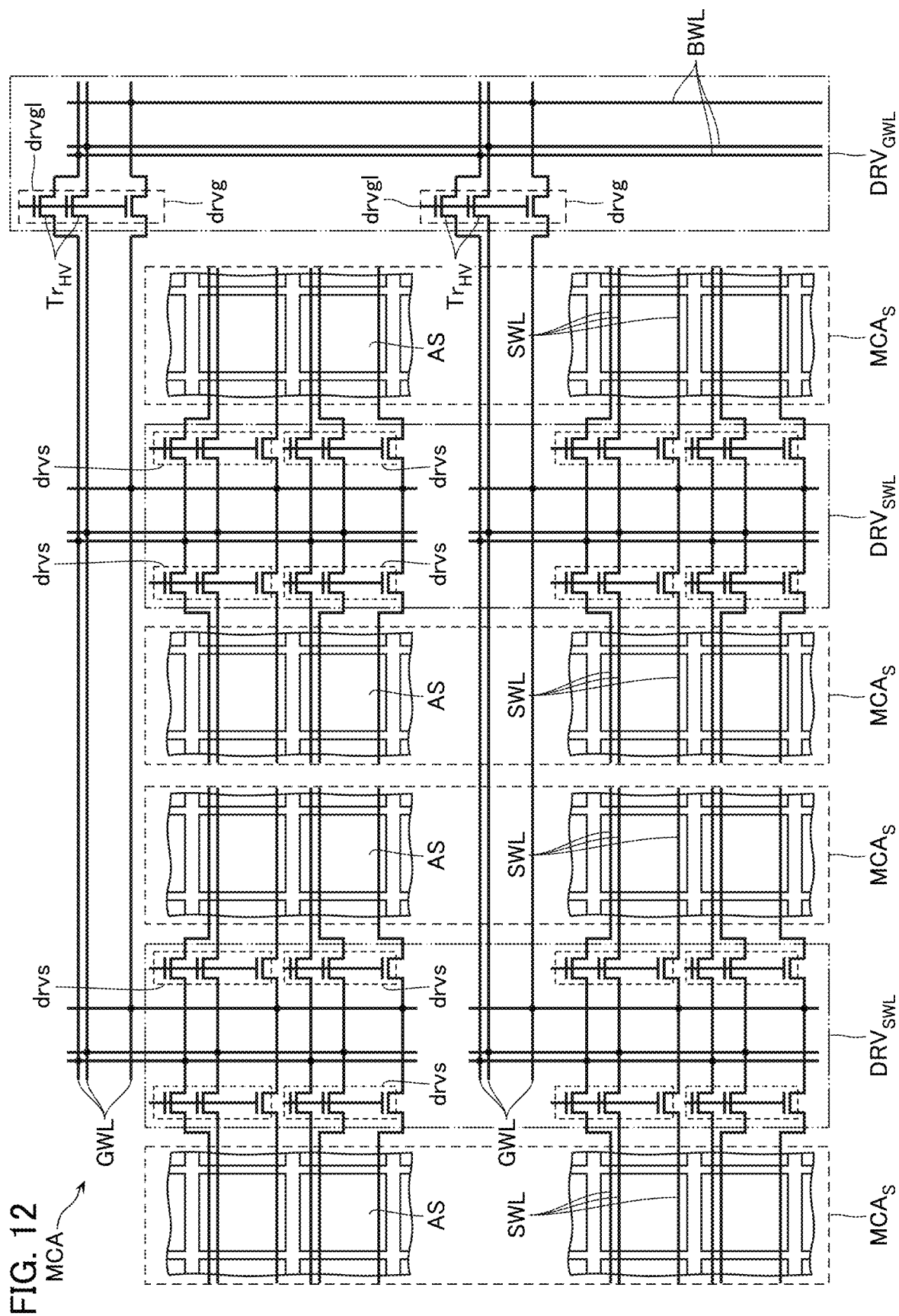
FIG. 12 is a schematic circuit diagram illustrating a part of the configuration of the semiconductor memory device.
Figure 13:
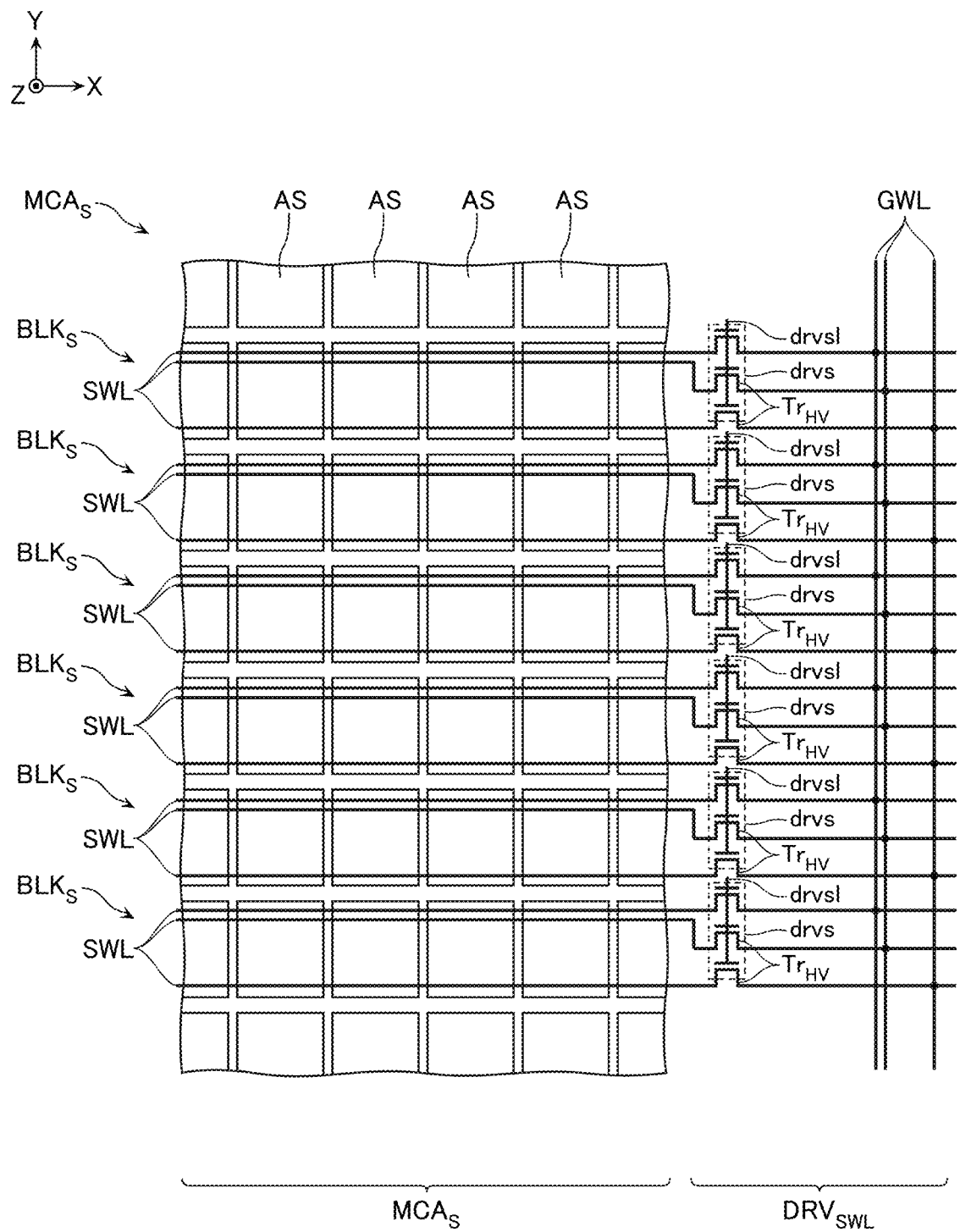
FIG. 13 is a schematic circuit diagram illustrating a part of the configuration of the semiconductor memory device.

FIG. 11 is a schematic plan view illustrating a part of the configuration of the semiconductor memory device according to the embodiment. FIG. 12 and FIG. 13 are schematic circuit diagrams illustrating a part of the configuration of the semiconductor memory device according to the embodiment.

In FIG. 11 to FIG. 13, plural sets of sub-word lines SWL, plural sets of global word lines GWL, and a pair of bus wirings BWL are exemplified.

As illustrated in FIG. 13, the plural sets of sub-word lines SWL each correspond to a plurality of sub-blocks $BLK_S$ arranged in the Y-direction. A plurality of sub-word lines SWL are connected to a plurality of array structures AS included in one sub-block $BLK_S$ in common. As illustrated in FIG. 11, the sub-word lines SWL are each electrically independent for every sub-array $MCA_S$.

As illustrated in FIG. 13, the driver circuit $DRV_{SWL}$ includes a plurality of circuits drvs each disposed corresponding to the plurality of sub-blocks $BLK_S$ arranged in the Y-direction. The circuit drvs includes a plurality of transistors $Tr_{HV}$ disposed corresponding to the plurality of sub-word lines SWL connected to one sub-block $BLK_S$. These plurality of transistors $Tr_{HV}$ have source electrodes connected to the global word lines GWL. These plurality of transistors $Tr_{HV}$ have drain electrodes connected to the sub-word lines SWL. These plurality of transistors $Tr_{HV}$ have gate electrodes connected to a wiring drvsl. The wiring drvsl is connected to the gate electrodes of all of the transistors $Tr_{HV}$ included in the circuit drvs in common. The wirings drvsl are each electrically independent for every circuit drvs.

As illustrated in FIG. 12, the memory cell array MCA is divided into a plurality of (two in the illustrated example) regions in the Y-direction. In the respective plurality of regions, a plurality of memory blocks BLK are included (see FIG. 13). In the example of FIG. 12, corresponding to the plurality of regions, plural sets (two sets in the illustrated example) of global word lines GWL are disposed. These plural sets of global word lines GWL are each electrically connected to all of the sub-blocks BLK included in the corresponding regions.

The driver circuit $DRV_{GWL}$ includes a plurality of circuits drvg disposed corresponding to the plural sets of global word lines GWL. The circuit drvg includes a plurality of transistors $Tr_{HV}$ disposed corresponding to a plurality of global word lines GWL included in a pair of global word lines GWL. These plurality of transistors $Tr_{HV}$ have source electrodes connected to the bus wirings BWL. These plurality of transistors $Tr_{HV}$ have drain electrodes connected to the global word lines GWL. These plurality of transistors $Tr_{HV}$ have gate electrodes connected to a wiring drvgl. The wiring drvgl is connected to the gate electrodes of all of the transistors $Tr_{HV}$ included in the circuit drvg in common. The wirings drvgl are each electrically independent for every circuit drvg.

Figure 14:
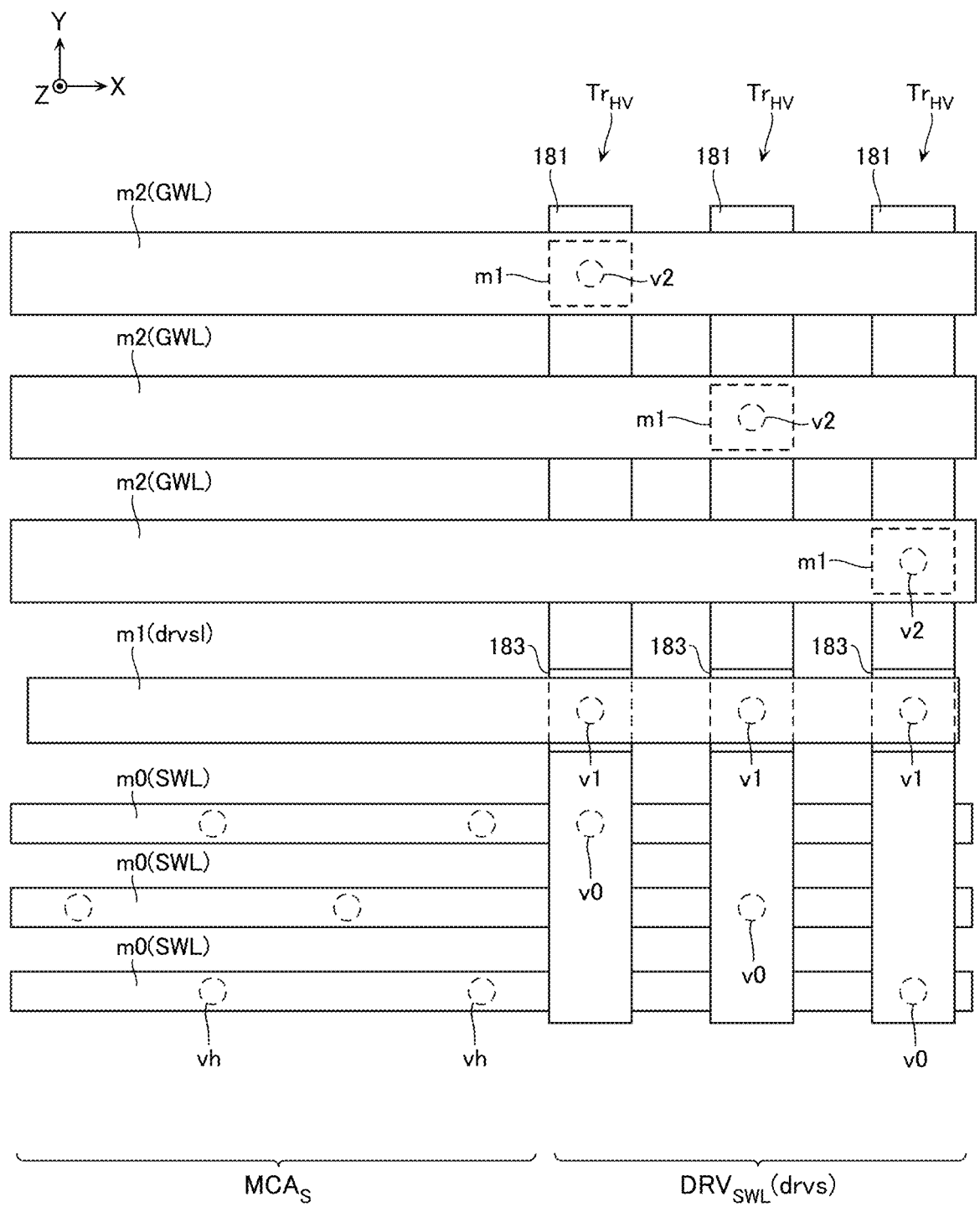
FIG. 14 is a schematic plan view illustrating a configuration of a driver circuit $DRV_{SWL}$.
Figure 15:
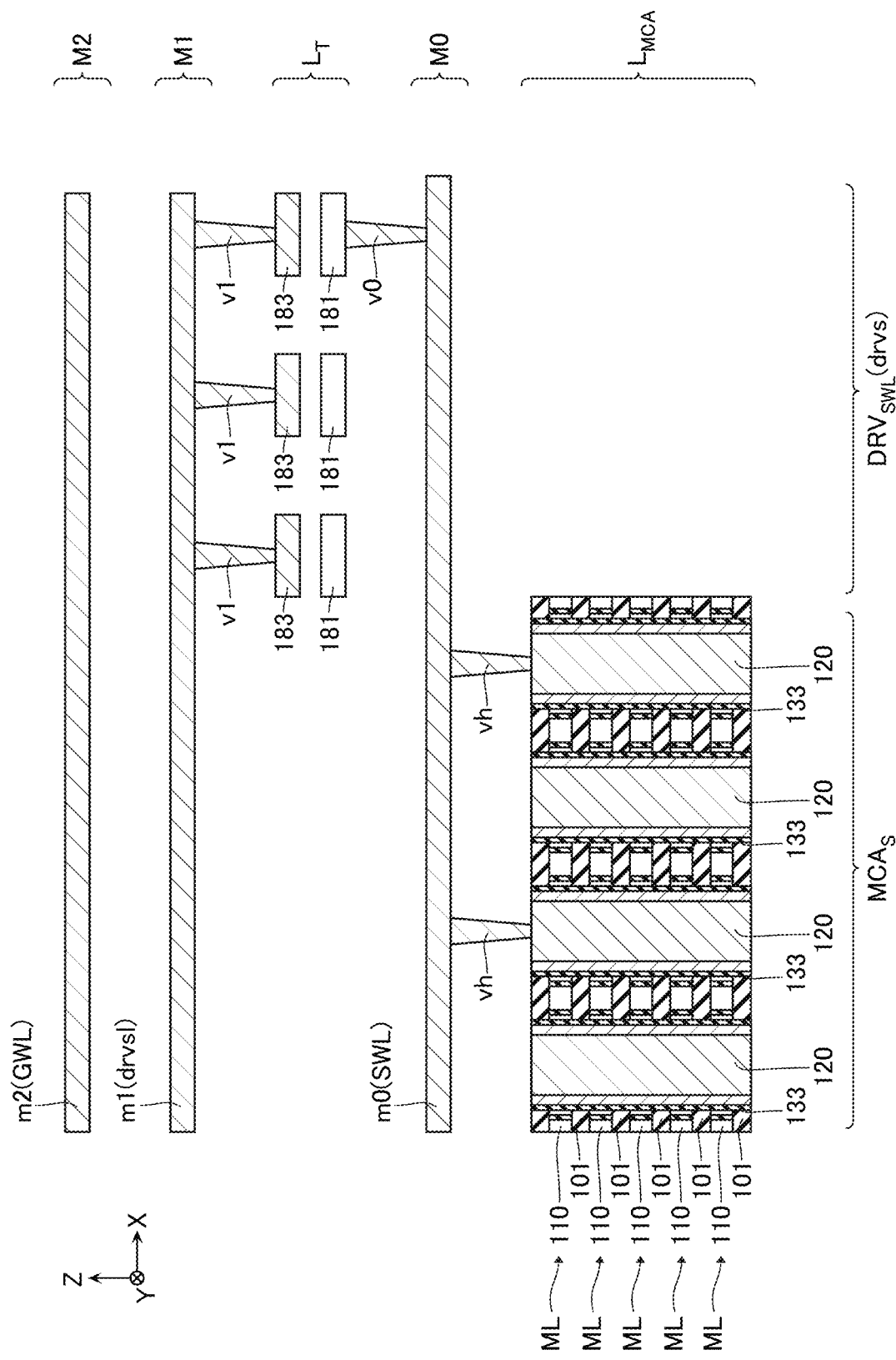
FIG. 15 is a schematic side view illustrating the configuration of the driver circuit $DRV_{SWL}$.
Figure 16:
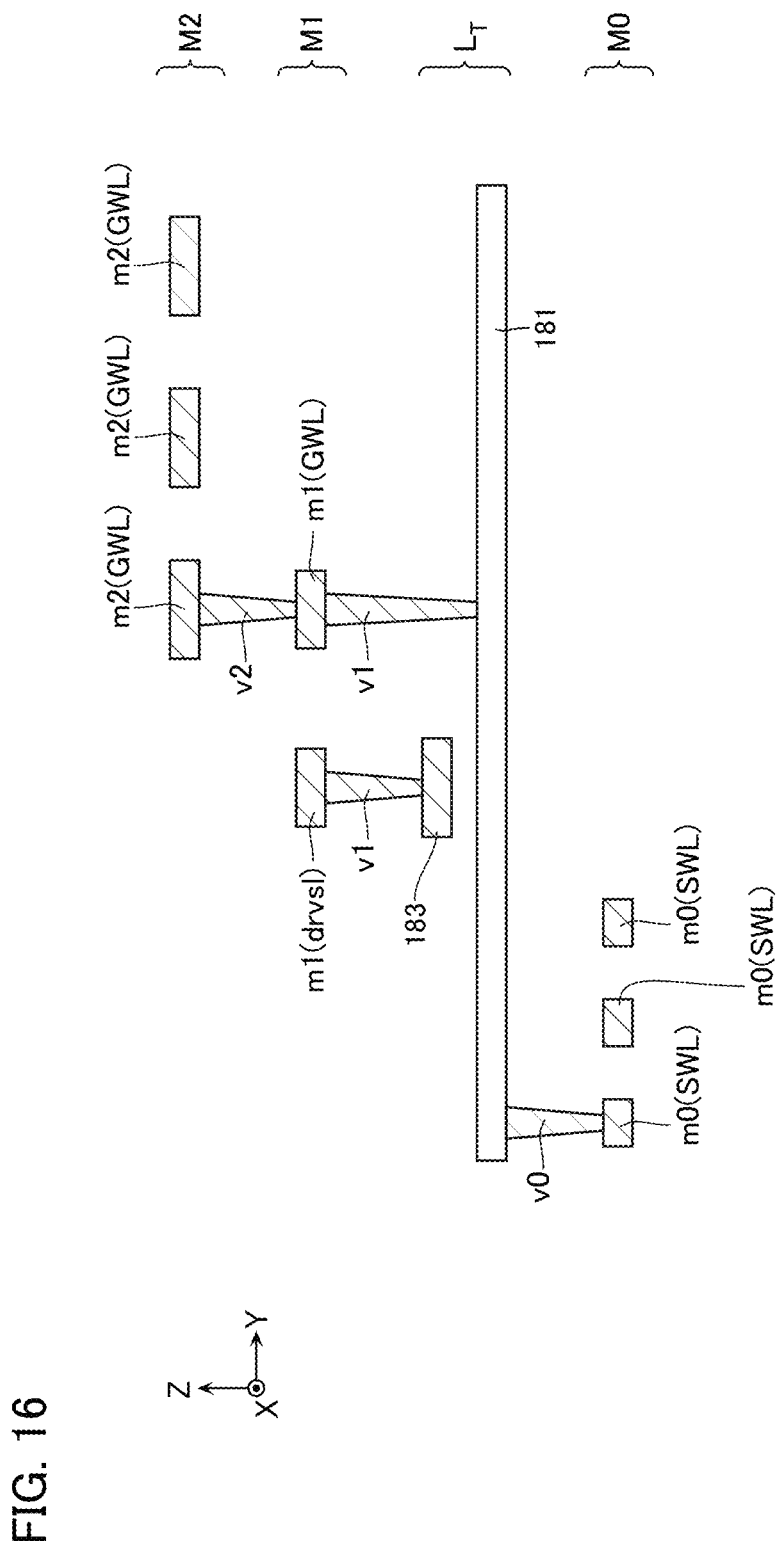
FIG. 16 is a schematic cross-sectional view illustrating the configuration of the driver circuit $DRV_{SWL}$.

FIG. 14 is a schematic plan view illustrating a configuration of the driver circuit $DRV_{SWL}$. FIG. 15 is a schematic side view illustrating the configuration of the driver circuit $DRV_{SWL}$. FIG. 16 is a schematic cross-sectional view illustrating the configuration of the driver circuit $DRV_{SWL}$. FIG. 14 and FIG. 15 are schematic diagrams and illustrate a plurality of configurations that do not appear on the same cross-sectional surface. In FIG. 14 to FIG. 16, the wiring layer M0 disposed below the transistor layer $L_T$ and wiring layers M1, M2 disposed above the transistor layer $L_T$ are exemplified.

As illustrated in FIG. 14, the circuit drvs includes a plurality of transistors $Tr_{HV}$ arranged in the X-direction. In the illustrated example, the channel direction (longitudinal direction of the semiconductor layers 181) of the plurality of transistors $Tr_{HV}$ is the Y-direction. The gate electrodes 183 of these plurality of transistors $Tr_{HV}$ are arranged in the X-direction.

In FIG. 14, a wiring m1 extending in the X-direction is exemplified. The wiring m1 functions as the wiring drvsl (FIG. 13). The wiring drvsl is connected to the plurality of gate electrodes 183 in common via a plurality of via contact electrodes v1 arranged in the X-direction.

In FIG. 14, a plurality of wirings m2 extending in the X-direction and arranged in the Y-direction are exemplified. The plurality of wirings m2 are included in the wiring layers M2 and each function as the global word line GWL. These plurality of wirings m2 are disposed on one side in the Y-direction with respect to the wiring m1 (the Y-direction positive side in the example of FIG. 14) and each include a portion that overlaps with a part of the semiconductor layer 181 when viewed from the Z-direction. For example, as exemplified in FIG. 16, these plurality of wiring m2 are each connected to the semiconductor layer 181 via a via contact electrode v2, a wiring m1, and a via contact electrode v1.

In FIG. 14, a plurality of wirings m0 extending in the X-direction and arranged in the Y-direction are exemplified. The plurality of wirings m0 each function as the sub-word line SWL. These plurality of wirings m0 are disposed on the other side in the Y-direction with respect to the wiring m1 (the Y-direction negative side in the example of FIG. 14) and each include a portion that overlaps with a part of the semiconductor layer 181 when viewed from the Z-direction. For example, as exemplified in FIG. 15, these plurality of wirings m0 are each connected to the semiconductor layer 181 via a via contact electrode v0. These plurality of wirings m0 are each connected to a plurality of via electrodes 120 arranged in the X-direction via a plurality of via contact electrodes vh arranged in the X-direction.

[Configuration of Decode Circuit $DEC_{SG}$]

Figure 17:
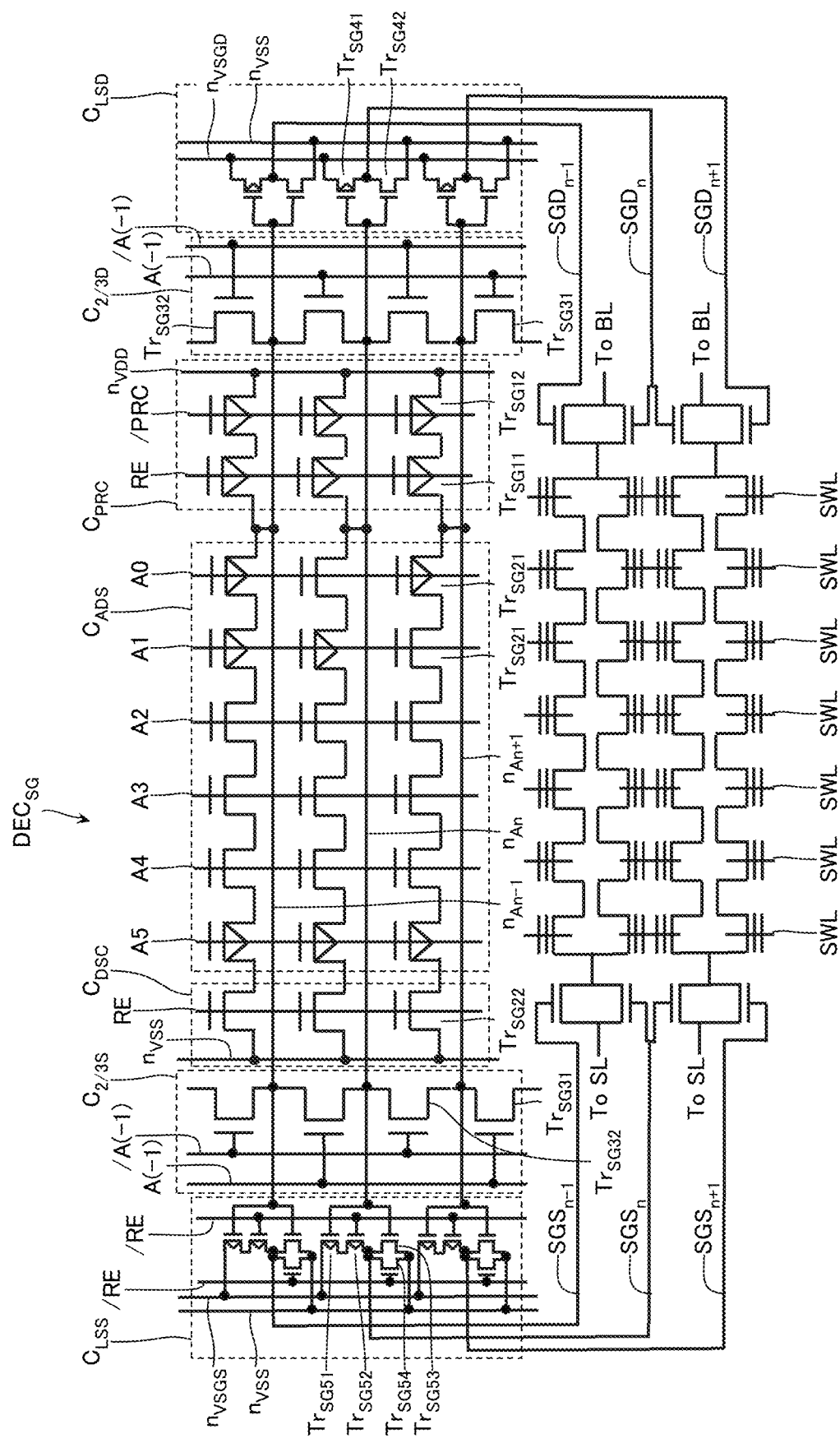
FIG. 17 is a schematic circuit diagram illustrating a configuration of a decode circuit $DEC_{SG}$.

FIG. 17 is a schematic circuit diagram illustrating a configuration of the decode circuit $DEC_{SG}$.

The decode circuit $DEC_{SG}$ includes a plurality address nodes $n_A$ corresponding to a plurality of drain-side select gate lines SGD and a plurality of source-side select gate lines SGS. In the drawing, a plurality of drain-side select gate lines $SGD_{n-1}$ to $SGD_{n+1}$, a plurality of source-side select gate lines $SGS_{n-1}$ to $SGS_{n+1}$, and a plurality of address nodes $n_{An-1}$ to $n_{An+1}$ corresponding to thereto are exemplified.

The decode circuit $DEC_{SG}$ includes a charging circuit $C_{PRC}$, a discharging circuit $C_{DSC}$, an address select circuit $C_{ADS}$, discharging circuits $C_{2/3D}$, $C_{2/3S}$, and level shifter circuits $C_{LSD}$, $C_{LSS}$. The charging circuit $C_{PRC}$ charges the address nodes $n_A$. The discharging circuit $C_{DSC}$ discharges the address nodes $n_A$. The address select circuit $C_{ADS}$ electrically conducts the address node $n_A$ selected in response to an input address signal with the discharging circuit $C_{DSC}$. The discharging circuits $C_{2/3D}$, $C_{2/3S}$ discharge electric charges of the address nodes $n_A$ next to the discharged address node $n_A$ in response to the input signal. The level shifter circuits $C_{LSD}$, $C_{LSS}$ apply a voltage to the drain-side select gate lines SGD or the source-side select gate lines SGS according to a state of the address nodes $n_A$.

The charging circuit $C_{PRC}$ includes a plurality of transistors $Tr_{SG11}$, $Tr_{SG12}$ disposed corresponding to the plurality of address nodes $n_A$. The transistors $Tr_{SG11}$, $Tr_{SG12}$ are, for example, P-channel type transistors $Tr_{LV}$ (FIG. 9). The plurality of address nodes $n_A$ are each connected to a voltage node $n_{VDD}$ via the transistors $Tr_{SG11}$, $Tr_{SG12}$ connected in series. A voltage VDD is applied to the voltage node $n_{VDD}$. The plurality of transistors $Tr_{SG11}$ have gate electrodes connected to a signal line RE in common. The plurality of transistors $Tr_{SG12}$ have gate electrodes connected to a signal line /PRC in common.

The discharging circuit $C_{DSC}$ includes a plurality of transistors $Tr_{SG22}$ disposed corresponding to the plurality of address nodes $n_A$. The transistor $Tr_{SG22}$ is, for example, an N-channel type transistor $Tr_{LV}$ (FIG. 9). The plurality of address nodes $n_A$ are each connected to a voltage node $n_{VSS}$ via the transistor $Tr_{SG22}$. A ground voltage $V_{SS}$ is applied to the voltage node $n_{VSS}$. The plurality of transistors $Tr_{SG22}$ have gate electrodes connected to a signal line RE in common.

The address select circuit $C_{ADS}$ includes a plurality of transistors $Tr_{SG21}$ disposed corresponding to the plurality of address nodes $n_A$. The transistor $Tr_{SG21}$ is, for example, an N-channel type or a P-channel type transistor $Tr_{LV}$ (FIG. 9). The plurality of address nodes $n_A$ are each connected to the voltage node $n_{VSS}$ via the plurality of (six in the example of FIG. 17) transistors $Tr_{SG21}$ connected in series. The plurality of (six in the example of FIG. 17) transistors $Tr_{SG21}$ connected between the address node $n_A$ and the voltage node $n_{VSS}$ have gate electrodes connected to a respective plurality of signal lines A0 to A5 that output an address signal. The plurality of signal lines A0 to A5 each output a plurality of (six in the example of FIG. 17) bits constituting the address signal. The address select circuit $C_{ADS}$ is configured to electrically conduct only one of the plurality of address nodes $n_A$ with the voltage node $n_{VSS}$ in response to a plurality of bits (six bits in the example of FIG. 17) of data input to the signal lines A0 to A5.

The discharging circuit $C_{2/3D}$ includes a plurality of transistors $Tr_{SG31}$, $Tr_{SG32}$ The transistors $Tr_{SG31}$, $Tr_{SG32}$ are, for example, N-channel type transistors $Tr_{LV}$ (FIG. 9). The 2a-th (a is an integer of zero or more) address node $n_A$ is, for example, connected to the 2a+1-th address node $n_A$ via the transistor $Tr_{SG31}$ The 2a+1-th address node $n_A$ is, for example, connected to the 2a+2-th address node $n_A$ via the transistor $Tr_{SG32}$. The plurality of transistors $Tr_{SG31}$ have gate electrodes connected to a signal line A(−1) in common. The plurality of transistors $Tr_{SG32}$ have gate electrodes connected to a signal line /A(−1) in common.

The discharging circuit $C_{2/3S}$ is configured similarly to the discharging circuit $C_{2/3D}$.

The level shifter circuit $C_{LSD}$ includes a plurality of inverters disposed corresponding to the plurality of drain-side select gate lines SGD. These plurality of inverters each include transistors $Tr_{SG41}$, $Tr_{SG42}$. The transistor $Tr_{SG41}$ is, for example, a P-channel type transistor $Tr_{HV}$ (FIG. 10). The transistors $Tr_{SG41}$ have source electrodes connected to a voltage node $nv_{SGD}$. A voltage of the voltage node $n_{VSGD}$ is applied to the drain-side select gate lines SGD. The transistors $Tr_{SG41}$ have drain electrodes connected to the drain-side select gate lines SGD. The transistors $Tr_{SG41}$ have gate electrodes connected to the address nodes $n_A$. The transistors $Tr_{SG42}$ have source electrodes connected to a voltage node $n_{VSS}$ The transistors $Tr_{SG42}$ have drain electrodes connected to the drain-side select gate lines SGD. The transistors $Tr_{SG42}$ have gate electrodes connected to the address nodes $n_A$.

The level shifter circuit $C_{LSS}$ includes a plurality of clocked inverters disposed corresponding to the plurality of source-side select gate lines SGS. These plurality of clocked inverters each include transistors $Tr_{SG51}$, $Tr_{SG52}$, $Tr_{SG53}$, $Tr_{SG54}$ The transistors $Tr_{SG51}$, $Tr_{SG52}$ are, for example, P-channel type transistors $Tr_{HV}$ (FIG. 10). The transistors $Tr_{SG51}$, $Tr_{SG52}$ are connected in series between a voltage node $n_{VSGS}$ and the source-side select gate lines SGS. A voltage of the voltage node $n_{VSGS}$ is applied to the source-side select gate lines SGS. The transistors $Tr_{SG51}$ have gate electrodes connected to the address nodes $n_A$. The transistors $Tr_{SG52}$ have gate electrodes connected to a signal line /RE. The transistors $Tr_{SG53}$ r $Tr_{SG54}$ are, for example, N-channel type transistors $Tr_{HV}$ (FIG. 10). The transistors $Tr_{SG53}$, $Tr_{SG54}$ are connected in parallel between a voltage node $n_{VSS}$ and the source-side select gate lines SGS. The transistors $Tr_{SG53}$ have gate electrodes connected to the address nodes $n_A$. The transistors $Tr_{SG54}$ have gate electrodes connected to a signal line/RE.

[Read Operation]

Figure 18:
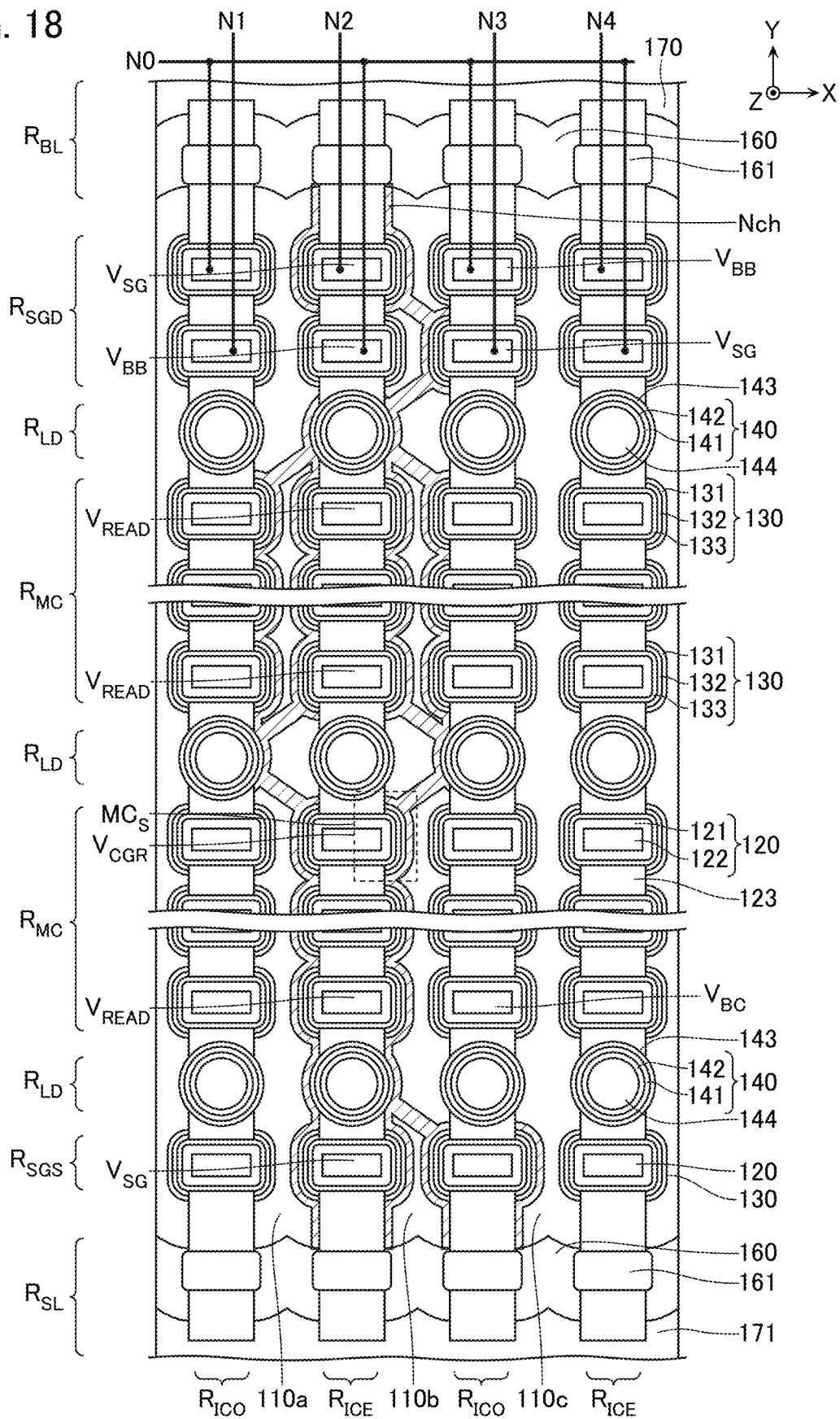
FIG. 18 is a schematic plan view for describing a read operation of the semiconductor memory device.
Figure 19:
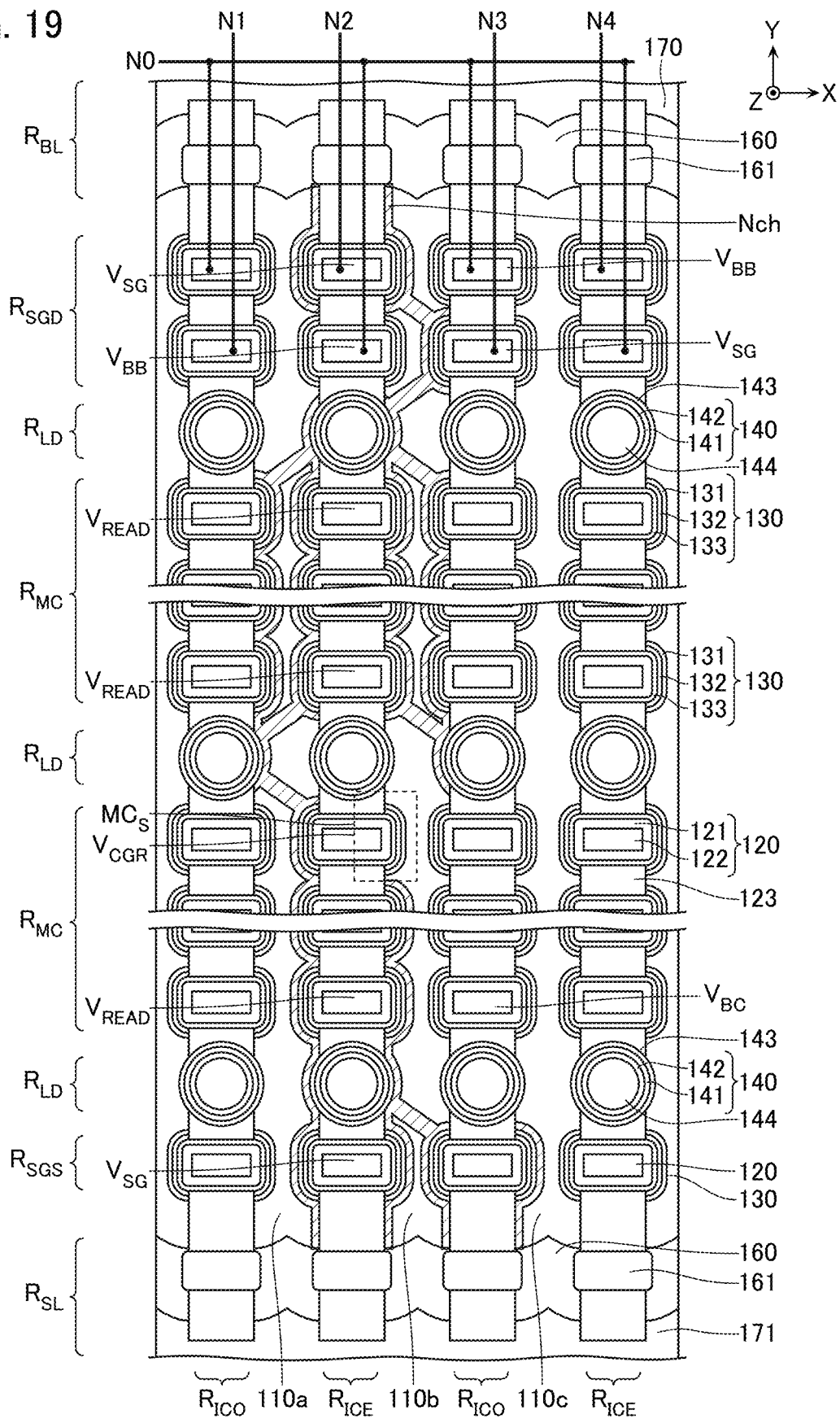
FIG. 19 is a schematic plan view for describing the read operation.

FIG. 18 and FIG. 19 are schematic plan views for describing the read operation of the semiconductor memory device according to the first embodiment. In FIG. 18 and FIG. 19, three semiconductor layers 110 arranged in the X-direction are indicated as respective semiconductor layers 110a, 110b, 110c. In FIG. 18 and FIG. 19, an example in which one of a plurality of memory cells MC disposed on one side in the X-direction of the semiconductor layer 110b is a selected memory cell $MC_S$ is illustrated.

In the read operation, in the select transistor region $R_{SGD}$, a voltage $V_{SG}$ is applied to two nodes (nodes N2, N3 in the illustrated example) corresponding to the semiconductor layer 110b among the nodes N1 to N4, and a blocking voltage $V_{BB}$ is applied to the other nodes (nodes N0, N1, N4 in the illustrated example). The blocking voltage $V_{BB}$ has a magnitude to the extent in which the select transistors (STD, STS) enter the OFF state. In association with this, an electron channel is formed at the proximity of the via electrode 120 connected to the node N2 in the semiconductor layer 110b. Additionally, an electron channel is formed at the proximity of the via electrode 120 connected to the node N3 in the semiconductor layer 110b. Accordingly, a voltage of the conductive layer 170 is transferred to the ladder region $R_{LD}$. With such a method, in the semiconductor layer 110b, the voltage of the conductive layer 170 can be preferably transferred, and in the semiconductor layers 110a, 110c, transfer of the voltage of the conductive layer 170 can be preferably blocked.

In the read operation, in the select transistor region $R_{SGS}$, the voltage $V_{SG}$ is applied to two via electrodes 120 disposed on one side and at the other side in the X-direction with respect to the semiconductor layer 110b. In association with this, an electron channel is formed at the proximity of these two via electrode 120 in the semiconductor layers 110a, 110b, 110c, and the voltages of the conductive layer 171 is transferred to the ladder region $R_{LD}$.

In the read operation, a read pass voltage VREAD is applied to a plurality of via electrodes 120 disposed in the memory cell regions $R_{MC}$ that do not include the selected memory cell $MC_S$ and the via electrodes 140. The read pass voltage VREAD has a magnitude to the extent in which the memory cells MC enter the ON state regardless of data stored in the memory cells MC. Accordingly, in the semiconductor layer 110b, the voltages of the conductive layers 170, 171 are transferred to the memory cell region $R_{MC}$ that includes the selected memory cell $MC_S$. In the semiconductor layers 110a, 110c, the voltage of the conductive layer 171 is also transferred to the memory cell region $R_{MC}$ that includes the selected memory cell $MC_S$ in some cases.

In the read operation, the read pass voltage VREAD is applied to the via electrode 120 disposed on one side in the X-direction with respect to the semiconductor layer 110b (the same side as the selected memory cell $MC_S$) among the plurality of via electrodes 120 disposed in the memory cell region $R_{MC}$ that includes the selected memory cell $MC_S$. Accordingly, the voltage of the conductive layer 170 is transferred to a drain region of the selected memory cell $MC_S$. The voltage of the conductive layer 171 is transferred to a source region of the selected memory cell $MC_S$.

In the read operation, a read voltage $V_{CGR}$ is applied to the via electrode 120 that functions as a gate electrode of the selected memory cell $MC_S$. The read voltage $V_{CGR}$ has a magnitude to the extent in which the memory cells MC enter the ON state or the OFF state according to the data stored in the memory cells MC. For example, when a threshold voltage of the selected memory cell $MC_S$ is smaller than the read voltage $V_{CGR}$, as illustrated in FIG. 18, an electron channel Nch is formed in a channel region of the selected memory cell $MC_S$. In association with this, the conductive layers 170, 171 are electrically conducted with one another, and a current flows to the conductive layer 170. On the other hand, when the threshold voltage of the selected memory cell $MC_S$ is greater than the read voltage $V_{CGR}$, as illustrated in FIG. 19, the electron channel Nch is not formed in the channel region of the selected memory cell $MC_S$. Therefore, the conductive layers 170, 171 are not electrically conducted with one another, and a current does not flow to the conductive layer 170. Therefore, by measuring the current of the conductive layer 170, the data stored in the selected memory cell $MC_S$ can be distinguished.

In the read operation, a back surface cell blocking voltage $V_{BC}$ is applied to the via electrode 120 disposed on the other side in the X-direction with respect to the semiconductor layer 110b (the opposite side to the selected memory cell $MC_S$) among the plurality of via electrodes 120 disposed in the memory cell region $R_{MC}$ in common with the selected memory cell $MC_S$. The back surface cell blocking voltage $V_{BC}$ has a magnitude to the extent in which the memory cells MC enter the OFF state regardless of the data stored in the memory cells MC. Accordingly, occurrence of a leakage current via the memory cell MC disposed on the other side in the X-direction can be reduced.

Figure 20:
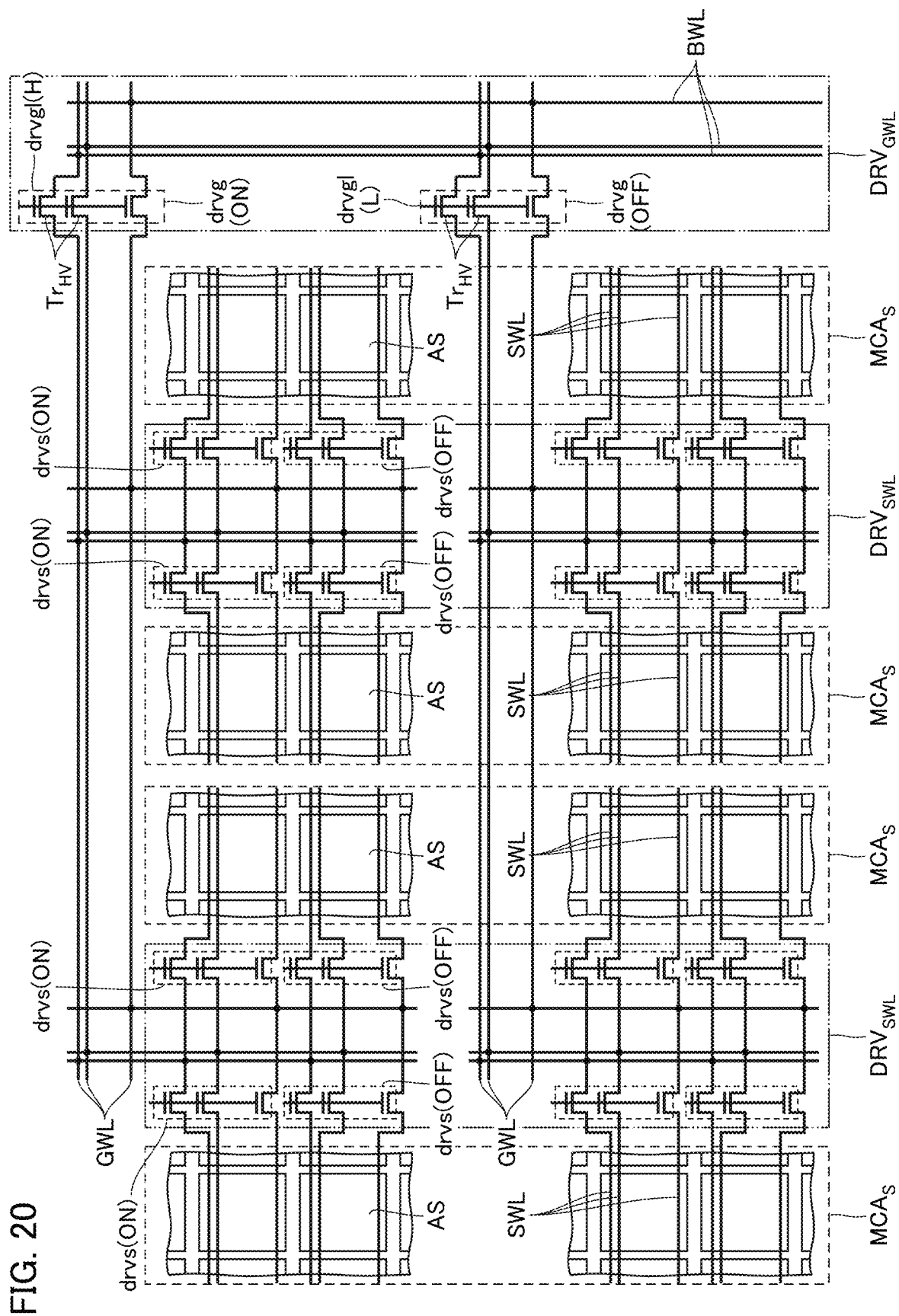
FIG. 20 is a schematic circuit diagram for describing the read operation.

FIG. 20 is a schematic circuit diagram for describing the read operation of the semiconductor memory device according to the first embodiment.

In the read operation, for example, one wiring drvgl corresponding to the memory block BLK or the sub-block $BLK_S$ that is a target of the read operation may be set to an "H" state, and the other wirings drvgl may be set to an "L" state. Accordingly, the transistors $Tr_{HV}$ included in one circuit drvg corresponding to the memory block BLK or the sub-block $BLK_S$ that is the target of the read operation may be set to the ON state, and the transistors $Tr_{HV}$ included in the other circuits drvg may be set to the OFF state.

Further, the wirings drvsl corresponding to the memory block BLK that is a target of the read operation may be set to the "H" state, and the other wirings drvsl may be set to the "L" state. Accordingly, the transistors $Tr_{HV}$ included in the plurality of (four in the illustrated example) circuits drvs corresponding to the memory block BLK that is the target of the read operation may be set to the ON state, and the transistors $Tr_{HV}$ included in the other circuits drvs may be set to the OFF state.

Figure 21:
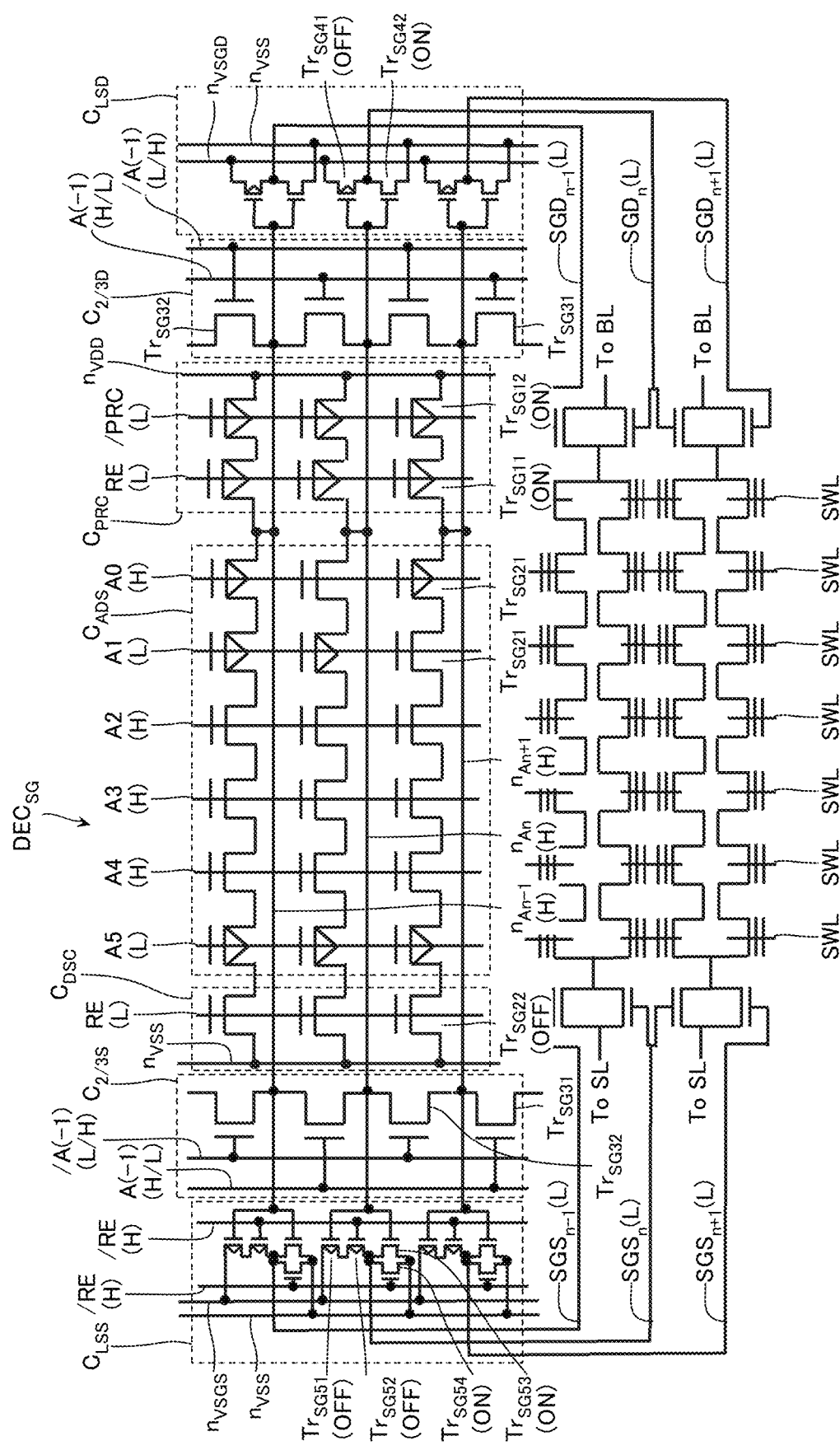
FIG. 21 is a schematic circuit diagram for describing the read operation.
Figure 22:
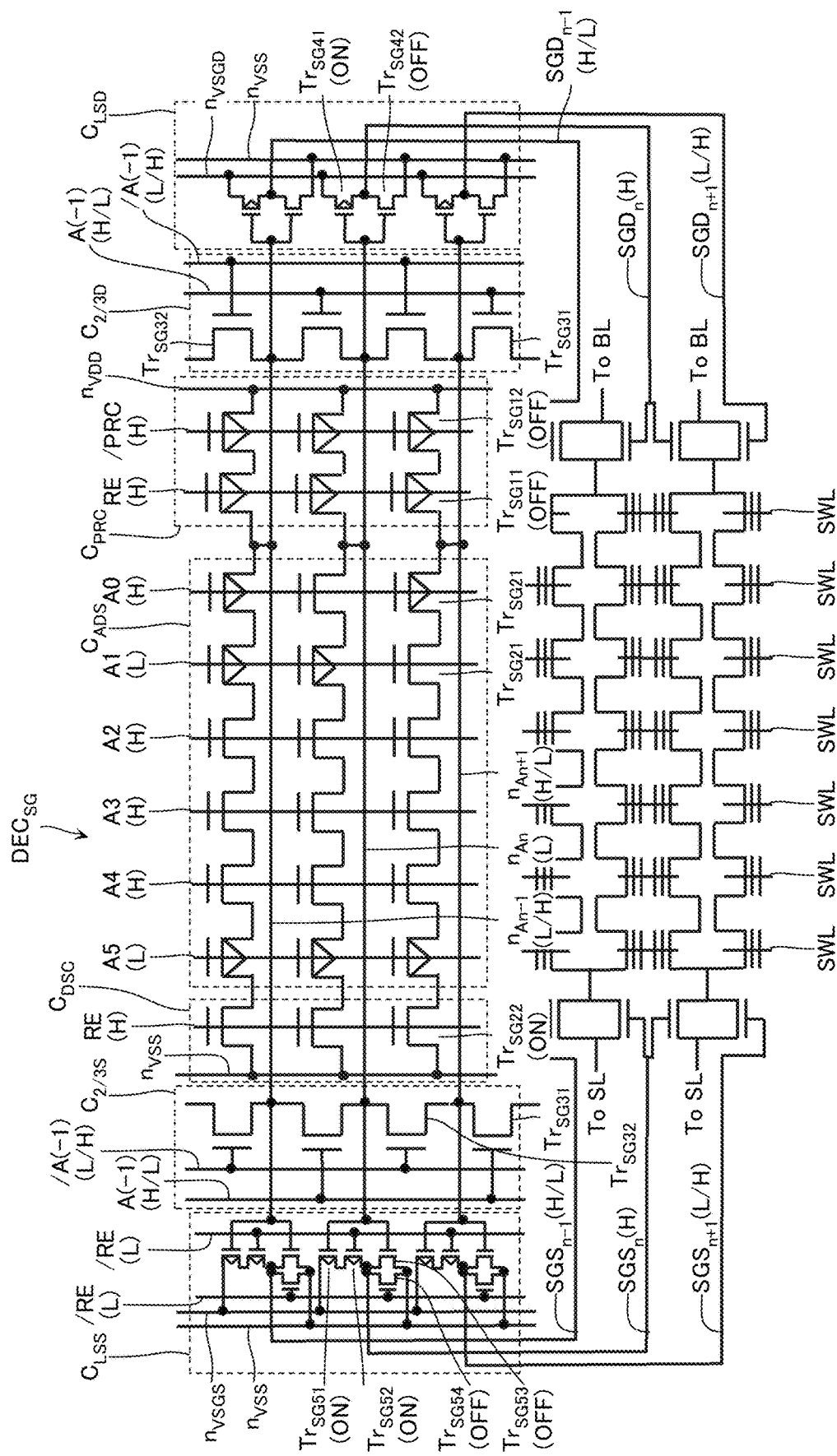
FIG. 22 is a schematic circuit diagram for describing the read operation.

Further, the wirings drvsl corresponding to only a part of the plurality of sub-blocks BLK constituting the memory block BLK may be set to the "H" state, and the other wirings drvsl may be set to the "L" state. Accordingly, only the transistors $Tr_{HV}$ included in the circuits drvs corresponding to a part of (one to three in the illustrated example) sub-blocks BLK may be set to the ON state, and the transistors $Tr_{HV}$ included in the other circuits drvs may be set to the OFF state. With such a method, a wiring capacitance of the global word lines GWL can be reduced, and speed-up of the read operation can be ensured. FIG. 21 and FIG. 22 are schematic circuit diagrams for describing the read operation of the semiconductor memory device according to the first embodiment.

As described with reference to FIG. 18 and FIG. 19, in the read operation of the semiconductor memory device according to the first embodiment, the voltage $V_{SG}$ is applied to two nodes (nodes N2, N3 in the illustrated example) corresponding to the semiconductor layer 110b among the nodes N1 to N4, and the blocking voltage $V_{BB}$ is applied to the other nodes (nodes N0, N1, N4 in the illustrated example). The decode circuit $DEC_{SG}$ of FIG. 17 is configured to be able to execute such a selection operation. In the following, this point will be described.

In the read operation, for example, as illustrated in FIG. 21, the signal lines RE are set to the "L" state, the signal lines /RE are set to the "H" state, the signal line /PRC is set to the "L" state, and predetermined address data ("H, L, H, H, H, L" in the example of FIG. 22) is input to the signal lines A0 to A5.

In this state, the transistors $Tr_{SG11}$, $Tr_{SG12}$ in the charging circuit $C_{PRC}$ enter the ON state. Accordingly, all of the address nodes $n_A$ are charged and enter the "H" state. Further, accordingly, the ground voltage $V_{SS}$ is applied from the level shifter circuit $C_{LSD}$ to all of the drain-side select gate lines SGD, and all of the drain-side select gate lines SGD enter the "L" state. The ground voltage $V_{SS}$ is applied from the level shifter circuit $C_{LSS}$ to all of the source-side select gate lines SGS, and all of the source-side select gate lines SGS enter the "L" state.

Next, for example, as illustrated in FIG. 22, the signal lines RE are set to the "H" state, the signal lines /RE are set to the "L" state, and the signal line /PRC is set to the "H" state. In this phase, the blocking voltage $V_{BB}$ may be applied to the voltage nodes $n_{VSS}$.

In association with this, all of the address nodes $n_A$ are electrically disconnected from the voltage node $n_{VDD}$. The plurality of (six in the illustrated example) transistors $Tr_{SG21}$ corresponding to one address node $n_A$ (address node $n_{An}$ in the illustrated example) corresponding to the address data among the plurality of address nodes $n_A$ enter the ON state. In association with this, the address node $n_{An}$ is electrically conducted with the voltage nodes $n_{VSS}$, and the address node $n_{An}$ enters the "L" state. In association with this, the drain-side select gate line $SGD_n$ is electrically conducted with the voltage node $n_{VSGD}$, and the drain-side select gate line $SGD_n$ enters the "H" state. The source-side select gate line $SGS_n$ is electrically conducted with the voltage node $n_{VSGS}$, and the source-side select gate line $SGS_n$ enters the "H" state.

For example, when the signal lines A(-1) are in the "H" state and the signal lines /A(-1) are in the "L" state, the transistors $Tr_{SG31}$ enter the ON state. In association with this, the address node $n_{An}+1$ is electrically conducted with the voltage node $n_{VSS}$ via the address node $n_A$, and the address node $n_{An}+1$ also enters the "L" state. In association with this, the drain-side select gate line $SGD_{n+1}$ is electrically conducted with the voltage node $n_{VSGD}$, and the drain-side select gate line $SGD_{n+1}$ enters the "H" state. The source-side select gate line $SGS_{n+1}$ is electrically conducted with the voltage node $n_{VSGS}$, and the source-side select gate line $SGS_{n+1}$ enters the "H" state.

For example, when the signal lines A(-1) are in the "L" state and the signal lines /A(-1) are in the "H" state, the transistors $Tr_{SG32}$ enter the ON state. In association with this, the address node $n_{An-1}$ is electrically conducted with the voltage node $n_{VSS}$ via the address node $n_A$, and the address node $n_{An-1}$ also enters the "L" state. In association with this, the drain-side select gate line $SGD_{n-1}$ is electrically conducted with the voltage node $n_{VSGD}$, and the drain-side select gate line $SGD_{n-1}$ enters the "H" state. The source-side select gate line $SGS_{n-1}$ is electrically conducted with the voltage node $n_{VSGS}$, and the source-side select gate line $SGS_{n-1}$ enters the "H" state.

[Write Operation]

Figure 23:
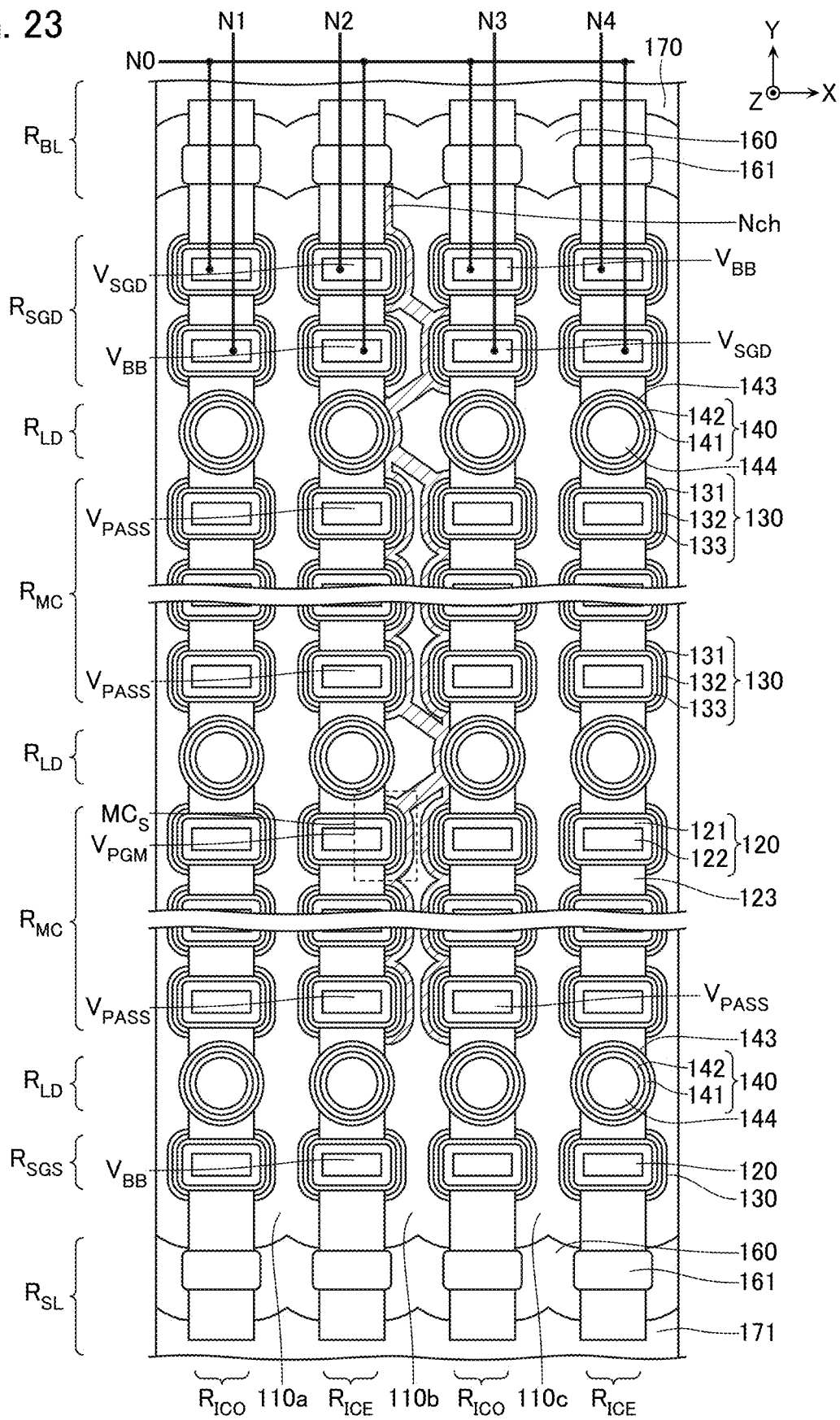
FIG. 23 is a schematic plan view for describing a write operation of the semiconductor memory device according to the first embodiment.

FIG. 23 is a schematic plan view for describing the write operation of the semiconductor memory device according to the first embodiment. In FIG. 23, three semiconductor layers 110 arranged in the X-direction are indicated as respective semiconductor layers 110a, 110b, 110c. In FIG. 23, an example in which one of the plurality of memory cells MC disposed on one side in the X-direction of the semiconductor layer 110b is a selected memory cell $MC_S$ is illustrated.

In the write operation, for example, a voltage $V_{SRC}$ is applied to the bit line BL connected to the selected memory cell $MC_S$ that performs an adjustment of a threshold voltage among a plurality of selected memory cells $MC_S$. The voltage VDD is applied to the bit line BL connected to the selected memory cell $MC_S$ that does not perform an adjustment of the threshold voltage among the plurality of selected memory cells $MC_S$. Hereinafter, the selected memory cell $MC_S$ that performs an adjustment of the threshold voltage among the plurality of selected memory cells $MC_S$ may be referred to as a "write memory cell MC" and the selected memory cell $MC_S$ that does not perform an adjustment of the threshold voltage may be referred to as an "inhibited memory cell MC".

In the write operation, in the select transistor region $R_{SGD}$, a voltage $V_{SGD}$ is applied to two nodes (nodes N2, N3 in the illustrated example) corresponding to the semiconductor layer 110b among the nodes N1 to N4, and the blocking voltage $V_{BB}$ is applied to the other nodes (nodes N0, N1, N4 in the illustrated example). The voltage $V_{SGD}$ is greater than the voltage $V_{SRC}$.

Here, a voltage difference between the voltage $V_{SGD}$ and the voltage $V_{SRC}$ is greater than a threshold voltage when the drain-side select transistor STD is made to function as an NMOS transistor. Therefore, an electron channel is formed in a channel region of the drain-side select transistor STD connected to the write memory cell MC, and the voltage $V_{SRC}$ is transferred to the channel region of the drain-side select transistor STD.

On the other hand, a voltage difference between the voltage $V_{SGD}$ and the voltage VDD is smaller than the threshold voltage when the drain-side select transistor STD is made to function as an NMOS transistor. Therefore, the drain-side select transistor STD connected to the inhibited memory cell MC enters the OFF state.

In the write operation, in the select transistor region $R_{SGS}$, the blocking voltage $V_{BB}$ is applied to two via electrodes 120 disposed on one side and at the other side in the X-direction with respect to the semiconductor layer 110b. Accordingly, the source-side select transistor STS enters the OFF state.

In the write operation, a write pass voltage $V_{PASS}$ is applied to a plurality of via electrodes 120 and the via electrodes 140. The write pass voltage $V_{PASS}$ has a magnitude to the extent in which the memory cells MC enter the ON state regardless of the data stored in the memory cells MC. The write pass voltage $V_{PASS}$ is greater than the read pass voltage VREAD. Accordingly, in the semiconductor layer 110b, the voltage of the conductive layer 170 is transferred to the drain region of the selected memory cell $MC_S$.

In the write operation, a program voltage $V_{PGM}$ is applied to the via electrode 120 that functions as a gate electrode of the selected memory cell $MC_S$. The program voltage $V_{PGM}$ is greater than the write pass voltage $V_{PASS}$. Here, the voltage $V_{SRC}$ is applied to a channel of the semiconductor layer 110b corresponding to the write memory cell MC. Between the semiconductor layer 110b and a selected word line WLs, a relatively large electric field is generated. Accordingly, the electrons in the channel of the semiconductor layer 110b tunnel into the electric charge accumulating layers 132 via the tunnel insulating layers 131. Accordingly, the threshold voltage of the write memory cell MC increases.

On the other hand, a channel of the semiconductor layer 110b corresponding to the inhibited memory cell MC is in an electrically floating state. A voltage of this channel has increased to the extent of the write pass voltage $V_{PASS}$ by capacitive coupling with an unselected word line WL. Between the semiconductor layer 110b and the selected word line WLs, only an electric field smaller than the above-described electric field is generated. Therefore, the electrons in the channel of the semiconductor layer 110b do not tunnel into the electric charge accumulating layers 132. Therefore, the threshold voltage of the inhibited memory cell MC does not increase.

In the write operation of the semiconductor memory device according to the first embodiment, similarly to the read operation, selection of the memory block BLK or the sub-block BLK is performed by the method as describe with reference to FIG. 20.

Figure 24:
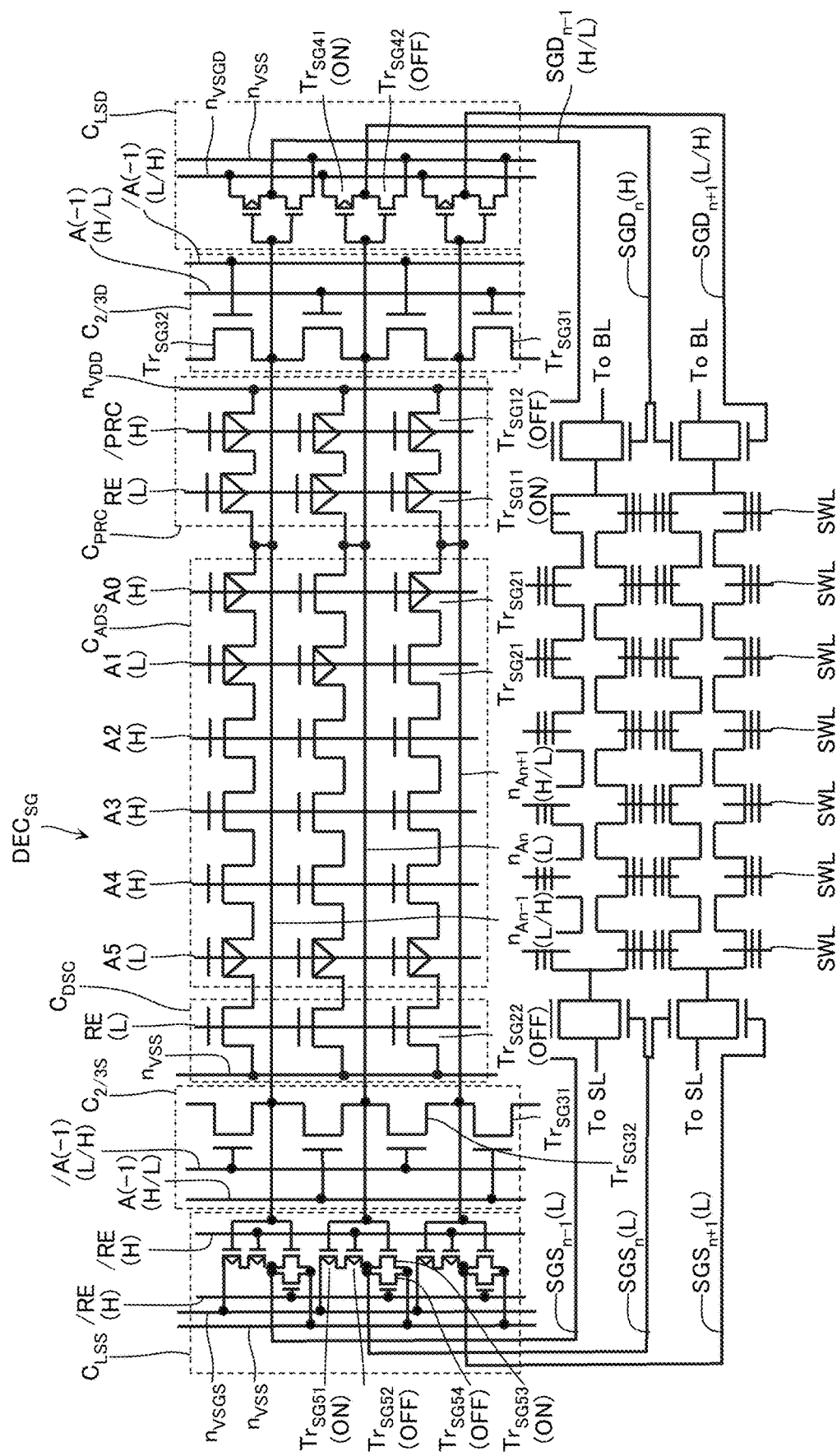
FIG. 24 is a schematic circuit diagram for describing the write operation of the semiconductor memory device according to the first embodiment.

FIG. 24 is a schematic circuit diagram for describing the write operation of the semiconductor memory device according to the first embodiment.

In the write operation of the semiconductor memory device according to the first embodiment, similarly to the read operation, voltages are applied to the drain-side select gate lines SGD and the source-side select gate lines SGS by the method as describe with reference to FIG. 21 and FIG. 22.

In the write operation of the semiconductor memory device according to the first embodiment, after the operation described with reference to FIG. 22 is performed, as illustrated in FIG. 24, the signal lines RE are set to the "L" state and the signal lines /RE are set to the "H" state.

In this state, the transistors $Tr_{SG11}$ in the charging circuit $C_{PRC}$ enter the ON state. However, the transistors $Tr_{SG12}$ are maintained in the OFF state. Therefore, the voltages of the address nodes $n_A$ are maintained in the state described with reference to FIG. 22.

In this state, the transistors $Tr_{SG22}$ in the discharging circuit $C_{DSC}$ enter the OFF state.

In this state, all of the transistors $Tr_{SG52}$ in the level shifter circuit $C_{LSS}$ enter the OFF state, and all of the transistors $Tr_{SG54}$ in the level shifter circuit $C_{LSS}$ enter the ON state. Accordingly, the ground voltage $V_{SS}$ is applied to all of the source-side select gate lines SGS, and all of the source-side select gate lines SGS enter the "L" state.

[Erase Operation]

Figure 25:
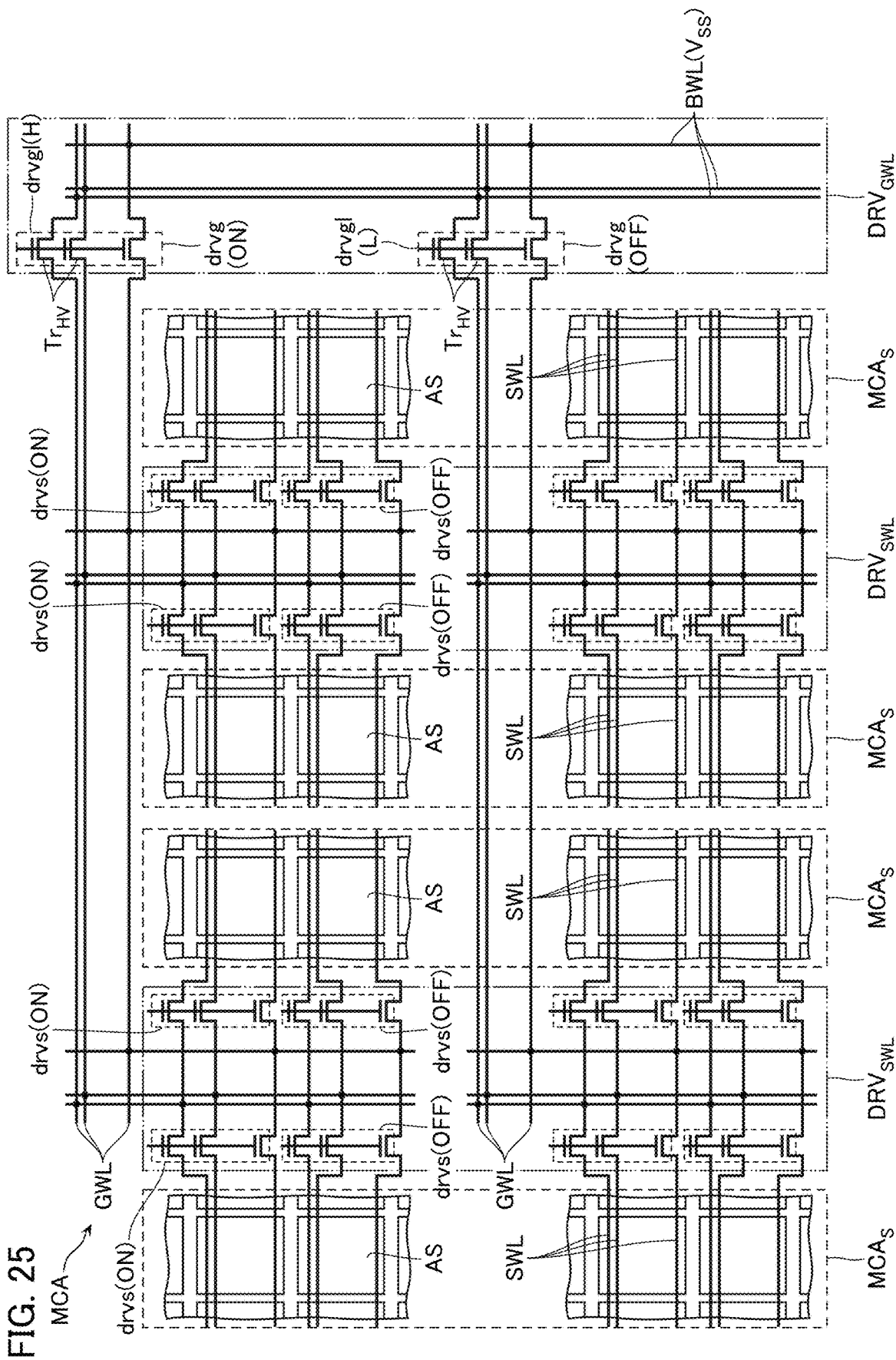
FIG. 25 is a schematic circuit diagram for describing an erase operation of the semiconductor memory device according to the first embodiment.
Figure 26:
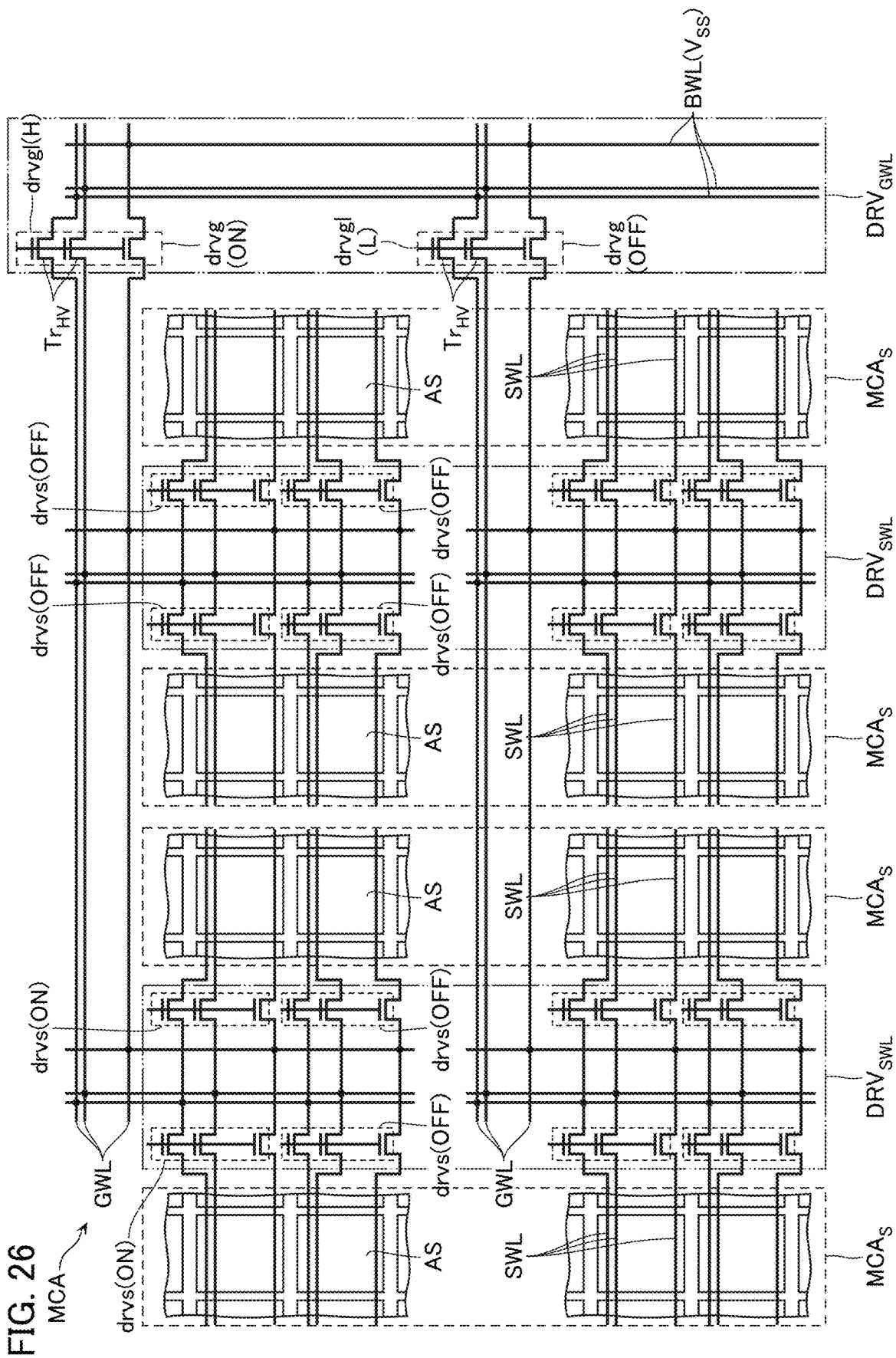
FIG. 26 is a schematic circuit diagram for describing the erase operation of the semiconductor memory device according to the first embodiment.

FIG. 25 and FIG. 26 are schematic circuit diagrams for describing the erase operation of the semiconductor memory device according to the first embodiment.

As illustrated in FIG. 25, in the erase operation, the ground voltage $V_{SS}$ may be applied to the bus wirings BWL.

In the erase operation, for example, one wiring drvgl corresponding to the memory block BLK or the sub-block $BLK_S$ that is a target of the erase operation may be set to the "H" state, and the other wirings drvgl may be set to the "L" state. Accordingly, the transistors $Tr_{HV}$ included in one circuit drvg corresponding to the memory block BLK or the sub-block $BLK_S$ that is the target of the erase operation may be set to the ON state, and the transistors $Tr_{HV}$ included in the other circuits drvg may be set to the OFF state.

Further, the wirings drvsl corresponding to the memory block BLK that is a target of the erase operation may be set to the "H" state, and the other wirings drvsl may be set to the "L" state. Accordingly, the transistors $Tr_{HV}$ included in the plurality of (four in the illustrated example) circuits drvs corresponding to the memory block BLK that is the target of the erase operation may be set to the ON state, and the transistors $Tr_{HV}$ included in the other circuits drvs may be set to the OFF state.

As illustrated in FIG. 26, the wirings drvsl corresponding to only a part of the plurality of sub-blocks $BLK_S$ constituting the memory block BLK may be set to the "H" state, and the other wirings drvsl may be set to the "L" state. Accordingly, only the transistors $Tr_{HV}$ included in the circuits drvs corresponding to a part of (one to three in the illustrated example) sub-blocks $BLK_S$ may be set to the ON state, and the transistors $Tr_{HV}$ included in the other circuits drvs may be set to the OFF state. With such a method, the target of the erase operation can be relatively easily adjusted.

[Effect]

As described with reference to FIG. 12 and the like, the semiconductor memory device according to the first embodiment includes the plurality of sub-arrays $MCA_S$, the plural sets of sub-word lines SWL disposed corresponding to these plurality of sub-arrays $MCA_S$, the plurality of circuits drvs connected to these plural sets of sub-word lines SWL, and the pair of global word lines GWL connected to these plurality of circuits drvs With such a configuration, for example, as described with reference to FIG. 20, the wiring capacitance of the global word lines GWL can be reduced to ensure speed-up of the read operation and the write operation by turning ON the transistors $Tr_{HV}$ included in any of the plurality of circuits drvs and by turning OFF the transistors $Tr_{HV}$ included in the other circuits drvs in the read operation, the write operation, and the like.

As described with reference to FIG. 26, the target of the erase operation can be relatively easily adjusted by turning ON the transistors $Tr_{HV}$ included in any of the plurality of circuits drvs and by turning OFF the transistors $Tr_{HV}$ included in the other circuits drvs in the erase operation.

As described with reference to FIG. 12, in the first embodiment, the global word lines GWL are electrically connected to the plurality of sub-blocks $BLK_S$ arranged in the Y-direction.

In such a configuration, since it is only necessary to provide only a pair of global word lines GWL for a plurality of memory blocks BLK, wiring width of the global word lines GWL can be increased. Accordingly, reduction in resistance of the global word lines GWL can be ensured, and speed-up of the read operation can be ensured.

As described with reference to FIG. 17, the decode circuit $DEC_{SG}$ according to the first embodiment includes the plurality of address nodes $n_{An-1}$ to $n_{An+1}$ corresponding to the plurality of drain-side select gate lines $SGD_{n+1}$ to $SGD_{n+1}$ and the plurality of source-side select gate lines $SGS_{n-1}$ to $SGS_n+1$.

The decode circuit $DEC_{SG}$ includes the charging circuit $C_{PRC}$, the discharging circuit $C_{DSC}$, the address select circuit $C_{ADS}$, the discharging circuits $C_{2/3D}$, $C_{2/3S}$, and the level shifter circuits $C_{LSD}$, $C_{LSS}$. The charging circuit $C_{PRC}$ charges the address nodes $n_A$. The discharging circuit $C_{DSC}$ discharges the address nodes $n_A$. The address select circuit $C_{ADS}$ electrically conducts the address node $n_A$ selected in response to an input address signal with the discharging circuit C. The discharging circuits $C_{2/3D}$, $C_{2/3S}$ discharge electric charges of the address nodes $n_A$ next to the discharged address node $n_A$ in response to the input signal. The level shifter circuits $C_{LSD}$, $C_{LSS}$ apply a voltage to the drain-side select gate lines SGD or the source-side select gate lines SGS according to a state of the address nodes $n_A$.

Such a configuration can be achieved in a smaller area compared with, for example, a multi-input NAND circuit in which one NMOS transistor and one PMOS transistor are used per address bit. With such a configuration, for example, as illustrated in FIG. 18 and FIG. 19, the two nodes N2, N3 can be preferably selected.

Second Embodiment

Next, a semiconductor memory device according to a second embodiment will be described. In the following description, similar reference numerals are attached to parts similar to those of the semiconductor memory device according to the first embodiment, and their descriptions are omitted.

The semiconductor memory device according to the second embodiment is basically configured similarly to the semiconductor memory device according to the first embodiment.

As described with reference to FIG. 12, the memory cell array MCA is divided into the plurality of (two in the illustrated example) regions in the Y-direction. In the respective plurality of regions, the plurality of memory blocks BLK are included.

Here, in the semiconductor memory device according to the first embodiment, the page PG or the sub-page $PG_S$ can be an execution unit of the read operation and the write operation. In the semiconductor memory device according to the first embodiment, the memory block BLK or the sub-block $BLK_S$ can be an execution unit of the erase operation.

On the other hand, the semiconductor memory device according to the second embodiment can execute the read operation, the write operation, and the erase operation across the plurality of regions divided in the Y-direction.

For example, with respect to the sub-page $PG_S$ included in one of the plurality of regions divided in the Y-direction and the sub-page $PG_S$ included in another of the plurality of regions divided in the Y-direction, the read operation and the write operation can be collectively executed.

Similarly, with respect to the sub-block $BLK_S$ included in one of the plurality of regions divided in the Y-direction and the sub-block $BLK_S$ included in another of the plurality of regions divided in the Y-direction, the erase operation can be collectively executed.

Figure 27:
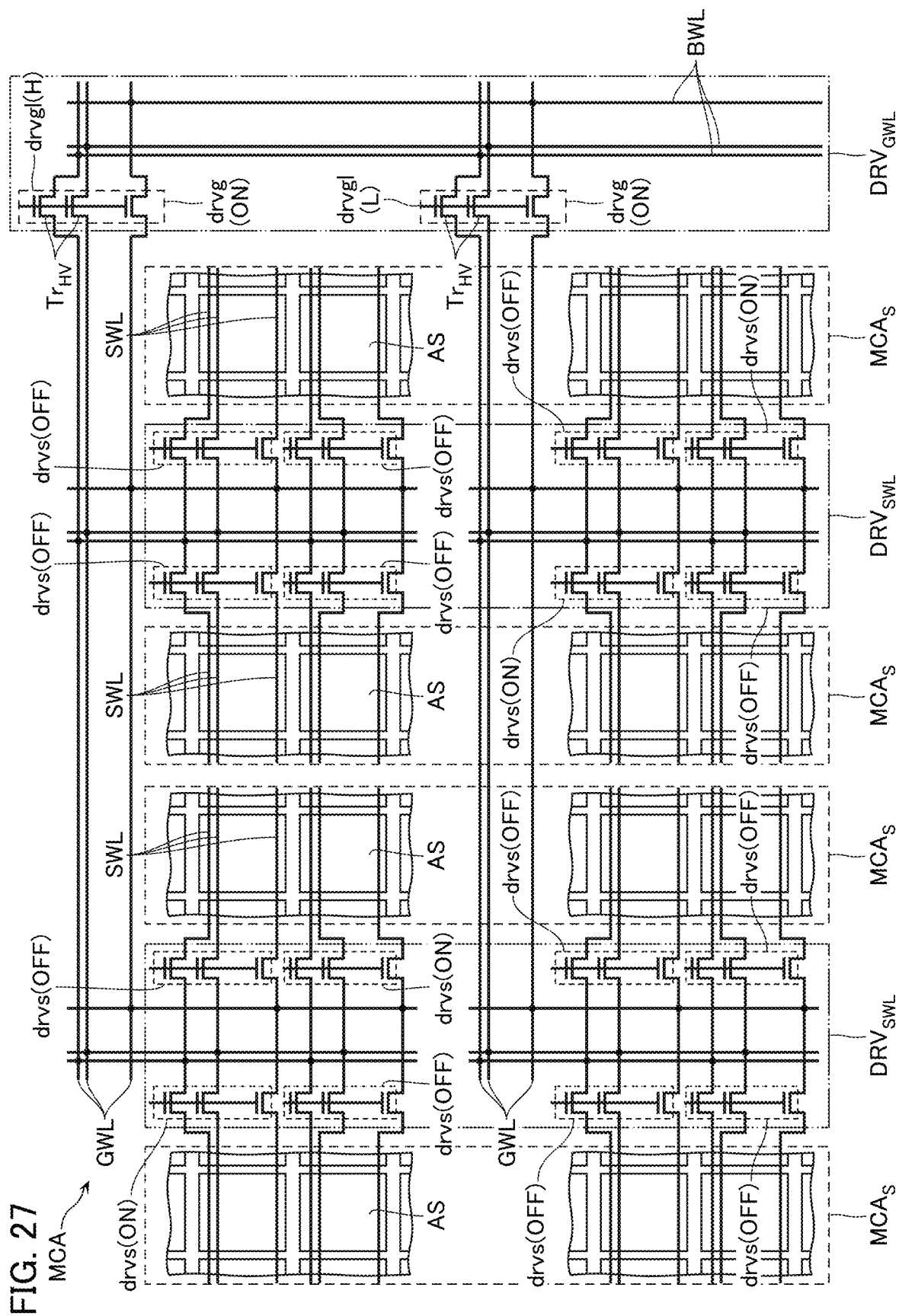
FIG. 27 is a schematic circuit diagram for describing a read operation of a semiconductor memory device according to a second embodiment.

FIG. 27 is a schematic circuit diagram for describing the read operation of the semiconductor memory device according to the second embodiment.

As described with reference to FIG. 20, in the read operation according to the first embodiment, for example, only one wiring drvgl corresponding to the memory block BLK that is a target of the read operation is set to the "H" state, and the other wirings drvgl are set to the "L" state.

On the other hand, as illustrated in FIG. 27, in the read operation according to the second embodiment, two or more wirings drvgl are set to the "H" state, and the other wirings drvgl are set to the "L" state. Accordingly, the transistors $Tr_{HV}$ included in two or more circuits drvg are set to the ON state, and the transistors $Tr_{HV}$ included in the other circuits drvg are set to the OFF state.

Further, a plurality of wirings drvsl corresponding to the plurality of sub-blocks $BLK_S$ that are targets of the read operation are set to the "H" state, and the other wirings drvsl are set to the "L" state. Accordingly, the transistors $Tr_{HV}$ included in a plurality of (four in the illustrated example) circuits drvs corresponding to the plurality of sub-blocks $BLK_S$ that are the targets of the read operation are set to the ON state, and the transistors $Tr_{HV}$ included in the other circuits drvs are set to the OFF state.

In such a method, as exemplified in FIG. 27, the sub-word lines SWL connected to a part of the sub-blocks $BLK_S$ and the sub-word lines SWL connected to the other sub-blocks $BLK_S$ are electrically conducted with the bus wirings BWL via different global word lines GWL. With such a method, a wiring capacitance of the global word lines GWL can be reduced to ensure speed-up of the read operation.

Third Embodiment

Next, a semiconductor memory device according to a third embodiment will be described. In the following description, similar reference numerals are attached to parts similar to those of the semiconductor memory device according to the first embodiment, and their descriptions are omitted.

The semiconductor memory device according to the third embodiment is basically configured similarly to the semiconductor memory device according to the first embodiment or the second embodiment. However, the semiconductor memory device according to the third embodiment includes a decode circuit $DEC_{SG}'$ different from that in the semiconductor memory device according to the first embodiment or the second embodiment.

Figure 28:
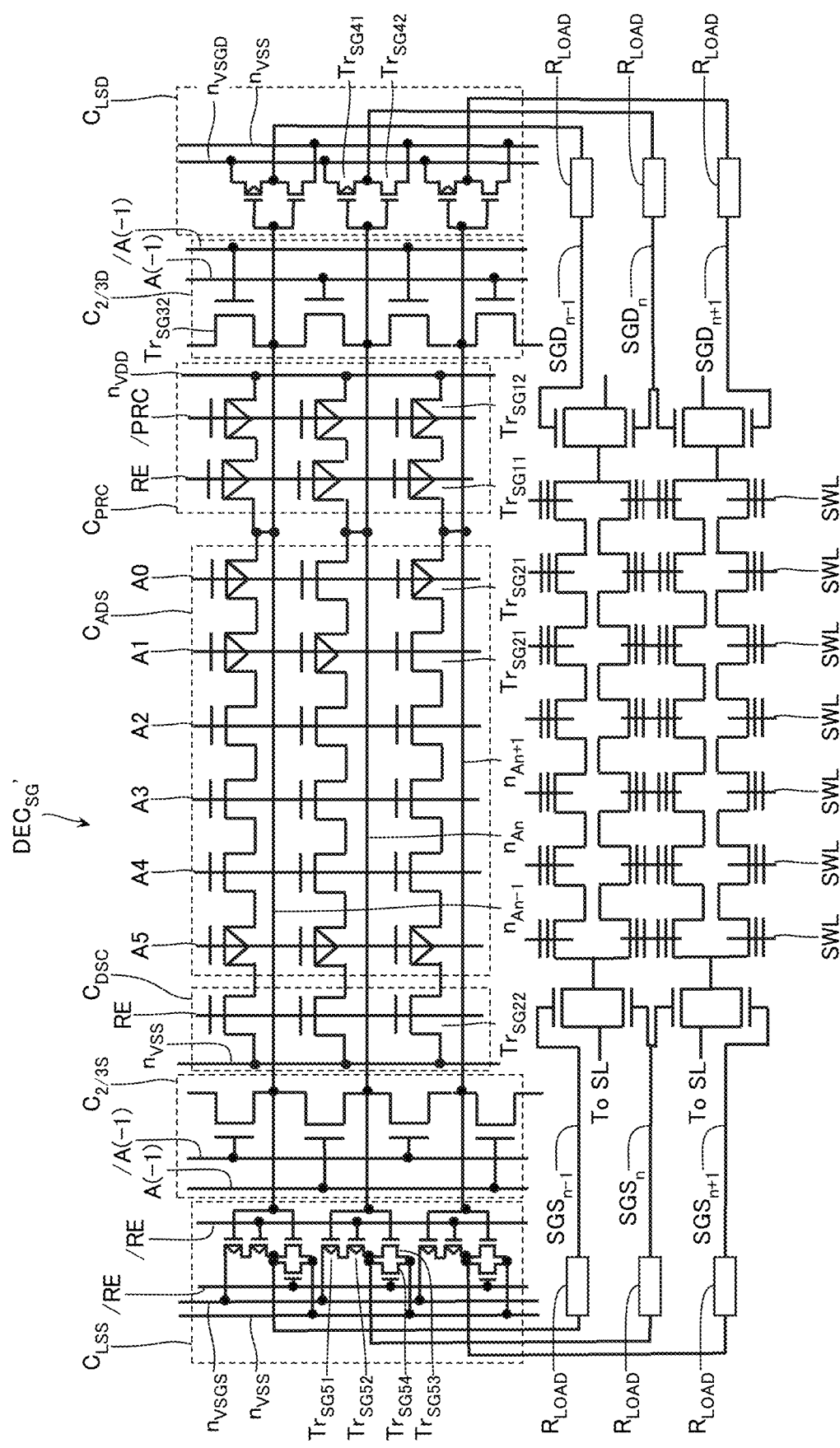
FIG. 28 is a schematic circuit diagram illustrating a configuration of a decode circuit $DEC_{SG}{}'$ of a semiconductor memory device according to a third embodiment.

FIG. 28 is a schematic circuit diagram illustrating a configuration of the decode circuit $DEC_{SG}'$ of the semiconductor memory device according to the third embodiment.

The decode circuit $DEC_{SG}'$ according to the third embodiment is basically configured similarly to the decode circuit $DEC_{SG}$ according to the first embodiment or the second embodiment.

However, as illustrated in FIG. 28, in the decode circuit $DEC_{SG}'$ according to the third embodiment, resistor elements $R_{LOAD}$ are disposed in a current path between output terminals of the inverters in the level shifter circuit $C_{LSD}$ and the drain-side select gate lines SGD. Additionally, in the decode circuit $DEC_{SG}'$ resistor elements $R_{LOAD}$ are disposed in a current path between output terminals of the inverters in the level shifter circuit $C_{LSS}$ and the source-side select gate lines SGS.

With such a configuration, rapid rise and fall of the current can be reduced, and deterioration in the inverters in the level shifter circuits $C_{LSD}$, $C_{LSS}$ can be reduced.

In the third embodiment, a dummy memory cell may be further disposed between the drain-side select transistor STD and the semiconductor layers 160 (FIG. 6). The dummy memory cell is configured similarly to the memory cell MC. However, data is not stored in the dummy memory cell.

Fourth Embodiment

Next, a semiconductor memory device according to a fourth embodiment will be described. In the following description, similar reference numerals are attached to parts similar to those of the semiconductor memory device according to the first embodiment, and their descriptions are omitted.

The semiconductor memory device according to the fourth embodiment is basically configured similarly to the semiconductor memory device according to any of the first embodiment to the third embodiment. However, the semiconductor memory device according to the fourth embodiment includes a transistor layer $L_{T4}$ in place of the transistor layer $L_T$ described with reference to FIG. 9, FIG. 10, and the like.

Figure 29:
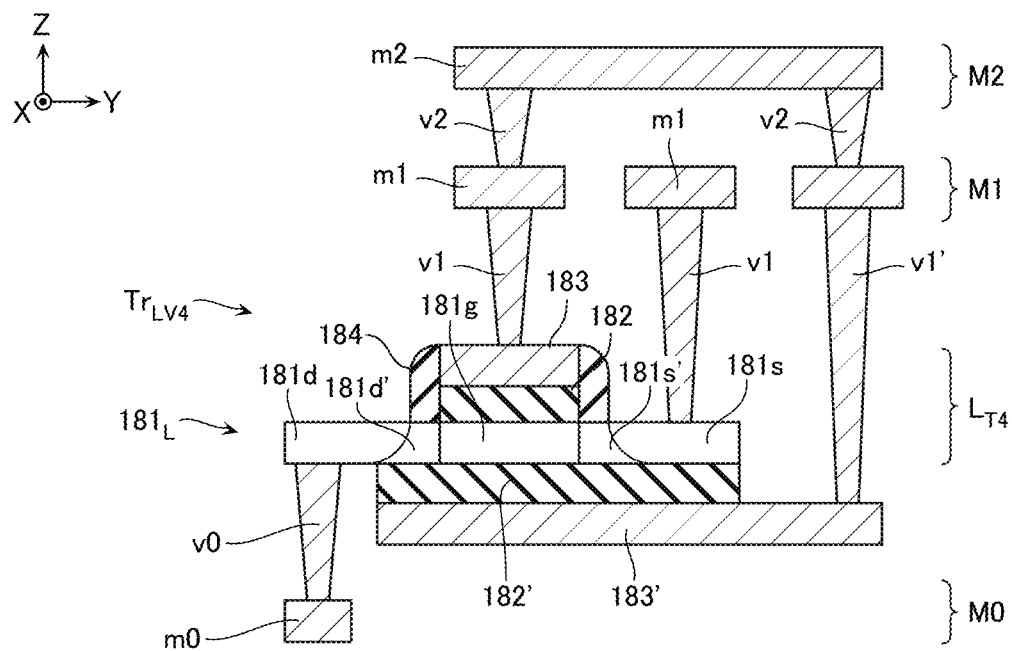
FIG. 29 is a schematic cross-sectional view illustrating a part of a configuration of a transistor layer $L_{T4}$ according to a fourth embodiment.
Figure 30:
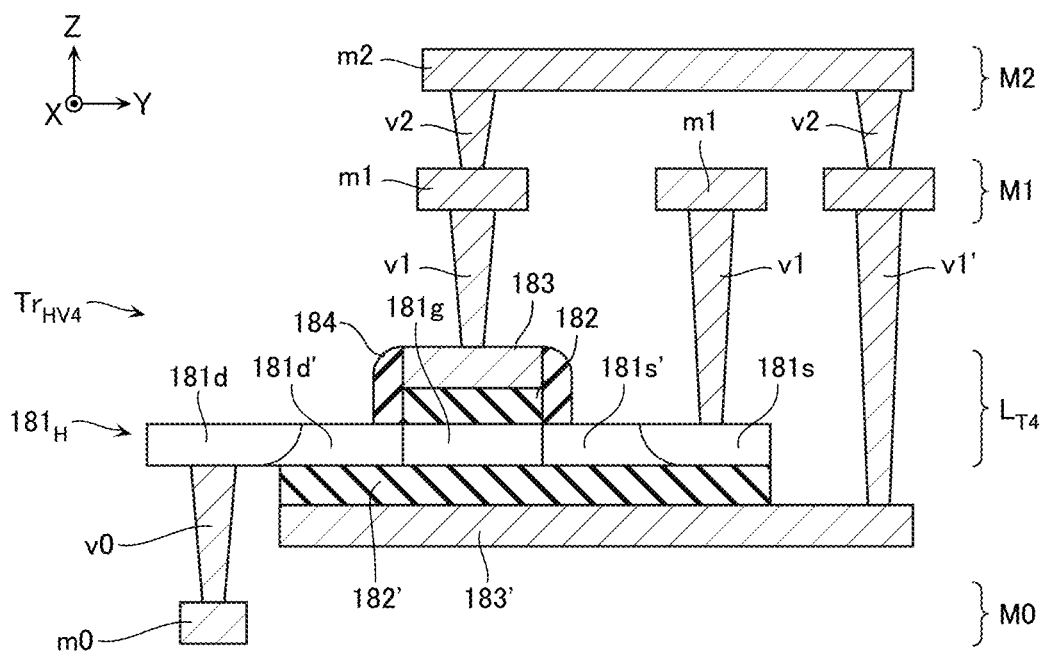
FIG. 30 is a schematic cross-sectional view illustrating a part of the configuration of the transistor layer $L_{T4}$ according to the fourth embodiment.

FIG. 29 and FIG. 30 are schematic cross-sectional views illustrating a part of a configuration of the transistor layer $L_{T4}$ according to the fourth embodiment. In FIG. 29 and FIG. 30, in addition to the transistor layer $L_{T4}$, the wiring layer M0 disposed below the transistor layer $L_{T4}$ and the wiring layers M1, M2 disposed above the transistor layer $L_{T4}$ are exemplified.

The transistor layer $L_{T4}$ is basically configured similarly to the transistor layer $L_T$. However, the transistor layer $L_{T4}$ includes at least one of a transistor $Tr_{LV4}$ as exemplified in FIG. 29 and a transistor $Tr_{HV4}$ as exemplified in FIG. 30.

As illustrated in FIG. 29, the transistor $Tr_{LV4}$ is basically configured similarly to the transistor $Tr_{LV}$ described with reference to FIG. 9. However, the transistor $Tr_{LV4}$ includes a gate insulating layer 182' disposed on the lower surface of the semiconductor layer $181_L$, a gate electrode 183' disposed on the lower surface of the gate insulating layer 182'.

The gate insulating layer 182' may contain, for example, silicon oxide ($SiO_2$) or the like. The gate electrode 183' is opposed to the lower surface of the semiconductor layer $181_L$ via the gate insulating layer 182'. In the illustrated example, the area of the gate electrode 183' is greater than the area of the gate electrode 183. In the illustrated example, the gate electrode 183' is opposed to the lower surfaces of the gate region 181g, the source region 181s, the region 181s', and the region 181d' of the semiconductor layer $181_L$. The gate electrode 183' may include, for example, a stacked film of a polycrystalline silicon (Si) containing N-type or P-type impurities, a metal such as tungsten (W), silicide, or a combination of two or more of these, or the like. The gate electrode 183' is connected to the gate electrode 183 via contact electrodes v1, v1', the wirings m1 in the wiring layer M1, the via contact electrodes v2, and the wiring m2 in the wiring layer M2.

As illustrated in FIG. 30, the transistor $Tr_{LV}$ is basically configured similarly to the transistor $Tr_{HV}$ described with reference to FIG. 10. However, the transistor $Tr_{HV4}$ includes the gate insulating layer 182' disposed on the lower surface of the semiconductor layer $181_H$, and the gate electrode 183' disposed on the lower surface of the gate insulating layer 182'.

The gate electrode 183' is opposed to the lower surface of the semiconductor layer $181_H$ via the gate insulating layer 182'. In the illustrated example, the area of the gate electrode 183' is greater than the area of the gate electrode 183. In the illustrated example, the gate electrode 183' is opposed to the lower surfaces of the gate region 181g, the source region 181s, the region 181s', and the region 181d' of the semiconductor layer $181_H$.

Here, in the first embodiment to the third embodiment, the circuit drvs described with reference to FIG. 12 is configured of the transistors $Tr_{HV}$ as described with reference to FIG. 10. Here, during transfer of a voltage from the global word lines GWL to the sub-word lines SWL, when the voltage of the global word lines GWL increases, a voltage in a channel formed in the semiconductor layer $181_H$ also increases. In association with this, a voltage difference between the channel and the gate possibly decreases, causing a current flowing to the transistors $Tr_{HV}$ to decrease.

Here, for example, in the transistor $Tr_{HV4}$ described with reference to FIG. 30, not only above the semiconductor layer $181_H$, but also below the semiconductor layer $181_H$, the gate electrode 183' is disposed. Therefore, in driving the transistor $Tr_{HV4}$, an electron channel is formed not only on the upper surface of the semiconductor layer $181_H$, but also on the lower surface of the semiconductor layer $181_H$. Therefore, a substantial channel width of the transistor $Tr_{HV4}$ is greater than a substantial channel width of the transistor $Tr_{HV}$. Therefore, when a gate voltage is the same, a current flowing to the transistor $Tr_{HV4}$ is greater than the current flowing to the transistor $Tr_{HV}$.

In the transistor $Tr_{HV4}$ described with reference to FIG. 30, an influence of an electric field from a wiring m1 (not illustrated) in the wiring layer M1 disposed below the semiconductor layer $181_H$ can be reduced by the gate electrode 183' disposed below the semiconductor layer $181_H$.

The transistors exemplified in FIG. 29 and FIG. 30 can be used as transistors other than the transistors in the circuit drvs described with reference to FIG. 12.

The transistor layer $L_{T4}$ need not include one of the transistors $Tr_{LV4}$, $Tr_{HV4}$. The transistor layer $L_{T4}$ may include at least one of the transistors $Tr_{LV}$, $Tr_{HV}$.

In FIG. 29 and FIG. 30, the transistors $Tr_{LV4}$, $Tr_{HV4}$ whose channel directions are the Y-direction are exemplified. However, the transistor layer $L_{T4}$ may include the transistors $Tr_{LV4}$, $Tr_{HV4}$ whose channel directions are the X-direction.

Fifth Embodiment

Next, a semiconductor memory device according to a fifth embodiment will be described. In the following description, similar reference numerals are attached to parts similar to those of the semiconductor memory device according to the fourth embodiment, and their descriptions are omitted.

The semiconductor memory device according to the fifth embodiment is basically configured similarly to the semiconductor memory device according to the fourth embodiment. However, the semiconductor memory device according to the fifth embodiment includes a transistor layer $L_{T3}$ in place of the transistor layer $L_{T4}$ described with reference to FIG. 29, FIG. 30, and the like.

Figure 31:
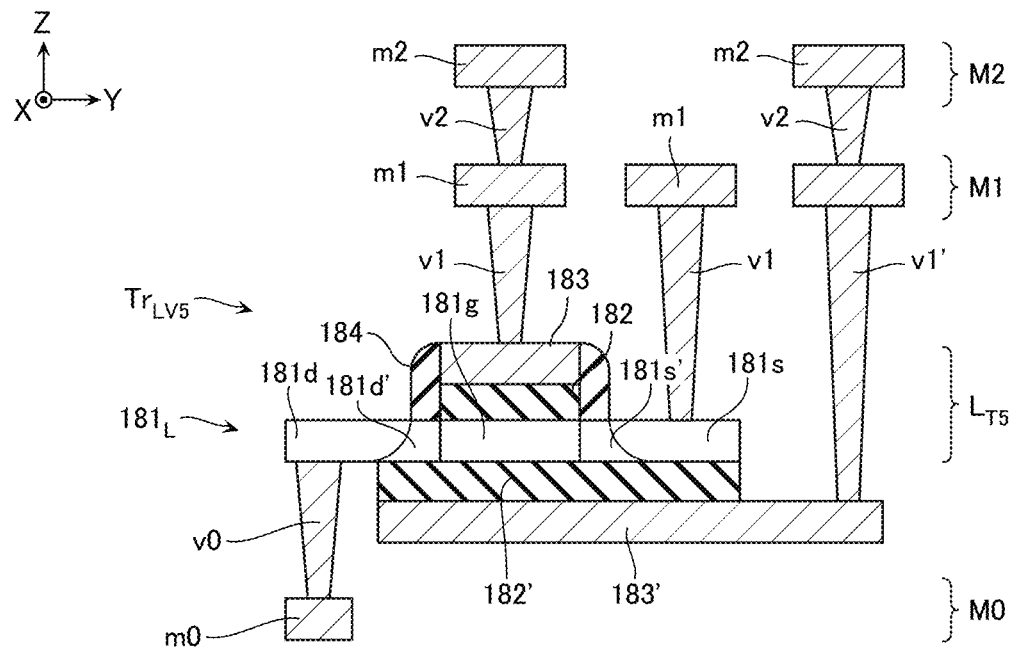
FIG. 31 is a schematic cross-sectional view illustrating a part of a configuration of a transistor layer $L_{T3}$ according to a fifth embodiment.
Figure 32:
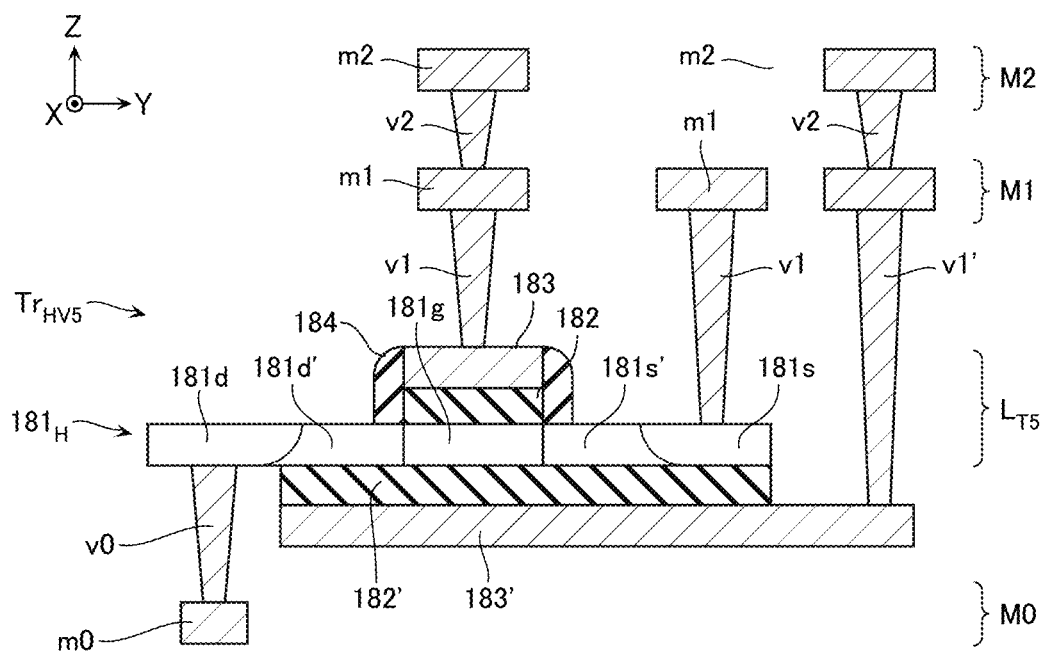
FIG. 32 is a schematic cross-sectional view illustrating a part of the configuration of the transistor layer $L_{T3}$ according to the fifth embodiment.

FIG. 31 and FIG. 32 are schematic cross-sectional views illustrating a part of a configuration of the transistor layer $L_{T3}$ according to the fifth embodiment. In FIG. 31 and FIG. 32, in addition to the transistor layer $L_{T3}$, the wiring layer M0 disposed below the transistor layer $L_{T3}$ and the wiring layers M1, M2 disposed above the transistor layer $L_{T3}$ are exemplified.

The transistor layer $L_{T3}$ is basically configured similarly to the transistor layer $L_{T4}$. However, the transistor layer $L_{T3}$ includes at least one of a transistor Trims as exemplified in FIG. 31 and a transistor $Tr_{HV5}$ as exemplified in FIG. 32.

The transistors $Tr_{LV5}$, $Tr_{HV5}$ are basically configured similarly to the transistors $Tr_{LV}$ $Tr_{LV}$. However, in the transistors $Tr_{LV5}$, $Tr_{HV5}$, the gate electrode 183 and the gate electrode 183' are electrically independent. The transistors Trims, $Tr_{HV5}$ are configured to be able to apply different voltages to the gate electrode 183 and the gate electrode 183'.

The transistor layer $L_{T3}$ need not include one of the transistors $Tr_{LV5}$, $Tr_{HV5}$. The transistor layer Lm may include at least one of the transistors $Tr_{LV}$, $Tr_{HV}$. The transistor layer $L_{T5}$ may include at least one of the transistors $Tr_{LV4}$, $Tr_{HV4}$.

In FIG. 31 and FIG. 32, the transistors $Tr_{LV5}$, $Tr_{HV5}$ whose channel directions are the Y-direction are exemplified. However, the transistor layer Lm may include the transistors $Tr_{LV5}$, $Tr_{HV5}$ whose channel directions are the X-direction.

Sixth Embodiment

Next, a semiconductor memory device according to a sixth embodiment will be described. In the following description, similar reference numerals are attached to parts similar to those of the semiconductor memory device according to the first embodiment, and their descriptions are omitted.

The semiconductor memory device according to the sixth embodiment is basically configured similarly to the semiconductor memory device according to any of the first embodiment to the fifth embodiment.

Figure 33:
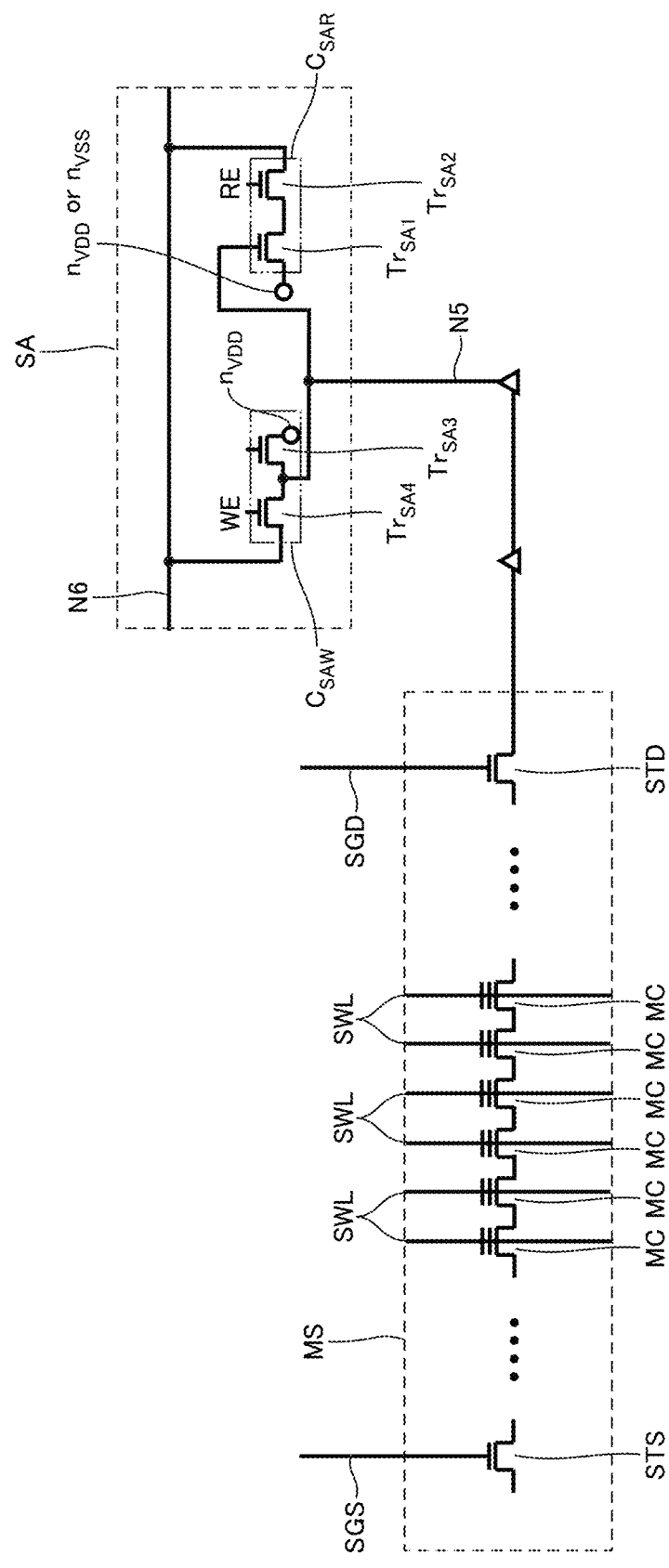
FIG. 33 is a schematic circuit diagram for describing a semiconductor memory device according to a sixth embodiment.

FIG. 33 is a schematic circuit diagram for describing the semiconductor memory device according to the sixth embodiment. FIG. 33 illustrates a memory string MS and a sense amplifier circuit SA.

In the illustrated example, the drain-side select transistor STD has a drain electrode connected to the sense amplifier circuit SA via a node N5. The sense amplifier circuit SA includes a read circuit $C_{SAR}$ and a write circuit $C_{SAW}$.

The read circuit $C_{SAR}$ includes transistors $Tr_{SA1}$, $Tr_{SA2}$. One of a source electrode and a drain electrode of the transistor $Tr_{SA1}$ is connected to the voltage node $n_{VDD}$ or the voltage node $n_{VSS}$. The other of the source electrode and the drain electrode of the transistor $Tr_{SA1}$ is connected to a source electrode or a drain electrode of the transistor $Tr_{SA2}$. A gate electrode of the transistor $Tr_{SA1}$ is connected to the node N5. In the read operation, the transistor $Tr_{SA1}$ enters the ON state or the OFF state according to a state of the node N5.

The source electrode or the drain electrode of the transistor $Tr_{SA2}$ is connected to a node N6. A gate electrode of the transistor $Tr_{SA2}$ is connected to the signal line RE. The transistor $Tr_{SA2}$ electrically conducts the node N6 with the transistor $Tr_{SA1}$ in response to a read enable signal input to the signal line RE. When the transistor $Tr_{SA1}$ is in the ON state, the node N6 is charged to the voltage VDD or discharged to the ground voltage $V_{SS}$. When the transistor $Tr_{SA1}$ is in the OFF state, the voltage of the node N6 is maintained.

The write circuit $C_{SAW}$ includes transistors $Tr_{SA3}$, $Tr_{SA4}$.

The transistor $Tr_{SA3}$ has a drain electrode connected to the voltage node $n_{VDD}$. The transistor $Tr_{SA3}$ has a source electrode connected to the node N5. In the write operation, the transistor $Tr_{SA3}$ precharges the node N5 to the voltage VDD.

The transistor $Tr_{SA4}$ has a drain electrode connected to the node N6. The transistor $Tr_{SA4}$ has a source electrode connected to the node N5. The transistor $Tr_{SA4}$ has a gate electrode connected to a signal line WE. The transistor $Tr_{SA4}$ electrically conducts the node N6 with the node N5 in response to a write enable signal input to the signal line WE. When the voltage of the node N6 is in the "H" state, the voltage of the node N5 is maintained at the voltage VDD. When the voltage of the node N6 is in the "L" state, the node N5 is discharged to the ground voltage $V_{SS}$.

Here, the transistor $Tr_{SA1}$ is a transistor for detecting the voltage of the node N5 and preferably has a uniform characteristic. The transistor $Tr_{SA1}$ can be achieved by, for example, the transistor $Tr_{LV}$ as exemplified in FIG. 9. However, in the transistor $Tr_{LV}$, the semiconductor layer $181_L$ contains polycrystalline silicon (Si) or the like. Here, when positions of crystal grain boundaries in the semiconductor layer $181_L$ vary, a threshold voltage of the transistor $Tr_{SA1}$ varies in some cases. In such a case, the read operation cannot be preferably executed in some cases.

Therefore, the semiconductor memory device according to the embodiment includes a transistor layer $L_{T6}$ in place of the transistor layer $L_T$. The transistor layer $L_{T6}$ includes a transistor $Tr_{LV6}$ that can reduce variation in the threshold voltage.

Figure 34:
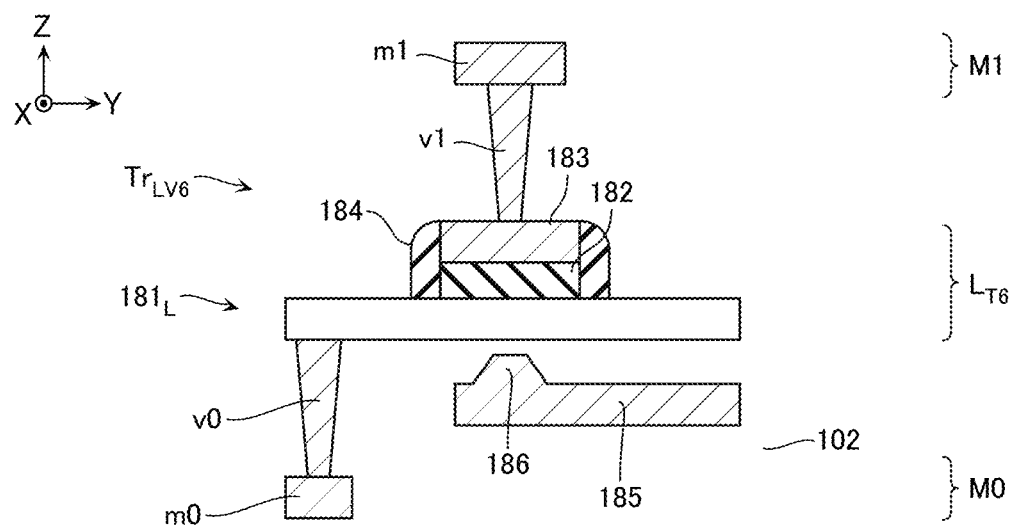
FIG. 34 is a schematic cross-sectional view illustrating a part of a configuration of a transistor layer $L_{T6}$ according to the sixth embodiment.

FIG. 34 is a schematic cross-sectional view illustrating a part of a configuration of the transistor layer $L_{T6}$. In FIG. 34, in addition to the transistor layer $L_{T6}$, the wiring layer M0 disposed below the transistor layer $L_{T6}$ and the wiring layer M1 disposed above the transistor layer $L_{T6}$ are exemplified.

As illustrated in FIG. 34, the transistor $Tr_{LV6}$ is basically configured similarly to the transistor $Tr_{LV}$. However, below the transistor $Tr_{LV6}$, a configuration having a thermal conductivity different from that of an embedded insulating layer 102 of silicon oxide ($SiO_2$) or the like is disposed.

In the example of FIG. 34, a heatsink 185 is exemplified as the configuration having a thermal conductivity different from that of the embedded insulating layer 102. The heatsink 185 extends in the X-direction and the Y-direction along the lower surface of the semiconductor layer $181_L$. The heatsink 185 may contain, for example, a metal, such as tungsten (W), may contain a conductive metal compound, such as titanium nitride (TiN) and tantalum nitride (TaN), or may contain a stacked film of these, or the like.

At a position on the upper surface of the heatsink 185 that overlaps with the gate electrode 183 when viewed from above, a heat dissipation unit 186 is disposed. A distance between the heat dissipation unit 186 and the semiconductor layer $181_L$ is smaller than a distance between the other portions of the heatsink 185 and the semiconductor layer $181_L$. The distance between the heat dissipation unit 186 and the semiconductor layer $181_L$ is, for example, approximately 5 nm to 10 nm. The distance between the other portions of the heatsink 185 and the semiconductor layer $181_L$ is, for example, 10 nm or more. The distance between the heat dissipation unit 186 and the semiconductor layer $181_L$ is smaller than a distance between the wiring m0 and the semiconductor layer $181_L$. The heat dissipation unit 186 contains the same material as the heatsink 185.

The embedded insulating layer 102 covers an outer peripheral surface of the via contact electrode v0.

With such a configuration, in a crystallization process of the semiconductor layer $181_L$, heat in the semiconductor layer $181_L$ is released via the heat dissipation unit 186 of the heatsink 185. Accordingly, in the semiconductor layer $181_L$, a thermal gradient is formed so that a temperature becomes lower at a position closer to the heat dissipation unit 186 and the temperature becomes higher at a position farther from the heat dissipation unit 186. Accordingly, in the semiconductor layer $181_L$, crystallization starts from the proximity of the heat dissipation unit 186. Accordingly, formation of crystal grain boundaries at a portion (gate region) in the semiconductor layer $181_L$ that overlaps with the gate electrode 183 when viewed from above can be reduced. Accordingly, variation in the threshold voltage of the transistor $Tr_{LV6}$ can be reduced.

The transistor $Tr_{LV6}$ may be used as the transistor $Tr_{SA1}$ (FIG. 33) or may be used as a transistor other than the transistor $Tr_{SA1}$.

The transistor layer $L_{T6}$ may include at least one of the transistors $Tr_{LV5}$, $Tr_{HV5}$. The transistor layer $L_{T6}$ may include at least one of the transistors $Tr_{LV}$, $Tr_{HV}$. The transistor layer $L_{T6}$ may include at least one of the transistors $Tr_{LV4}$, $Tr_{HV4}$.

In FIG. 34, the transistor $Tr_{LV6}$ whose channel direction is the Y-direction is exemplified. However, the transistor layer $L_{T6}$ may include the transistor $Tr_{LV6}$ whose channel direction is the X-direction.

Seventh Embodiment

Next, a semiconductor memory device according to a seventh embodiment will be described. In the following description, similar reference numerals are attached to parts similar to those of the semiconductor memory device according to the sixth embodiment, and their descriptions are omitted.

The semiconductor memory device according to the seventh embodiment is basically configured similarly to the semiconductor memory device according to the sixth embodiment.

However, the semiconductor memory device according to the seventh embodiment includes a transistor layer $L_{T7}$ in place of the transistor layer $L_{T6}$.

Figure 35:
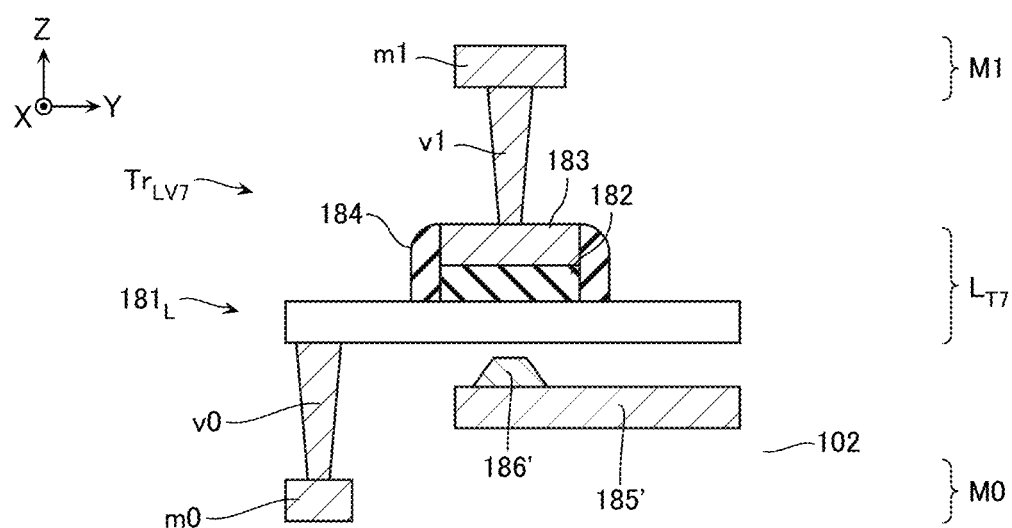
FIG. 35 is a schematic cross-sectional view illustrating a part of a configuration of a transistor layer $L_{T7}$ according to a seventh embodiment.

FIG. 35 is a schematic cross-sectional view illustrating a part of a configuration of the transistor layer $L_{T7}$. In FIG. 35, in addition to the transistor layer $L_{T7}$, the wiring layer M0 disposed below the transistor layer $L_{T7}$ and the wiring layer M1 disposed above the transistor layer $L_{T7}$ are exemplified.

As illustrated in FIG. 35, the transistor layer $L_{T7}$ includes a transistor $Tr_{LV7}$. As illustrated in FIG. 35, the transistor $Tr_{LV7}$ is basically configured similarly to the transistor $Tr_{LV6}$. However, below the transistor $Tr_{LV7}$, a heatsink 185' is disposed as a configuration having a thermal conductivity different from that of the embedded insulating layer 102. At a position on the upper surface of the heatsink 185' that overlaps with the gate electrode 183 when viewed from above, a heat dissipation unit 186' is disposed.

Here, the heatsink 185' and the heat dissipation unit 186' are basically configured similarly to the heatsink 185 and the heat dissipation unit 186. However, the heat dissipation unit 186 contains the same material as the heatsink 185. On the other hand, the heat dissipation unit 186' contains a material different from that of the heatsink 185'. For example, the heat dissipation unit 186' may contain a conductive metal compound, such as titanium nitride (TiN) and tantalum nitride (TaN). The heatsink 185' may contain, for example, a metal, such as tungsten (W).

The transistor $Tr_{LV7}$ may be used as the transistor $Tr_{SA1}$ (FIG. 33) or may be used as a transistor other than the transistor $Tr_{SA1}$.

The transistor layer $L_{T7}$ may include at least one of the transistors $Tr_{LV}$, $Tr_{HV}$. The transistor layer $L_{T7}$ may include at least one of the transistors $Tr_{LV4}$, $Tr_{HV4}$. The transistor layer $L_{T7}$ may include at least one of the transistors $Tr_{LV5}$, $Tr_{HV5}$. The transistor layer $L_{T7}$ may include the transistor $Tr_{LV6}$.

In FIG. 35, the transistor $Tr_{LV7}$ whose channel direction is the Y-direction is exemplified. However, the transistor layer $L_{T7}$ may include the transistor $Tr_{LV7}$ whose channel direction is the X-direction.

Eighth Embodiment

Next, a semiconductor memory device according to an eighth embodiment will be described. In the following description, similar reference numerals are attached to parts similar to those of the semiconductor memory device according to the sixth embodiment, and their descriptions are omitted.

The semiconductor memory device according to the eighth embodiment is basically configured similarly to the semiconductor memory device according to the sixth embodiment.

However, the semiconductor memory device according to the eighth embodiment includes a transistor layer $L_{T8}$ in place of the transistor layer $L_{T6}$.

Figure 36:
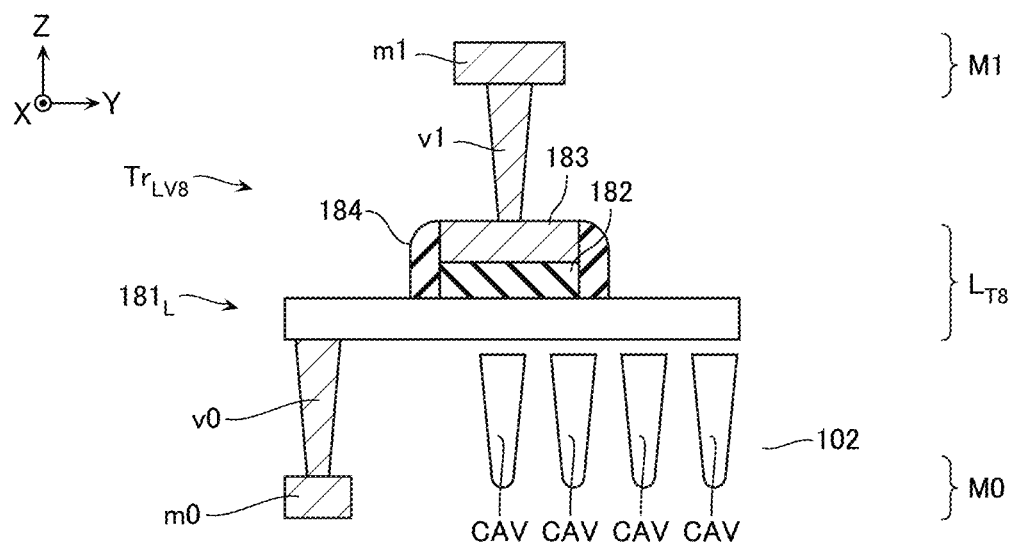
FIG. 36 is a schematic cross-sectional view illustrating a part of a configuration of a transistor layer $L_{T8}$ according to an eighth embodiment.

FIG. 36 is a schematic cross-sectional view illustrating a part of a configuration of the transistor layer $L_{T8}$. In FIG. 36, in addition to the transistor layer $L_{T8}$, the wiring layer M0 disposed below the transistor layer $L_{T8}$ and the wiring layer M1 disposed above the transistor layer $L_{T8}$ are exemplified.

As illustrated in FIG. 36, the transistor layer $L_{T8}$ includes a transistor $Tr_{LV8}$. The transistor $Tr_{LV8}$ is basically configured similarly to the transistor $Tr_{LV6}$. However, below the transistor $Tr_{LV8}$, a plurality of cavities CAV are provided as configurations having a thermal conductivity different from that of the embedded insulating layer 102. In the illustrated example, the plurality of cavities CAV are arranged in the Y-direction along the lower surface of the semiconductor layer $181_L$.

For example, the cavities CAV may be formed simultaneously with a contact hole corresponding to the via contact electrode v0. In such a case, the lower ends of the cavities CAV may be disposed at a height position approximately the same as the lower end of the via contact electrode v0. The lower ends of the cavities CAV may be disposed lower than the lower end of the via contact electrode v0. The upper ends of the cavities CAV may be disposed lower than the upper end of the via contact electrode v0.

With such a configuration, in a crystallization process of the semiconductor layer $181_L$, heat in the semiconductor layer $181_L$ is released via the via contact electrode v0 and the wiring m0 in the wiring layer M0. Since the cavities CAV have a small thermal conductivity, the heat in the semiconductor layer $181_L$ is difficult to release at the proximity of the cavities CAV. Therefore, in the semiconductor layer $181_L$, a thermal gradient is formed so that a temperature becomes lower at a position closer to the via contact electrode v0 and the temperature becomes higher at a position farther from the via contact electrode v0. Accordingly, in the semiconductor layer $181_L$, crystallization starts from the proximity of the via contact electrode v0. Accordingly, formation of crystal grain boundaries at a portion (gate region) in the semiconductor layer $181_L$ that overlaps with the gate electrode 183 when viewed from above can be reduced. Accordingly, variation in a threshold voltage of the transistor $Tr_{LV8}$ can be reduced.

The transistor $Tr_{LV8}$ may be used as the transistor $Tr_{SA1}$ (FIG. 33) or may be used as a transistor other than the transistor $Tr_{SA1}$.

The transistor layer $L_{T8}$ may include at least one of the transistors $Tr_{LV}$, $Tr_{HV}$. The transistor layer $L_{T8}$ may include at least one of the transistors $Tr_{LV4}$, $Tr_{HV4}$. The transistor layer $L_{T8}$ may include at least one of the transistors $Tr_{LV5}$, $Tr_{HV5}$. The transistor layer $L_{T8}$ may include the transistor $Tr_{LV6}$. The transistor layer $L_{T8}$ may include the transistor $Tr_{LV7}$.

In FIG. 36, the transistor $Tr_{LV8}$ whose channel direction is the Y-direction is exemplified. However, the transistor layer $L_{T8}$ may include the transistor $Tr_{LV8}$ whose channel direction is the X-direction.

Ninth Embodiment

Next, a semiconductor memory device according to a ninth embodiment will be described. In the following description, similar reference numerals are attached to parts similar to those of the semiconductor memory device according to the eighth embodiment, and their descriptions are omitted.

The semiconductor memory device according to the ninth embodiment is basically configured similarly to the semiconductor memory device according to the eighth embodiment.

However, the semiconductor memory device according to the ninth embodiment includes a transistor layer $L_{T9}$ in place of the transistor layer $L_{T8}$.

Figure 37:
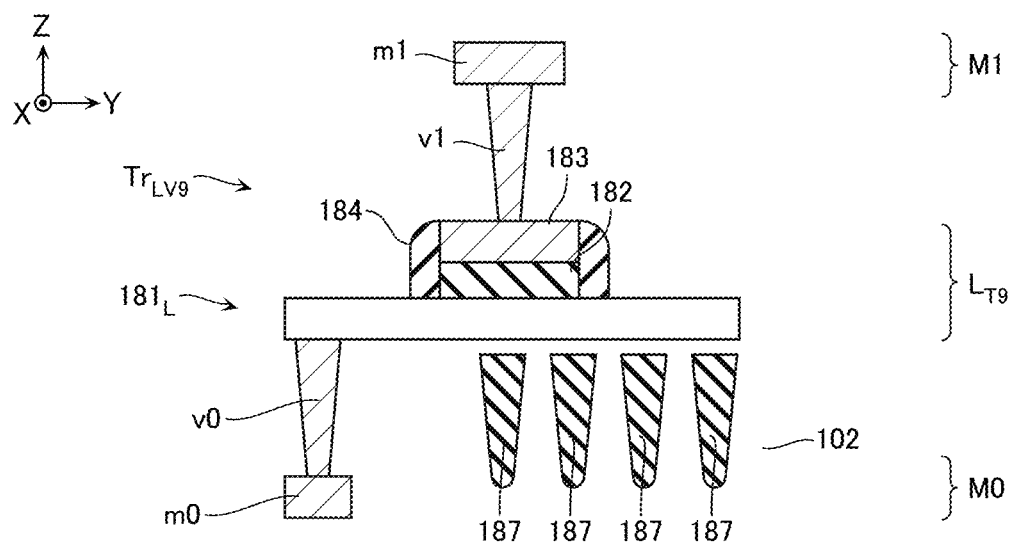
FIG. 37 is a schematic cross-sectional view illustrating a part of a configuration of a transistor layer $L_{T9}$ according to a ninth embodiment.

FIG. 37 is a schematic cross-sectional view illustrating a part of a configuration of the transistor layer $L_{T9}$. In FIG. 37, in addition to the transistor layer $L_{T9}$, the wiring layer M0 disposed below the transistor layer $L_{T9}$ and the wiring layer M1 disposed above the transistor layer $L_{T9}$ are exemplified.

As illustrated in FIG. 37, the transistor layer $L_{T9}$ includes a transistor $Tr_{LV9}$. The transistor $Tr_{LV9}$ is basically configured similarly to the transistor $Tr_{LV8}$. However, below the transistor $Tr_{LV9}$, a plurality of insulating members 187 are disposed as configurations having a thermal conductivity different from that of the embedded insulating layer 102. In the illustrated example, the plurality of insulating members 187 are arranged in the Y-direction along the lower surface of the semiconductor layer $181_L$.

Although not illustrated, the thermal conductivity of the insulating members 187 is smaller than the thermal conductivity of the embedded insulating layer 102. The insulating member 187 may contain, for example, carbon (C) or the like.

For example, the insulating members 187 may be formed in via holes formed simultaneously with the contact hole corresponding to the via contact electrode v0. In such a case, the lower ends of the insulating members 187 may be disposed at a height position approximately the same as the lower end of the via contact electrode v0. The lower ends of the insulating members 187 may be disposed lower than the lower end of the via contact electrode v0. The upper ends of the insulating members 187 may be disposed lower than the upper end of the via contact electrode v0.

With such a configuration, an effect similar to that of the semiconductor memory device according to the eighth embodiment can be exerted.

The transistor $Tr_{LV9}$ may be used as the transistor $Tr_{SA1}$ (FIG. 33) or may be used as a transistor other than the transistor $Tr_{SA1}$.

The transistor layer $L_{T9}$ may include at least one of the transistors $Tr_{LV}$, $Tr_{HV}$. The transistor layer $L_{T9}$ may include at least one of the transistors $Tr_{LV4}$, $Tr_{HV4}$. The transistor layer $L_{T9}$ may include at least one of the transistors $Tr_{LV5}$, $Tr_{HV5}$. The transistor layer $L_{T9}$ may include the transistor $Tr_{LV6}$. The transistor layer $L_{T9}$ may include the transistor $Tr_{LV7}$. The transistor layer $L_{T9}$ may include the transistor $Tr_{LV8}$.

In FIG. 37, the transistor $Tr_{LV9}$ whose channel direction is the Y-direction is exemplified. However, the transistor layer $L_{T9}$ may include the transistor $Tr_{LV9}$ whose channel direction is the X-direction.

Other Embodiments

The semiconductor memory devices according to the first embodiment to the ninth embodiment have been described above. However, the configurations and the like described above are only examples and specific configurations and the like are adjustable as appropriate.

For example, the decode circuit $DEC_{SG}$ exemplified in FIG. 17 includes the two discharging circuits $C_{2/3D}$, $C_{2/3S}$. However, for example, it is possible to omit one of these two discharging circuits $C_{2/3D}$, $C_{2/3S}$.

For example, in the decode circuit $DEC_{SG}$ exemplified in FIG. 17, the address select circuit $C_{ADS}$ is disposed in a current path between the address nodes $n_A$ and the discharging circuit $C_{DSC}$. However, the address select circuit $C_{ADS}$ may be disposed in a current path between the address nodes $n_A$ and the charging circuit $C_{PRC}$. In such a case, for example, at the timing described with reference to FIG. 21, only one address node $n_A$ corresponding to the address data may be selectively charged.

For example, in the decode circuit $DEC_{SG}$ exemplified in FIG. 17, every other gate electrodes of the plurality of transistors $Tr_{SG32}$, $Tr_{SG32}$ included in the discharging circuits $C_{2/3D}$, $C_{2/3S}$ are connected in common. However, it is only necessary for these plurality of transistors $Tr_{SG31}$, $Tr_{SG32}$ to be able to preferably connect each address node to one address node $n_A$, and how the gate electrodes of the plurality of transistors $Tr_{SG31}$, $Tr_{SG32}$ are connected is adjustable as appropriate. For example, every three or every four gate electrodes of the plurality of transistors $Tr_{SG31}$, $Tr_{SG32}$ may be connected in common.

For example, in the decode circuit $DEC_{SG}$ exemplified in FIG. 17, the level shifter circuit $C_{LSD}$ includes the plurality of inverters. The level shifter circuit $C_{LSS}$ includes the plurality of clocked inverters. However, it is only necessary for the level shifter circuits $C_{LSD}$, $C_{LSS}$ to be able to amplify the signals of the address nodes $n_A$, and specific configurations are adjustable as appropriate.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array; and
    a peripheral circuit, wherein
    the memory cell array includes:
        a plurality of first semiconductor layers extending in a first direction and arranged in a second direction intersecting with the first direction; and
        a plurality of first via electrodes each disposed between two adjacent ones of the first semiconductor layers in the second direction, and
    the peripheral circuit includes:
        a plurality of first nodes disposed corresponding to the plurality of first via electrodes;
        a charging circuit that charges the plurality of first nodes;

a discharging circuit that discharges the plurality of first nodes;

an address select circuit disposed in a current path between the plurality of first nodes and the charging circuit or in a current path between the plurality of first nodes and the discharging circuit, the address select circuit electrically conducting one of the plurality of first nodes with the charging circuit or the discharging circuit in response to an input address signal;

a plurality of first transistors each disposed in a current path between two of the plurality of first nodes; and a plurality of amplifier circuits disposed corresponding to the plurality of first via electrodes, the plurality of amplifier circuits including input terminals connected to any of the plurality of first nodes and output terminals connected to any of the plurality of first via electrodes.

2. The semiconductor memory device according to claim 1, comprising
a resistor element disposed in a current path between any of the plurality of first via electrodes and an output terminal of any of the plurality of amplifier circuits.

3. The semiconductor memory device according to claim 2, comprising
a dummy memory cell disposed in a current path between any of the plurality of first via electrodes and the resistor element.

4. The semiconductor memory device according to claim 1, wherein
in at least one of a read operation and a write operation, the address signal is input to the address select circuit, and
a voltage that turns on the first transistors is applied to gate electrodes of a part of the plurality of first transistors.

5. A semiconductor memory device comprising:
a memory cell array; and
a peripheral circuit, wherein
the memory cell array includes a plurality of memory blocks arranged in a first direction,
each of the plurality of memory blocks includes a plurality of sub-blocks arranged in a second direction intersecting with the first direction,
each of the plurality of sub-blocks includes:
a first semiconductor layer extending in the first direction;
a second via electrode extending in a third direction intersecting with the first direction and the second direction, the second via electrode being opposed to the first semiconductor layer; and
an electric charge accumulating layer disposed between the first semiconductor layer and the second via electrode, wherein
the plurality of memory blocks include a first memory block, and
the peripheral circuit includes:
a plurality of first sub-word lines disposed corresponding to a plurality of sub-blocks included in the first memory block, each of the plurality of first sub-word lines being connected to a second via electrode included in each of the sub-blocks;
a first global word line electrically connected to the plurality of first sub-word lines; and
a plurality of second transistors each electrically connected between any of the plurality of first sub-word lines and the first global word line.

6. The semiconductor memory device according to claim 5, wherein
the plurality of memory blocks include a second memory block different from the first memory block, and
the peripheral circuit includes:
a plurality of second sub-word lines disposed corresponding to a plurality of sub-blocks included in the second memory block, each of the plurality of second sub-word lines being connected to a plurality of second via electrodes included in each of the sub-blocks; and
a plurality of third transistors each electrically connected between any of the plurality of second sub-word lines and the first global word line.

7. The semiconductor memory device according to claim 5, wherein
in an erase operation,
a voltage that turns ON the second transistors is applied to at least one gate electrode of the plurality of second transistors, and
a voltage that turns OFF the second transistors is applied to at least one gate electrode of the plurality of second transistors.

8. The semiconductor memory device according to claim 5, wherein
the plurality of memory blocks include a third memory block different from the first memory block,
the peripheral circuit includes:
a plurality of third sub-word lines disposed corresponding to a plurality of sub-blocks included in the third memory block, each of the plurality of third sub-word lines being connected to a plurality of second via electrodes included in each of the sub-blocks;
a second global word line electrically connected to the plurality of third sub-word lines; and
a plurality of fourth transistors each electrically connected between any of the plurality of third sub-word lines and the second global word line, wherein
in a read operation,
a voltage that turns ON the second transistors is applied to at least one gate electrode of the plurality of second transistors,
a voltage that turns OFF the second transistors is applied to at least one gate electrode of the plurality of second transistors,
a voltage that turns ON the fourth transistors is applied to at least one gate electrode of the plurality of fourth transistors, and
a voltage that turns OFF the fourth transistors is applied to at least one gate electrode of the plurality of fourth transistors.

9. The semiconductor memory device according to claim 5, wherein
each of the plurality of second transistors includes:
a second semiconductor layer;
a first gate electrode opposed to a surface on an opposite side of the memory cell array in the third direction of the second semiconductor layer; and
a second gate electrode opposed to a surface on a memory cell array side in the third direction of the second semiconductor layer.

10. The semiconductor memory device according to claim 9, wherein
the first gate electrode and the second gate electrode are mutually electrically conducted.

11. The semiconductor memory device according to claim 9, wherein the first gate electrode and the second gate electrode are electrically independent.

12. The semiconductor memory device according to claim 9, wherein
an area of the opposed surface to the second gate electrode of the second semiconductor layer is greater than an area of the opposed surface to the first gate electrode of the second semiconductor layer.

13. A semiconductor memory device comprising:
a memory cell array; and
a peripheral circuit, wherein
the memory cell array includes:
   a first semiconductor layer extending in a first direction;
   a second via electrode opposed to the first semiconductor layer in a second direction intersecting with the first direction, the second via electrode extending in a third direction intersecting with the first direction and the second direction; and
   an electric charge accumulating layer disposed between the first semiconductor layer and the second via electrode, wherein
the peripheral circuit includes:
   a third semiconductor layer extending in the first direction or the second direction;
   a third gate electrode disposed in one side in the third direction with respect to the third semiconductor layer, opposed to the third semiconductor layer, and electrically connected to the first semiconductor layer;
   a via contact electrode disposed in another side in the third direction with respect to the third semiconductor layer, connected to the third semiconductor layer at one end in the third direction, and connected to a first wiring at another end in the third direction;
   a first insulating layer disposed in the other side in the third direction with respect to the third semiconductor layer, the first insulating layer covering an outer peripheral surface of the via contact electrode; and
   a first region disposed in the other side in the third direction with respect to the third semiconductor layer, the first region having a thermal conductivity different from a thermal conductivity of the first insulating layer, wherein
a distance between the first region and the third semiconductor layer is smaller than a distance between the first wiring and the third semiconductor layer.

14. The semiconductor memory device according to claim 13, wherein
the first region includes a conductive member,
the conductive member includes:
   a first part extending in the first direction or the second direction; and
   a second part closer to the third semiconductor layer than the first part, wherein
the second part is disposed at a position overlapping with the third gate electrode viewed in the third direction.

15. The semiconductor memory device according to claim 13, wherein
the first region includes a cavity.

16. The semiconductor memory device according to claim 15, wherein
at least a part of the cavity is provided at a position overlapping with the third gate electrode viewed in the third direction.

17. The semiconductor memory device according to claim 13, wherein
the first region includes a member having a thermal conductivity lower than a thermal conductivity of the first insulating layer.

18. The semiconductor memory device according to claim 17, wherein
at least a part of the member having the thermal conductivity lower than the thermal conductivity of the first insulating layer is disposed at a position overlapping with the third gate electrode viewed in the third direction.

* * * * *